US012733254B2

(12) United States Patent
Oishi et al.

(10) Patent No.: US 12,733,254 B2
(45) Date of Patent: Sep. 8, 2026

(54) COMPLEMENTARY TRANSISTOR AND SEMICONDUCTOR DEVICE

(71) Applicant: SONY GROUP CORPORATION, Tokyo (JP)

(72) Inventors: Hidetoshi Oishi, Saga (JP); Koichi Matsumoto, Kanagawa (JP); Kazuyuki Tomida, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 240 days.

(21) Appl. No.: 18/540,524

(22) Filed: Dec. 14, 2023

(65) Prior Publication Data

US 2024/0113120 A1 Apr. 4, 2024

Related U.S. Application Data

(63) Continuation of application No. 17/224,617, filed on Apr. 7, 2021, now Pat. No. 11,887,984, which is a (Continued)

(30) Foreign Application Priority Data

Jul. 20, 2016 (JP) ................................ 2016-142699
Jun. 16, 2017 (JP) ................................ 2017-118682

(51) Int. Cl.
*H10B 10/00* (2023.01)
*H10D 12/00* (2025.01)
(Continued)

(52) U.S. Cl.
CPC ........... *H10D 84/853* (2025.01); *H10B 10/00* (2023.02); *H10D 12/211* (2025.01); *H10D 30/01* (2025.01);
(Continued)

(58) Field of Classification Search
CPC .... H10D 84/853; H10D 12/211; H10D 30/01; H10D 30/024; H10D 30/47;
(Continued)

(56) References Cited

U.S. PATENT DOCUMENTS 5,620,908 A 4/1997 Inoh
6,080,626 A * 6/2000 Vajana .................. H10B 41/35 438/529
(Continued)

FOREIGN PATENT DOCUMENTS

JP 2015-090984 5/2015
KR 10-2004-0106060 12/2004
(Continued)

OTHER PUBLICATIONS

Tosun et al., "High-Gain Inverters Based on WSe2 Complementary Field-Effect Transistors," ACS Nano, vol. 8, No. 5, 2014, pp. 4948-4953.
(Continued)

*Primary Examiner* — Douglas W Owens
(74) *Attorney, Agent, or Firm* — SHERIDAN ROSS P.C.

(57) ABSTRACT

A complementary transistor is constituted of a first transistor $TR_1$ and a second transistor $TR_2$, active regions 32, 42 of the respective transistors are formed by layering first A layers 33, 43 and the first B layers 35, 45 respectively, surface regions $\mathbf{20}_1$, $\mathbf{20}_2$ provided in a base correspond to first A layers 33, 43 respectively, first B layers 35, 45 each have a conductivity type different from that of the first A layers 33, 43, and extension layers 36, 46 of the first B layer are provided on insulation regions $\mathbf{21}_1$, $\mathbf{21}_2$ respectively.

20 Claims, 35 Drawing Sheets

Related U.S. Application Data continuation of application No. 16/893,280, filed on Jun. 4, 2020, now Pat. No. 11,004,851, which is a continuation of application No. 16/316,702, filed as application No. PCT/JP2017/023165 on Jun. 23, 2017, now Pat. No. 10,720,432.

(51) Int. Cl.

| | |
|---|---|
| ***H10D 30/01*** | (2025.01) |
| ***H10D 30/47*** | (2025.01) |
| ***H10D 30/62*** | (2025.01) |
| ***H10D 30/67*** | (2025.01) |
| ***H10D 30/69*** | (2025.01) |
| ***H10D 62/10*** | (2025.01) |
| ***H10D 62/80*** | (2025.01) |
| ***H10D 62/82*** | (2025.01) |
| ***H10D 62/83*** | (2025.01) |
| ***H10D 64/27*** | (2025.01) |
| ***H10D 84/01*** | (2026.01) |
| ***H10D 84/03*** | (2025.01) |
| ***H10D 84/85*** | (2025.01) |
| ***H10D 86/00*** | (2025.01) |
| ***H10D 86/01*** | (2026.01) |
| ***H10P 30/20*** | (2026.01) |

(52) U.S. Cl.

CPC ........... *H10D 30/024* (2025.01); *H10D 30/47* (2025.01); *H10D 30/6211* (2025.01); *H10D 30/6219* (2025.01); *H10D 30/6713* (2025.01); *H10D 30/6727* (2025.01); *H10D 30/6741* (2025.01); *H10D 30/675* (2025.01); *H10D 30/6757* (2025.01); *H10D 30/751* (2025.01); *H10D 62/115* (2025.01); *H10D 62/80* (2025.01); *H10D 62/82* (2025.01); *H10D 62/83* (2025.01); *H10D 62/8303* (2025.01); *H10D 62/882* (2025.01); *H10D 64/511* (2025.01); *H10D 84/0167* (2025.01); *H10D 84/0193* (2025.01); *H10D 84/038* (2025.01); *H10D 84/85* (2025.01); *H10D 86/01* (2025.01); *H10D 86/201* (2025.01); *H10P 30/204* (2026.01); *H10P 30/208* (2026.01)

(58) Field of Classification Search

CPC ........... H10D 30/6211; H10D 30/6219; H10D 30/6713; H10D 30/6727; H10D 30/6741; H10D 30/675; H10D 30/6757; H10D 30/751; H10D 62/115; H10D 62/80; H10D 62/82; H10D 62/83; H10D 62/8303; H10D 62/882; H10D 64/511; H10D 84/0167; H10D 84/0193; H10D 84/038; H10D 84/85; H10D 86/01; H10D 86/201; H10D 84/0165; H10B 10/00; H10B 10/12; H10P 30/204; H10P 30/208

See application file for complete search history.

(56) References Cited

U.S. PATENT DOCUMENTS

| | | | | |
|---|---|---|---|---|
| 8,299,560 | B2 * | 10/2012 | Loechelt | H10D 30/0287 257/341 |
| 9,728,468 | B2 * | 8/2017 | Katakami | H10D 84/038 |
| 10,720,432 | B2 | 7/2020 | Oishi et al. | |
| 11,004,851 | B2 | 5/2021 | Oishi et al. | |
| 11,688,738 | B2 * | 6/2023 | Matsumoto | H10B 10/125 257/29 |
| 2006/0208320 | A1 * | 9/2006 | Tsuchiya | H10D 84/0181 257/E21.639 |
| 2011/0175173 | A1 * | 7/2011 | Takebuchi | H10D 30/0227 257/E21.409 |
| 2011/0299337 | A1 * | 12/2011 | Parris | G01N 27/4148 257/E27.084 |
| 2014/0158989 | A1 | 6/2014 | Byun et al. | |
| 2014/0197459 | A1 | 7/2014 | Kis et al. | |
| 2014/0299944 | A1 | 10/2014 | Chung et al. | |
| 2018/0151497 | A1 * | 5/2018 | Makala | H10B 43/10 |
| 2021/0225841 | A1 | 7/2021 | Oishi et al. | |

FOREIGN PATENT DOCUMENTS

| | | |
|---|---|---|
| WO | WO 2012/093360 | 7/2012 |
| WO | WO 2015/033706 | 3/2015 |

OTHER PUBLICATIONS

Sarkar et al., "A subthermionic tunnel field-effect transistor with an atomically thin channel," Nature, vol. 526, Oct. 1, 2015, pp. 91-95.
International Search Report and Written Opinion for International (PCT) Patent Application No. PCT/JP2017/023165, dated Sep. 19, 2017, 7 pages.
Official Action (no English translation available) for Taiwan Patent Application No. 106122164, dated Jan. 6, 2021, 3 pages.
Notice of Allowance for U.S. Appl. No. 16/316,702, dated Mar. 9, 2020, 10 pages.
Notice of Allowance for U.S. Appl. No. 16/893,280, dated Jan. 14, 2021, 10 pages.
Corrected Notice of Allowance for U.S. Appl. No. 16/893,280, dated Apr. 14, 2021, 2 pages.
Notice of Allowance for U.S. Appl. No. 17/224,617, dated Sep. 14, 2023, 11 pages.

* cited by examiner $V_2 = V_{dd}$ $V_{dd}$

TR2: ON

SECOND B ELECTRODE

149

SECOND A ELECTRODE

148

$V_{CE} = 0$

140

SECOND CONTROL ELECTRODE

SECOND B EXTENSION REGION

SECOND BOUNDARY REGION

SECOND A EXTENSION REGION

145

147

143

142

V2 = Vdd
Vdd
SECOND B ELECTRODE
149
TR2: ON → OFF
SECOND A ELECTRODE
148
VCE = 0 → Vdd
140
SECOND CONTROL ELECTRODE
SECOND B EXTENSION REGION
SECOND BOUNDARY REGION
SECOND A EXTENSION REGION
145
147
143
142 p+
183
$120_2$
$21_2$
21
20
126B
128B
$21_1$

ION IMPLANTATION
p+
183
$120_2$
$21_2$
21
20
173
n+
128B
$120_1$
127B
$21_1$

RBL
WBLX
WBL
RWL
WWL
$Tr_1$ $Tr_2$ $Tr_3$ $Tr_4$ $Tr_5$ $Tr_6$ $Tr_7$ $Tr_8$
$[TR_1]$ $[TR_2]$
39, 49
48 $V_2 = V_{dd}$
38 $V_1 = 0$

COMPLEMENTARY TRANSISTOR AND SEMICONDUCTOR DEVICE

CROSS REFERENCE TO RELATED APPLICATIONS

This application is a continuation of U.S. patent application Ser. No. 17/224,617, filed Apr. 7, 2021, which is a continuation of U.S. patent application Ser. No. 16/893,280, filed Jun. 4, 2020, now U.S. Pat. No. 11,004,851, which is a continuation of U.S. patent application Ser. No. 16/316,702, filed Jan. 10, 2019, now U.S. Pat. No. 10,720,432, which is a national stage application under 35 U.S.C. 371 and claims the benefit of PCT Application No. PCT/JP2017/023165 having an international filing date of Jun. 23, 2017, which designated the United States, which PCT application claimed the benefit of Japanese Patent Application Nos. 2016-142699 filed Jul. 20, 2016 and 2017-118682 filed Jun. 16, 2017, the entire disclosures of each of which are incorporated herein by reference.

TECHNICAL FIELD

The present disclosure relates to a complementary transistor and a semiconductor device including the complementary transistor.

BACKGROUND ART

In a CMOS circuit constituting an inverter circuit, a NAND circuit, or the like including field effect transistors in related art, a p-channel type field effect transistor and an n-channel type field effect transistor are apposed. Additionally, development is made to achieve higher density of a gate and lower power consumption by scaling down such a layout. However, processing difficulty is increased, and a manufacturing cost is largely increased.

For a low power consumption device, a tunnel field effect transistor (TFET) can be exemplified as a candidate of a next generation device. Here, two-dimensional materials (2D materials) such as transition metal dichalcogenides (TMDC) are focused in development of the TFET. Additionally, such a TFET is known from Japanese Patent Application Laid-open No. 2015-090984, for example. In a semiconductor element disclosed in this patent publication includes:

a semiconductor layer that includes a two-dimensional substance element including: a first two-dimensional substance containing a first metal chalcogenide-based substance; and a second two-dimensional substance linked to a side surface of the first two-dimensional substance and containing a second metal chalcogenide-based substance, the first two-dimensional substance and the second two-dimensional substance being chemically bonded; and at least one non-semiconductor layer located on at least one surface semiconductor layer.

CITATION LIST

Patent Document

Patent Document 1: Japanese Patent Application Laid-Open No. 2015-090984

SUMMARY OF THE INVENTION

Problems to be Solved by the Invention

By the way, in a case of assuming a complementary transistor constituted of TFETs, in total four kinds of two-dimensional materials are required: two kinds of two-dimensional material as a two-dimensional material constituting a TFET corresponding a p-channel type field effect transistor; and two kinds of two-dimensional material as a two-dimensional material constituting a TFET corresponding to an n-channel type field effect transistor, and additionally, at maximum, four kinds of material constituting electrodes for the four kinds of two-dimensional materials are required. Therefore, there is a problem that: a manufacturing process of a complementary transistor constituted of the TFETs is more complicated; and a manufacturing cost is increased.

Therefore, the present disclosure is directed to providing: a complementary transistor having a configuration and a structure capable of reducing kinds of constituent materials of an active region and the like of a transistor and simplifying a manufacturing process; and a semiconductor device including the complementary transistor.

Solutions to Problems

A complementary transistor according to a first aspect of the present disclosure to achieve the above-described object is a complementary transistor including:

a first transistor including:

a first control electrode;

a first active region located below the first control electrode and formed by layering a first A layer and a first B layer;

a first insulation layer provided between the first control electrode and the first active region;

a first A extension layer extending from one end of the first active region and constituted of the first A layer; and a first B extension layer extending from the other end of the first active region and constituted of the first B layer; and a second transistor including:

a second control electrode;

a second active region located below the second control electrode and formed by layering a second A layer and a second B layer;

a second insulation layer provided between the second control electrode and the second active region;

a second A extension layer extending from one end of the second active region and constituted of the second A layer; and a second B extension layer extending from the other end of the second active region and constituted of the second B layer, in which a first surface region provided in a base and having a first conductivity type corresponds to the first A layer and the first A extension layer, the first B layer has a property as a second conductivity type different from the first conductivity type, the first B extension layer is provided on a first insulation region provided in the base, a second surface region provided in the base and having the second conductivity type corresponds to the second A layer and the second A extension layer, the second B layer has a property as the first conductivity type, and the second B extension layer is provided on a second insulation region provided in the base.

A complementary transistor according to a second aspect of the present disclosure in order to achieve the above-described object is a complementary transistor including:

a first transistor including:

a first control electrode;

a first active region located below the first control electrode;

a first insulation layer provided between the first control electrode and the first active region;

a first A extension region extending from one end of the first active region; and a first B extension region extending from the other end of the first active region; and a second transistor including:

a second control electrode;

a second active region located below the second control electrode;

a second insulation layer provided between the second control electrode and the second active region;

a second A extension region extending from one end of the second active region; and a second B extension region extending from the other end of the second active region, in which a first surface region provided in a base and having the first conductivity type corresponds to the first A extension region, the first B extension region has a property as the second conductivity type different from the first conductivity type and is provided on a first insulation region provided in the base, the first active region is provided on a first insulation region, a second surface region provided in the base and having the second conductivity type corresponds to the second A extension region, the second B extension region has a property as the first conductivity type and is provided on a second insulation region provided in the base, and the second active region is provided on the second insulation region.

A semiconductor device according to a first aspect of the present disclosure to achieve the above object includes: a complementary transistor according to the first aspect of the present disclosure in which a base is constituted of a silicon semiconductor substrate; and a field effect transistor formed in the silicon semiconductor substrate. Furthermore, a semiconductor device according to a second aspect of the present disclosure to achieve the above object includes: a complementary transistor according to the second aspect of the present disclosure in which a base is constituted of a silicon semiconductor substrate; and a field effect transistor formed in the silicon semiconductor substrate.

Effects of the Invention

In the complementary transistor according to the first aspect of the present disclosure or the complementary transistor according to the first aspect of the present disclosure constituting the semiconductor device according to the first aspect of the present disclosure, the first A layer, first A extension layer, second A layer, and second A extension layer are formed in the surface region of the base, and therefore, the number of kinds of materials constituting the active regions and the like of the complementary transistor is three at maximum, and the number of kinds of constituent materials of the active regions and the like of the complementary transistor can be reduced, and furthermore, a manufacturing process can be simplified. Additionally, in the complementary transistor according to the second aspect of the present disclosure or the complementary transistor according to the second aspect of the present disclosure constituting the semiconductor device according to the second aspect of the present disclosure, the first A extension region and second A extension region are formed in the surface region of the base, and therefore, the number of kinds of materials constituting the active regions and the like of the complementary transistor is three at maximum, and the number of kinds of constituent materials of the active regions and the like of the complementary transistor can be reduced. Note that the effects recited in the present specification are only examples and not limited thereto, and furthermore, an additional effect may also be provided.

MODE FOR CARRYING OUT THE INVENTION

Figure 1:
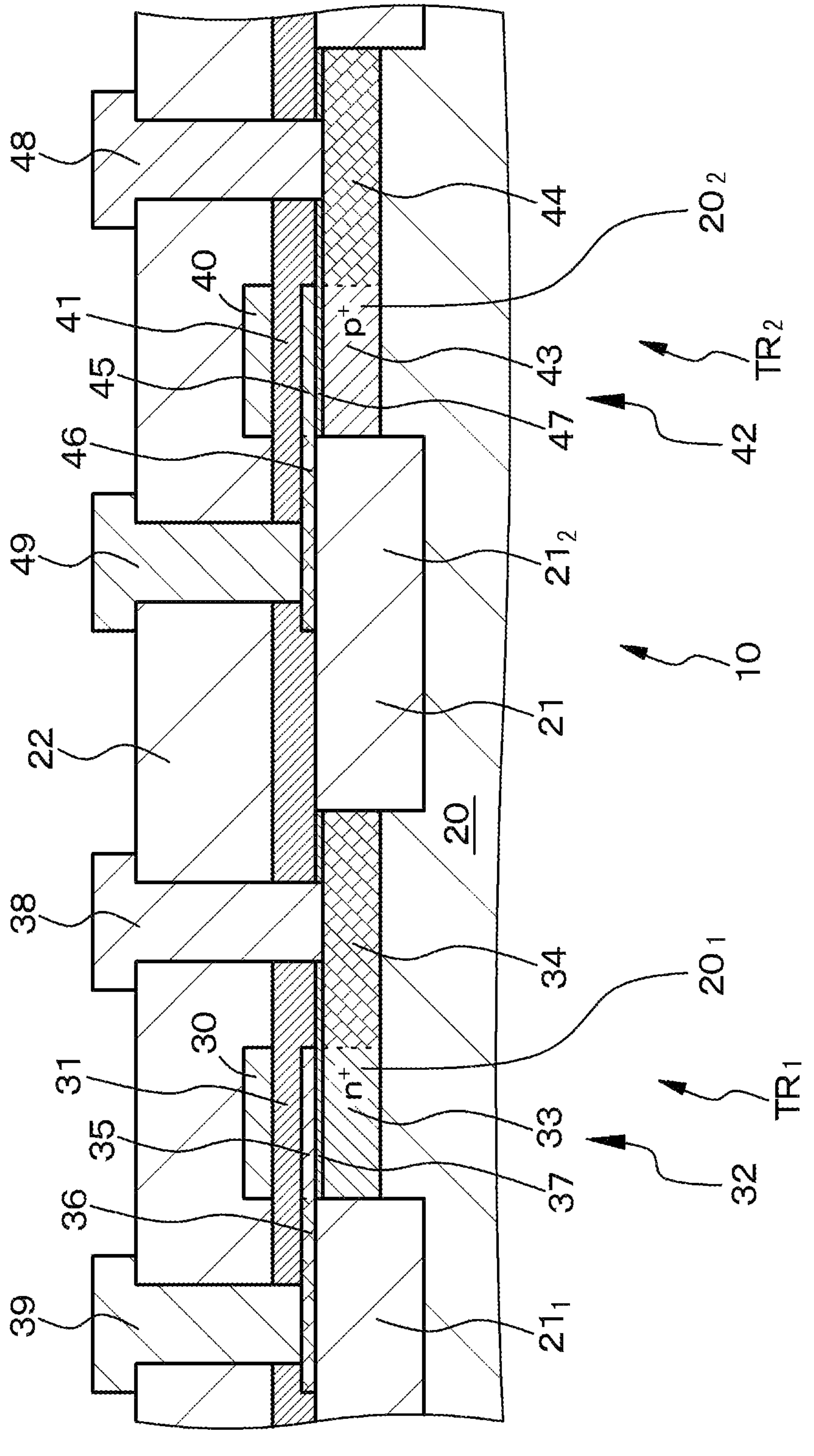
FIG. 1 is a schematic partial cross-sectional view of a complementary transistor according to Example 1.

In the following, the present disclosure will be described on the basis of Examples with reference to the drawings, but note that the present disclosure is not limited to such Examples, and various kinds of values and materials in Examples are examples. Note that a description will be provided in the following order.

1. General Description of Complementary Transistors and Semiconductor Devices according to First and Second Aspects of Present Disclosure
2. Example 1 (Complementary Transistor according to First Aspect of Present Disclosure and Semiconductor Device according to First Aspect of Present Disclosure)
3. Example 2 (Modification of Example 1)
4. Example 3 (Another Modification of Example 1)
5. Example 4 (Complementary Transistor according to Second Aspect of Present Disclosure and Semiconductor Device according to Second Aspect of Present Disclosure)
6. Example 5 (Modification of Example 4)
7. Example 6 (Another Modification of Example 4)
8. Example 7 (Various Exemplary Application of Complementary Transistors According to First and Second Aspects of Present Disclosure)
9. Others <General Description of Complementary Transistors and Semiconductor Devices according to First and Second Aspects of Present Disclosure>

A complementary transistor according to a first aspect of the present disclosure, a complementary transistor according to a second aspect of the present disclosure, the complementary transistor according to the first aspect of the present disclosure constituting a semiconductor device according to a first aspect of the present disclosure or the complementary transistor according to the second aspect of the present disclosure constituting a semiconductor device according to a second aspect of the present disclosure (hereinafter these complementary transistors may be collectively referred to as "complementary transistors and the like of the present disclosure"), it is possible to have a mode in which a first B layer (or first B extension region) is constituted of a two-dimensional material or graphene, and a second B layer (or second B extension region) is constituted of a two-dimensional material or graphene. Additionally, in this case, it is possible to have a mode in which the two-dimensional material includes one kind of two-dimensional material selected from a group consisting of $MoS_2$, $MoSe_2$, $MoTe_2$, $WS_2$, $WSe_2$, $WTe_2$, $ZrS_2$, $ZrSe_2$, $ZrTe_2$, $HfS_2$, $HfSe_2$, and $HfTe_2$. Here, the two-dimensional material has a thickness of, for example, 0.65 nm to 6.5 nm, preferably, 0.65 nm to 2.6 nm, but the thickness is not limited to these values.

In the complementary transistors and the like of the present disclosure including the above-described various preferable modes, it is possible to have a formation in which a base is constituted of a semiconductor substrate, and a first insulation region and a second insulation region are each constituted of an element isolation region provided in the semiconductor substrate. Alternatively, it is possible to have a formation in which the base is constituted of a two-dimensional material layer. In the case where the base is constituted of the two-dimensional material layer, the base may be provided on a support material (for example, a substrate such as a silicon semiconductor substrate having a surface formed with an insulation film).

Alternatively, in the complementary transistors and the like of the present disclosure including the above-described various preferable modes, it is possible to have a formation in which the base is constituted of silicon (Si) or germanium (Ge), and the first B layer (or first B extension region) is constituted of $MoS_2$, $WTe_2$, or graphene, and the second B layer (or second B extension region) is constituted of $HfTe_2$. Alternatively, it is possible to have a formation in which the base is constituted of $MoS_2$, the first B layer (or first B extension region) is constituted of $WTe_2$, and the second B layer (or second B extension region) is of $ZrS_2$, $HfS_2$, and $HfSe_2$.

Alternatively, in the complementary transistor according to the first aspect of the present disclosure, the complementary transistor according to the second aspect of the present disclosure, the complementary transistor according to the first aspect of the present disclosure constituting the semiconductor device according to the first aspect of the present disclosure, or the complementary transistor according to the second aspect of the present disclosure constituting the semiconductor according to the second aspect of the present disclosure (complementary transistors and the like of the present disclosure), it is possible to have a mode in which a portion (first A extension region) of the base constituting a first surface region and a portion (second A extension region) of the base constituting a second surface region are constituted of different materials, and the first B layer and first B extension layer (or first B extension region), and the second B layer and second B extension layer (or second B extension region) are constituted of the same material.

Additionally, in this case, it is possible to have a mode in which, a difference between a value $[E_C(N)]$ of a valence band in the portion of the base constituting the first surface region (material constituting the first A extension region) and a value $[E_V(2D)]$ of a conduction band of a material constituting the first B layer and the first B extension layer (material constituting the first B extension region) is 1 eV or less, and a difference between a value $[E_V(P)]$ of a conduction band in the portion of the base constituting the second surface region (material constituting the second A extension region) and a value $[E_C(2D)]$ of a valence band of a material constituting the second B layer and the second B extension layer (material constituting the second B extension region) is 1 eV or less In other words, preferably, the following relations are satisfied:

$$Ev(P) - Ec(2D) \leq 1(\text{eV}); \text{ and}$$

$$Ev(2D) - Ec(N) \leq 1(\text{eV}),$$

but not limited thereto.

Furthermore, in these cases, it is possible to have a mode in which the portion (first A extension region) of the base constituting the first surface region is constituted of a silicon semiconductor substrate, the portion (second A extension region) of the base constituting the second surface region is constituted of a semiconductor layer formed in the silicon semiconductor substrate, and the first B layer and first B extension layer, and the second B layer and second B extension layer, or the first B extension region and second B extension region are constituted of the same two-dimensional material, and in this case, specifically, it is possible to have a mode in which the semiconductor layer is constituted of a germanium layer, and the first B layer and first B extension layer, and the second B layer and second B extension layer (or first B extension region and second B extension region) are constituted of $MoTe_2$, for example.

Alternatively, in these cases, it is possible to have a mode in which the portion (first A extension region) of the base constituting the first surface region is constituted of a semiconductor layer formed in the silicon semiconductor substrate, the portion (second A extension region) of the base constituting the second surface region is constituted of the silicon semiconductor substrate, and the first B layer and first B extension layer, and the second B layer and second B extension layer, or the first B extension region and second B extension region are constituted of the same two-dimensional material, and in this case, specifically, it is possible to have a mode in which the semiconductor layer is constituted of an indium arsenide layer, and the first B layer and first B extension layer, and the second B layer and second B extension layer (or first B extension region and second B extension region) are constituted of $MoS_2$, for example.

Alternatively, in these cases, it is possible to have a mode in which:

the portion (first A extension region) of the base constituting the first surface region is constituted of a first semiconductor layer formed in the semiconductor substrate, the portion (second A extension region) of the base constituting the second surface region is constituted of a second semiconductor layer formed in the semiconductor substrate, the first B layer and first B extension layer, and the second B layer and second B extension layer, or the first B extension region and second B extension region are constituted of the same two-dimensional material, and in this case, specifically, the first semiconductor layer is constituted of, for example, an indium arsenide layer, the second semiconductor layer is constituted of a germanium layer, and the first B layer and first B extension layer, and the second B layer and second B extension layer (or first B extension region and second B extension region) are constituted of $MoS_2$;

the portion (first A extension region) of the base constituting the first surface region is constituted of a silicon semiconductor substrate, the portion (second A extension region) of the base constituting the second surface region is constituted of a germanium layer formed in the silicon semiconductor substrate, the first B layer and first B extension layer, and the second B layer and second B extension layer, or the first B extension region and second B extension region are constituted of $MoTe_2$; or the portion (first A extension region) of the base constituting the first surface region is constituted of an indium arsenide layer formed in a silicon semiconductor substrate, the portion (second A extension region) of the base constituting the second surface region is constituted of the silicon semiconductor substrate, and the first B layer and first B extension layer, and the second B layer and second B extension layer, or the first B extension region and second B extension region are constituted of $MoS_2$.

Note that additionally SiGe and SiC can be exemplified as the materials constituting the semiconductor layer formed in the silicon semiconductor substrate, and also in a broad meaning, a group III-V compound semiconductor and a group II-VI compound semiconductor can be exemplified. As a forming method for the semiconductor layer on the silicon semiconductor substrate, it is possible to exemplify an epitaxial growth method and a concentration method (forming method for a semiconductor layer on a silicon semiconductor substrate by forming a semiconductor material layer in order to form a semiconductor layer on a region where the semiconductor layer of the silicon semiconductor substrate is to be formed, and applying heating treatment (anneal treatment) thereto. For example, a buffer layer constituted of InP, InAlAs, InGaAs, GaAs, and GaSb may be provided between the semiconductor layer formed in the silicon semiconductor substrate and the silicon semiconductor substrate in order to secure consistency between a crystal lattice constant of the silicon substrate and a crystal lattice constant of the semiconductor layer. However, the materials constituting the buffer layer are not. limited thereto. Additionally, a germanium semiconductor substrate can be used instead of the silicon semiconductor substrate, and also a substrate obtained by forming a semiconductor layer (including not only a silicon layer but also a germanium layer or a group III-V compound semiconductor layer) on an oxide film such as a silicon on insulator (SOI) substrate.

Here, examples of the group III-V compound semiconductor include a GaN-based compound semiconductor (containing AlGaN mixed crystal or InAlGaN mixed crystal and InGaN mixed crystal), an InN-based compound semiconductor, an AlN-based compound semiconductor, an InAlGaP-based compound semiconductor, an InAlGaAs-based compound semiconductor, an InGaAs-based compound semiconductor, an InGaAsP-based compound semiconductor, a GaP-based compound semiconductor, and an InP-based compound semiconductor, and specifically, it is possible to exemplify AlAs, AlAsP, AlAsSb, AlGaAs, AlGaAsP, AlGaAsSb, InAlGaAs, InAlGaP, AlGaN, AlGaP, InAlAs, InAlAsP, InAlGaAs, InAlP, InAlSb, AlN, InAlP, AlSb, GaAs, GaAsP, GaAsSb, InGaAs, InGaAsP, InGaN, InGaP, GaN, GaP, GaSb, InAs, InN, and InP. Furthermore, examples of the group II-VI compound semiconductor can include ZnSe, ZnS, ZnSSe, ZnTe, ZnMgSSe, (Zn, Mg)—(S, Se), (Zn, Cd)—(S, Se, Te), (Zn, Mg, Cd)Se.

Alternatively, in the complementary transistor according to the first aspect of the present disclosure, the complementary transistor according to the second aspect of the present disclosure, the complementary transistor according to the first aspect of the present disclosure constituting the semiconductor device according to the first aspect of the present disclosure, or the complementary transistor according to the second aspect of the present disclosure constituting the semiconductor according to the second aspect of the present disclosure (complementary transistors and the like of the present disclosure), it is possible to have a mode in which the portion (first A extension region) of the base constituting the first surface region and the portion (second A extension region) of the base constituting the second surface region are constituted of different materials, and the first B layer and first B extension layer, and the second B layer and second B extension layer or the first extension region and second extension region are constituted of different materials, and in this case:

it is possible to have a mode in which the portion (first A extension region) of the base constituting the first surface region is constituted of a silicon semiconductor substrate, the portion (second A extension region) of the base constituting the second surface region is constituted of a germanium layer formed in the silicon semiconductor substrate, the first B layer and first B extension layer (or first B extension region) are (or is) constituted of $MoTe_2$, and the second B layer and second B extension layer (or second B extension region) are (or is) constituted of $MoS_2$;

it is possible to have a mode in which the portion (first A extension region) of the base constituting the first surface region is constituted of an indium arsenide layer formed in a silicon semiconductor substrate, the portion (second A extension region) of the base constituting the second surface region is constituted of the silicon semiconductor substrate, the first B layer and first B extension layer (or first B extension region) are constituted of $MoTe_2$, and the second B layer and second B extension layer (or second B extension region) are (or is) constituted of $MoS_2$; or it is possible to have a mode in which the portion (first A extension region) of the base constituting the first surface region is constituted of an indium arsenide layer formed in a silicon semiconductor substrate, the portion (second A extension region) of the base constituting the second surface region is constituted of a germanium layer formed in the silicon semiconductor substrate, the first B layer and first B extension layer (or first B extension region) are (or is) constituted of $MoTe_2$, and the second B layer and second B extension layer (or second B extension region) are (or is) constituted of $MoS_2$.

Alternatively, in the above-described various preferable modes of the complementary transistors and the like of the present disclosure, it is possible to have a formation in which an absolute value of a difference between an energy value $E_{C\text{-}sub}$ at a lower end of the conduction band of the base and an energy value $E_{C\text{-}1B}$ at a lower end of the conduction band of the first B layer (or first B extension region) is equal to or less than an energy difference at which driving can be performed at drive voltage of a first transistor, an absolute value of a difference between an energy value $E_{V\text{-}sub}$ at an upper end of the valence band of the base and an energy value $E_{V\text{-}1B}$ at an upper end of the valence band of the first B layer (or first B extension region) is equal to or less than the energy difference at which driving can be performed at the drive voltage of the first transistor, an absolute value of a difference between an energy value $E_{C\text{-}sub}$ at the lower end of the conduction band of the base and an energy value $E_{C\text{-}2}B$ at a lower end of a conduction band of the second B layer (or second B extension region) is equal to or less than an energy difference at which driving can be performed at drive voltage of a second transistor, and an absolute value of a difference between an energy value $E_{V\text{-}sub}$ at the upper end of the valence band of the base and an energy value $E_{V\text{-}2B}$ at an upper end of a valence band of the second B layer (or second B extension region) is equal to or less than the energy difference at which driving can be performed at the drive voltage of the second transistor. Here, the "drive voltage of the first transistor" represents a potential difference between the first control electrode and the first A layer (first A extension region), and the "drive voltage of the second transistor" represents a potential difference between the second control electrode and the second A layer (second A extension region).

| | $E_V$(eV) | $E_C$(eV) |
|---|---|---|
| Materials constituting base | | |
| Silicon | 5.17 | 4.05 |
| Germanium | 4.66 | 4.00 |
| $MoS_2$ | 5.86 | 4.27 |
| Two-dimensional materials | | |
| $MoS_2$ | 5.86 | 4.27 |
| $MoSe_2$ | 5.23 | 3.90 |
| $MoTe_2$ | 4.76 | 3.83 |
| $WS_2$ | 5.50 | 3.96 |
| $WSe_2$ | 4.87 | 3.54 |
| $WTe_2$ | 4.44 | 3.69 |
| $ZrS_2$ | 6.79 | 5.71 |
| $ZrSe_2$ | 6.15 | 5.86 |
| $ZrTe_2$ | 5.69 | 4.97 |
| $HfS_2$ | 6.83 | 5.59 |

-continued

| | $E_V$(eV) | $E_C$(eV) |
|---|---|---|
| $HfSe_2$ | 6.17 | 5.72 |
| $HfTe_2$ | 5.53 | 4.91 |
| Materials constituting semiconductor layer | | |
| Germanium | 4.66 | 4.00 |
| InAs | 5.35 | 4.99 |

Figure 35A:
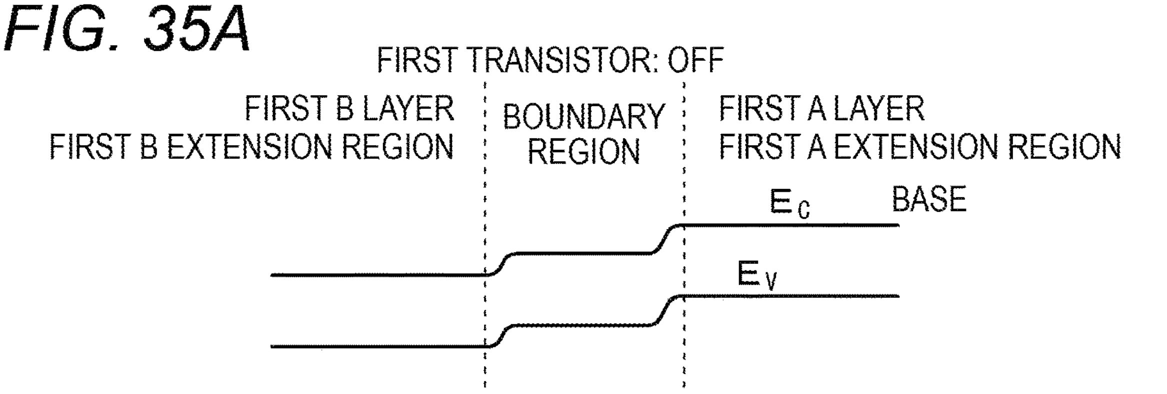
FIGS. 35A, 35B, 35C, and 35D are diagrams schematically illustrating changes in an energy band in each of the active regions when the complementary transistor of the present disclosure becomes a conductive state/non-conductive state.
Figure 35B:
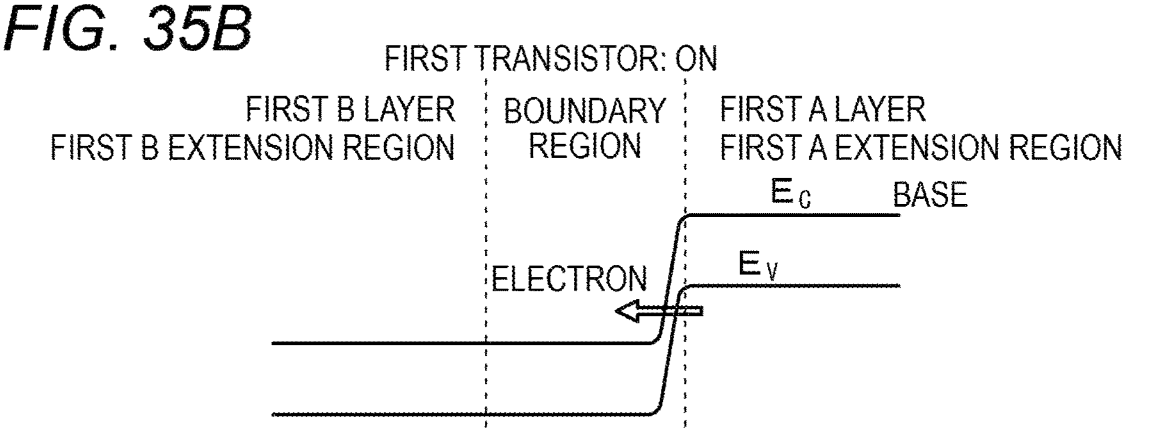
Figure 35C:
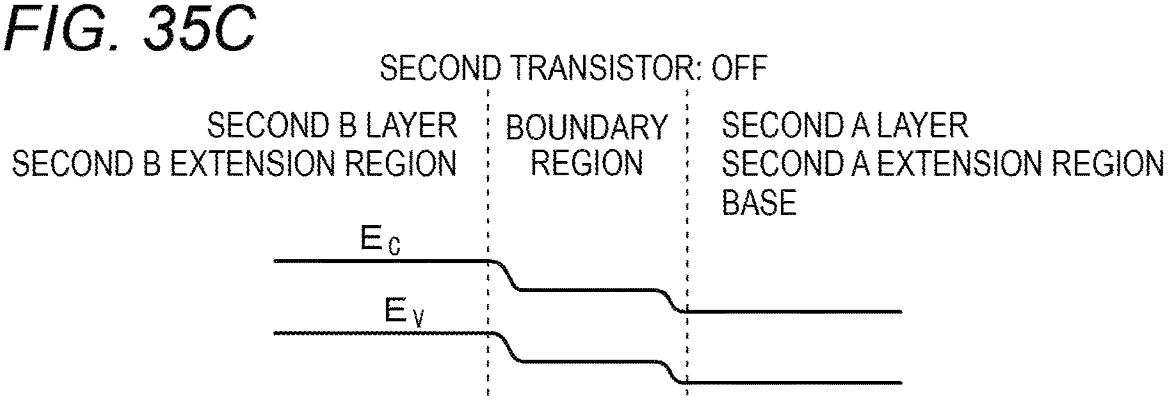
Figure 35D:
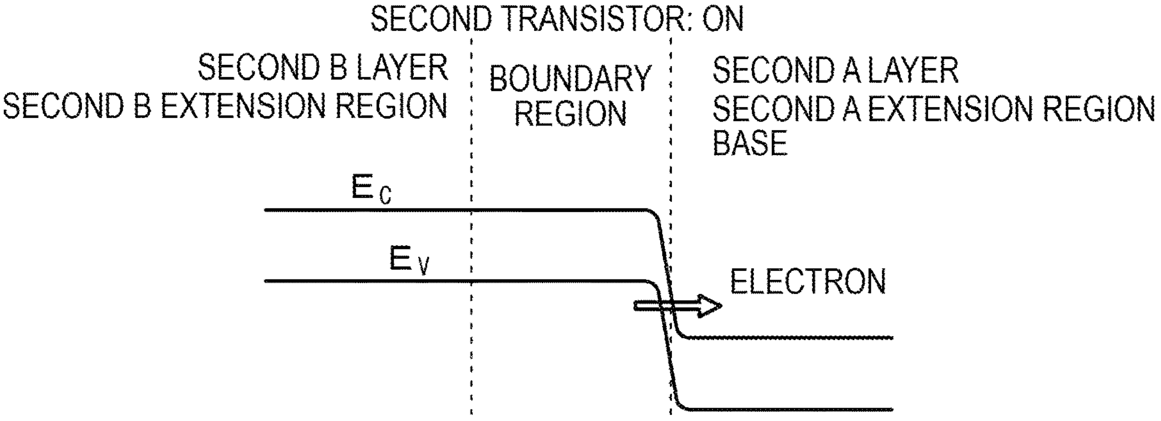

Additionally, it is preferable that:

when the first transistor is off, $E_{C\text{-}1A}>E_{C\text{-}1B}>E_{V\text{-}1A}>E_{V\text{-}1B}$ is satisfied as illustrated in FIG. 35A;

when the second transistor is off, $E_{C\text{-}2B}>E_{C\text{-}2A}>E_{V\text{-}2B}>E_{V\text{-}2A}$ is satisfied as illustrated in FIG. 35C, when the first transistor is on, $E_{C\text{-}1A}>E_{V\text{-}1B}>E_{C\text{-}1B}>E_{V\text{-}1B}$ is satisfied as illustrated in FIG. 35B, and when the second transistor is on, $E_{C\text{-}2B}>E_{V\text{-}2B}>E_{C\text{-}2A}>E_{V\text{-}2A}$ is satisfied as illustrated in FIG. 35D.

Furthermore, in the complementary transistor according to the first aspect of the present disclosure including the above-described preferable modes and formations, and the complementary transistor constituting the semiconductor device according to the first aspect of the present disclosure, it is possible to have a formation in which a first interlayer insulation film (first boundary region) is formed between the first A layer and the first B layer, and a second interlayer insulation film (second boundary region) is formed between the second A layer and the second B layer from the viewpoint of operation stability. However, it is not essential to provide the first interlayer insulation film and the second interlayer insulation film. The first interlayer insulation film and the second interlayer insulation film are not necessary to be provided in some cases when a state of an energy band in the first active region can be changed and a state of an energy band in the second active region can be changed on the basis of a voltage application state to the first control electrode and the second control electrode described later. In some cases, these interlayer insulation films are each constituted of a natural oxide film. Also, it may be possible to have a mode in which layering via a weak Van der Waals force is adopted. Specifically, $SiO_2$ (including a natural oxide film), SiN, a hexagonal boron nitride (hBN), and $Al_2O_3$ can be exemplified as materials constituting the first interlayer insulation film and second interlayer insulation film, and a low temperature oxidation method, a plasma CVD method, and an ALD method can exemplified as a forming method for the first interlayer insulation film and second interlayer insulation film. The first interlayer insulation film and the second interlayer insulation film each can have a thickness of 1 nm to 3 nm, for example.

Additionally, in the complementary transistor according to the second aspect of the present disclosure including the above-described preferable modes and formations, and in the complementary transistor constituting the semiconductor device according to the second aspect of the present disclosure, it is possible to have a formation in which the first boundary region (corresponding to the first active region) is formed between the first A extension region and the first B extension region and the second boundary region (corresponding to the second active region) is formed between the second A extension region and the second B extension region. However, it is not essential to provide the first boundary region and the second boundary region, and it is possible to have a mode in which an end surface of the first A extension region and an end surface of the first B extension region contact each other and the first active region is constituted of this contact region, and also it is possible to have a mode in which an end surface of the second B extension region and an end surface of the second B extension region contact each other and the second active region is constituted of this contact region.

In the complementary transistors and the like of the present disclosure, it is possible to have a mode in which a first A electrode is connected to the first A extension layer (or first A extension region), a first B electrode is connected to the first B extension layer (or first B extension region), a second A electrode is connected to the second A extension layer (or second A extension region), and a second B electrode is connected to the second B extension layer (or second B extension region). Additionally, it is possible to have a mode in which the second A electrode is applied voltage higher than voltage applied to the first A electrode, when second voltage $V_2$ is applied to each of the first control electrode and the second control electrode, the first transistor becomes a conductive state and the second transistor becomes a non-conductive state, and when first voltage $V_1$ ($<V_2$) lower than the second voltage $V_2$ is applied to each of the first control electrode and the second control electrode, the first transistor becomes the non-conductive state and the second transistor becomes the conductive state. Specifically, it is possible to have a mode in which the second voltage $V_2$ (e.g., $V_{dd}$ volts>0) is applied to the second A electrode, and the first voltage $V_1$ (e.g., 0 volts) is applied to the first A electrode, for example.

In the complementary transistors and the like of the present disclosure, the first transistor corresponds to an n-channel FET and the second transistor corresponds to a p-channel FET. Additionally, the first A extension layer, first A extension region, second A extension layer, and second A extension region each correspond to a drain portion of the FET, the first B extension layer, first B extension region, second B extension Layer, and second B extension region each correspond to a source portion of the FET, and the first control electrode and second control electrode each correspond to a gate portion in the FET.

In the complementary transistor according to the first aspect of the present disclosure, the first active region and the first control electrode overlap with each other, but an orthogonal projection image of the first active region may be included in an orthogonal projection image of the first control electrode, may coincide with the orthogonal projection image of the first control electrode, or may protrude from the orthogonal projection image of the first control electrode. Similarly, the second active region and the second control electrode overlap with each other in an overlap region, but an orthogonal projection image of the second active region may be included in an orthogonal projection image of the second control electrode, may coincide with the orthogonal projection image of the second control electrode, or may protrude from the orthogonal projection image of the second control electrode. Note that it is desirable that the orthogonal projection images of the first active region and second active region be respectively included in the orthogonal projection images of the first control electrode and second control electrode from the viewpoint that an electric field generated by each of the first control electrode and the second control electrode is more uniformly applied.

In the complementary transistor according to the second aspect of the present disclosure, the first active region (first boundary region) and the first control electrode overlap with each other, but an orthogonal projection image of the first active region (first boundary region) may be included in an orthogonal projection image of the first control electrode, may coincide with the orthogonal projection image of the first control electrode, or may protrude from the orthogonal projection image of the first control electrode. Similarly, the second active region (second boundary region) and the second control electrode overlap with each other in an overlap region, but an orthogonal projection image of the second active region (second boundary region) may be included in an orthogonal projection image of the second control electrode, may coincide with the orthogonal projection image of the second control electrode, or may protrude from the orthogonal projection image of the second control electrode. Note that it is desirable that the orthogonal projection images of the first active region and second active region be respectively included in the orthogonal projection images of the first control electrode and second control electrode from the viewpoint that an electric field generated by each of the first control electrode and the second control electrode is more uniformly applied.

The two-dimensional materials can be exemplified as the materials constituting the first B layer (or first B extension region) and second B layer (or second B extension region) of the complementary transistors and the like of the present disclosure or as the materials constituting the two-dimensional material layer as described above, but in a broad meaning, a transition metal dichalcogenide (TMDC) based material can also be exemplified. The TMDC is indicated as $MX_2$, for example, and Ti, Zr, Hf, V, Nb, Ta, Mo, W, Tc, and Re can be exemplified as the transition metal "M", and O, S, Se, and Te can be exemplified as the chalcogen element "X". Alternatively, CuS that is a compound containing Cu that is a transition metal and S that is a chalcogen element can also be exemplified, or a compound (such as GaS, GaSe, GaTe, $In_2Se_3$, $InSnS_2$, $SnSe_2$, GeSe, $SnS_2$, or PbO) containing a non-transition metal such as Ga, In, Ge, Sn, or Pb and a chalcogen element can also be exemplified. Alternatively, black phosphorus can also be exemplified.

The materials constituting the first B layer (first B extension region) and the second B layer (or second B extension region) may be the same, and a doping material for the first B layer (first B extension region) and the second B layer (or second B extension region) may be different. Examples of doping can include an ion implantation method and a chemical doping method. Examples of doping materials to form the first B layer (or first extension region) can include nicotinamide mononucleotide-H (NMNH), nicotinamide adenine dinucleotide-H (NADH), nicotinamide adenine dinucleotide phosphate-H (NADPH), polyethylenimine (PEI), and alkali metals such as potassium and lithium. Additionally, examples of doping materials to form the second B layer (or second B extension region) can include ionic liquid such as $NO_2BF_4$, $NOBF_4$, $NO_2SbF_6$; acid compounds such as HCl, $H_2PO_4$, $CH_3COOH$, $H_2SO_4$, and $HNO_3$; organic compounds such as dichlorodicyanoquinone, oxone, dimyristoylphosphatidylinositol, trifluoromethanesulfonimide; $HPtCl_4$, AuCb; $HAuCl_4$; silver trifluoromethanesulfonate; $AgNO_3$; $H_2PdCl_6$; $Pd(OAc)_2$; $Cu(CN)_2$; and the like.

As a forming method for the first B layer (or first B extension region), second B layer (or second B extension region), and two-dimensional material layer, not only the chemical vapor deposition method (CVD) and physical vapor deposition method (PVD method) but also the following methods can be exemplified. Specifically,

[a] a method in which a precursor of a transition metal chalcogenide material is formed like a thin film on an insulation region and then heat treatment is applied thereto, and

[b] a method in which a thin film constituted of a transition metal oxide is formed on an insulation region, and then, a transition metal inside the transition metal oxide is reacted with chalcogen inside a material containing a chalcogen element.

Graphene represents a sheet-like substance of $sp^2$ bonded carbon atoms having a thickness of one atom, and has a hexagonal lattice structure like a honeycomb manufactured from carbon atoms and the bonded ones thereof. In order to dope a graphene film with n-type or p-type impurities, chemical doping may be performed, for example. Specifically, a dopant layer may be formed on the graphene film in order to perform the chemical doping. A dopant layer may be an electron accepting (p-type) dopant layer or may be an electron donating (n-type) dopant layer. Exemplary materials constituting the electron accepting (p-type) dopant layer can include: a chloride such as AuCb, $HAuCl_4$, or $PtCl_4$; an acid such as $HNO_3$, $H_2So_4$, HCl, or nitromethane; a III group element such as boron or aluminum; and an electron-attracting molecule of oxygen or the like, and exemplary materials constituting the electron donating type (n-type) dopant layer can include not only a V group element such as nitrogen or phosphorus but also electron donating molecules of a pyridine compound, a nitride, an alkali metal, an aromatic compound containing an alkyl group, and the like.

The graphene can be formed by, for example, a manufacturing method described below. In other words, a film containing a graphene-forming catalyst is deposited on a base material. Then, a gas phase carbon supply source is supplied to the film containing the graphene-forming catalyst, and heat treatment is applied to the gas phase carbon source at the same time to form the graphene. After that, film-like graphene can be formed on the film containing the graphene-forming catalyst by cooling the graphene at a predetermined cooling rate. Examples of the graphene-forming catalyst can include not only a carbon compound such as SiC but also at least one kind of metal selected from among Ni, Co, Fe, Pt, Au, Al, Cr, Cu, Mg, Mn, Mo, Rh, Si, Ta, Ti, W, U, V, and Zr. Additionally, examples of the gas phase carbon supply source can include at least one kind selected from among a carbon monoxide, methane, ethane, ethylene, ethanol, acetylene, propane, butane, butadiene, pentane, pentene, cyclopentadiene, hexane, cyclohexane, benzene, and toluene. Then, the graphene can be obtained by separating the film-like graphene formed by the above-described manner from the film containing the graphene-forming catalyst.

Exemplary materials constituting the first control electrode and the second control electrode can include polysilicon, polycide, a metal silicide, metal nitride (e.g., TiN), metals such as aluminum (Al) and gold (Au), graphene, ITO, and the like, and exemplary forming method for the first control electrode and the second control electrode can include various physical vapor deposition methods (PVD methods) including a vacuum deposition method and a sputtering method, and various chemical vapor deposition methods (CVD method). Additionally, exemplary materials constituting the first A electrode, first B electrode, second A electrode, and second B electrode can include: polysilicon doped with impurities; aluminum; high melting metals such as tungsten, Ti, Pt, Pd, Cu, TiW, TiNW, $WSi_2$, and $MoSi_2$; and a conductive material constituted of a metal silicide. Exemplary forming methods for these electrodes can include various PVD methods and CVD methods.

Exemplary materials constituting the first insulation layer and the second insulation layer can include not only an SiOx based material such as a silicon oxide ($SiO_2$), an SiOF based material or a SiN based materials and a SiON based material but also a so-called high dielectric constant material having a specific dielectric constant k ($=\varepsilon/\varepsilon_0$) of 4.0 or more. Examples of the high dielectric constant material can include: metal oxide materials such as a hafnium oxide ($HfO_2$), a zirconium oxide ($ZrO_2$), an aluminum oxide ($Al_2O_3$), an aluminum hafnium oxide ($HfAlO_2$), a silicon hafnium oxide (HfSiO), a tantalum oxide ($Ta_2O_5$), an yttrium oxide ($Y_2O_3$), and a lanthanum oxide ($La_2O$); and metal nitride materials. Alternatively, an insulation material constituted of metal silicates such as HfSiO, HfSiON, ZrSiO, AlSiO, and LaSiO can also be exemplified. The first insulation layer and the second insulation layer may be constituted of one kind of material or may be constituted of plural kinds of materials. Additionally, the first insulation layer and the second insulation layer may have a single layer formation or may be multi-layer formation. Preferably, the first insulation layer and the second insulation layer have the same formation from the viewpoint of simplifying the process. Exemplary forming methods for the first insulation layer and the second insulation layer can include: various CVD methods including an atomic layer deposition (ALD) method, a metal organic chemical vapor deposition (MOCVD method); and various PVD methods including the vacuum deposition method and the sputtering method. Preferably, the forming methods for the first insulation layer and the second insulation layer are the same method and are formed at the same time from the viewpoint of simplifying the process. Each of the first insulation layer and the second insulation layer can have a thickness of 1 nm to 10 nm, for example.

The field effect transistor constituting the semiconductor device according to the first and second aspects of the present disclosure can be similar to a field effect transistor in related art.

A logic circuit such as an inverter circuit, a NAND circuit, an AND circuit, a NOR circuit, an OR circuit, an XOR circuit, or a NOT circuit can be constituted of the complementary transistor of the present disclosure, or an SRAM circuit can also be formed thereof.

Example 1

Figure 2A:
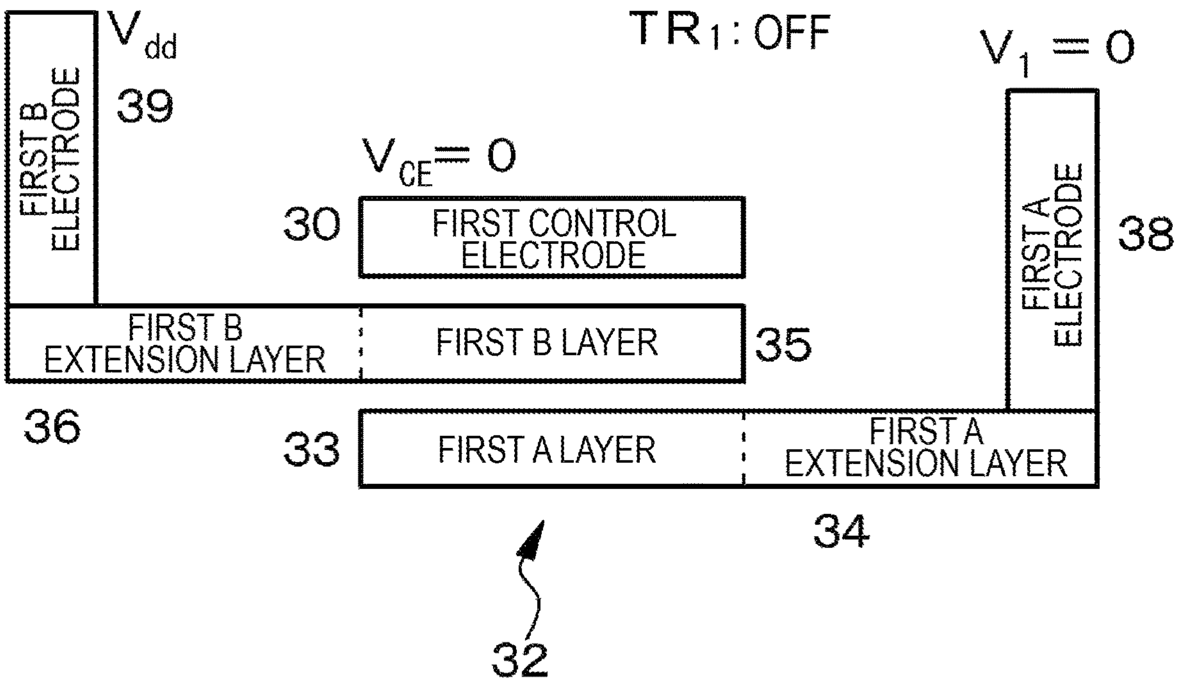
FIGS. 2A and 2B are diagrams schematically illustrating operation states of the complementary transistor of Example 1.
Figure 2B:
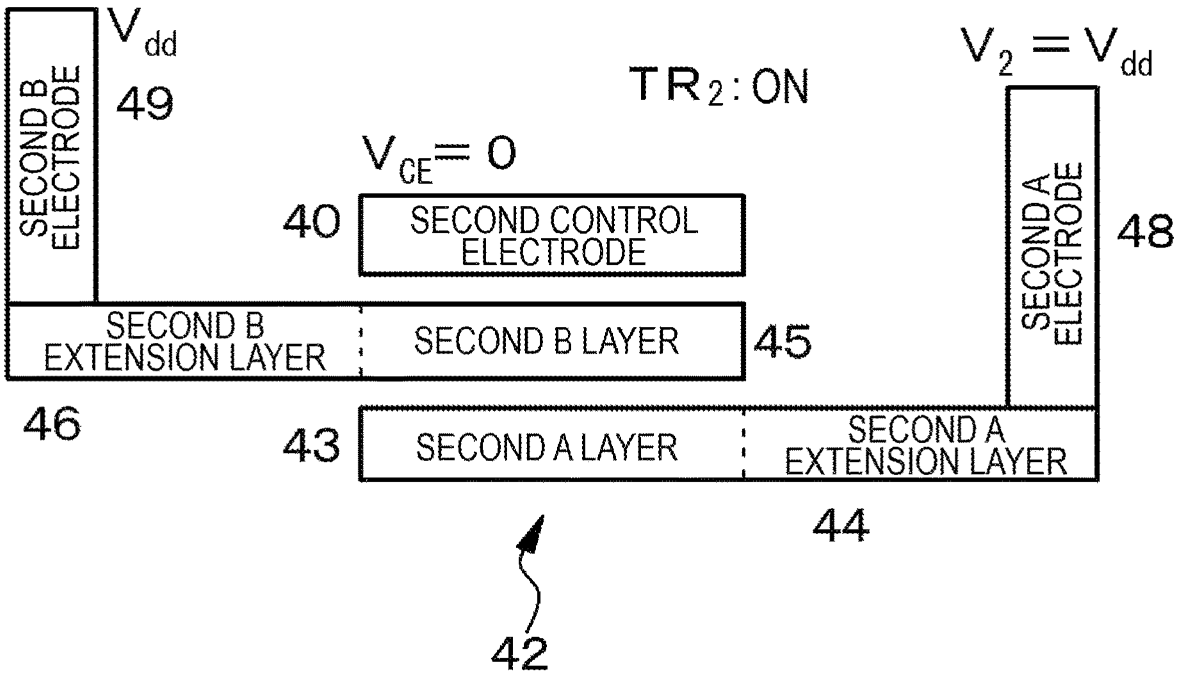
Figure 3A:
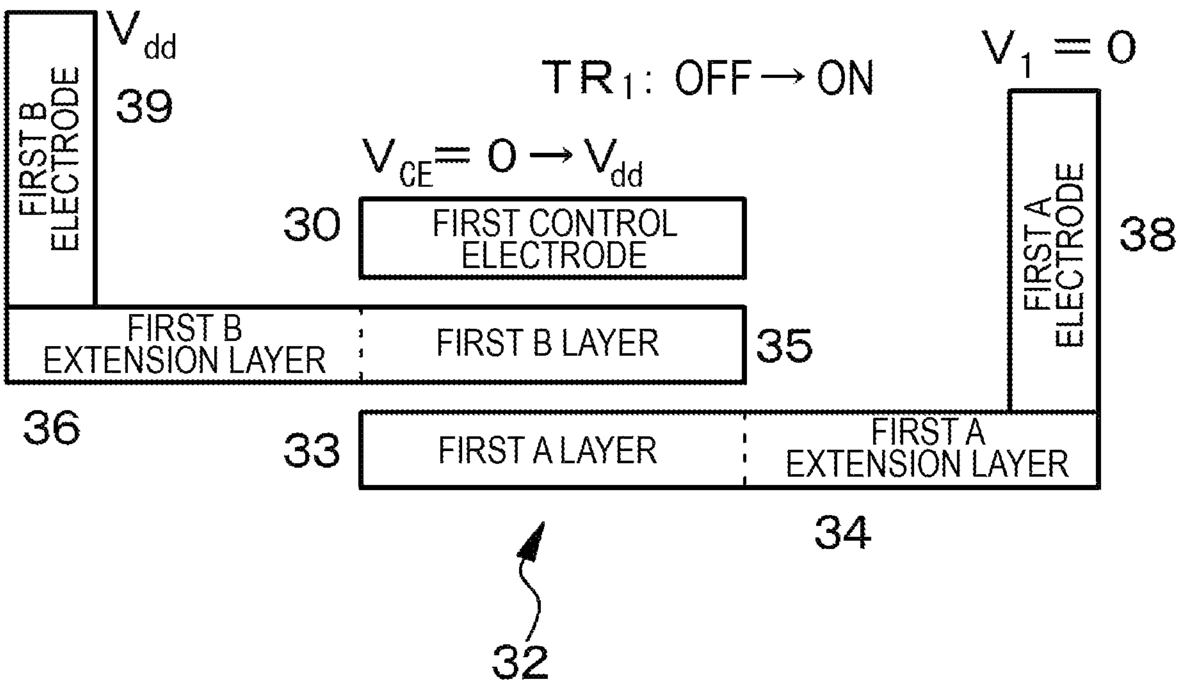
FIGS. 3A and 3B are diagrams schematically illustrating operation states of the complementary transistor of Example 1, subsequent to FIGS. 2A and 2B.
Figure 3B:
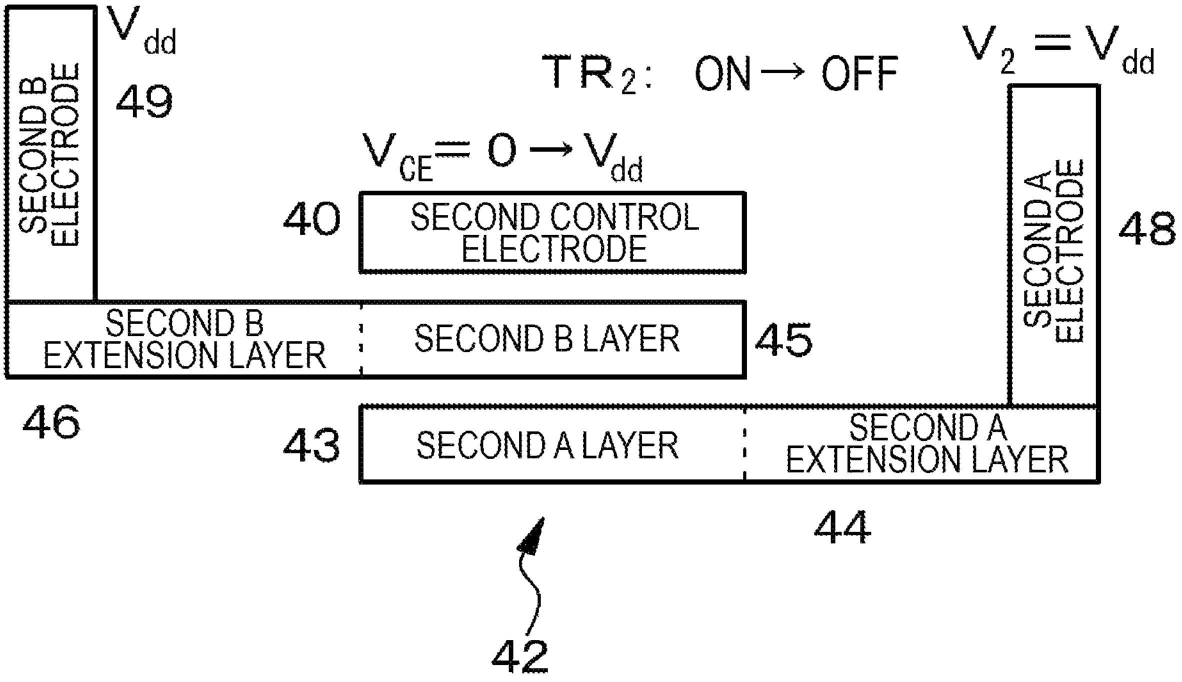
Figure 4A:
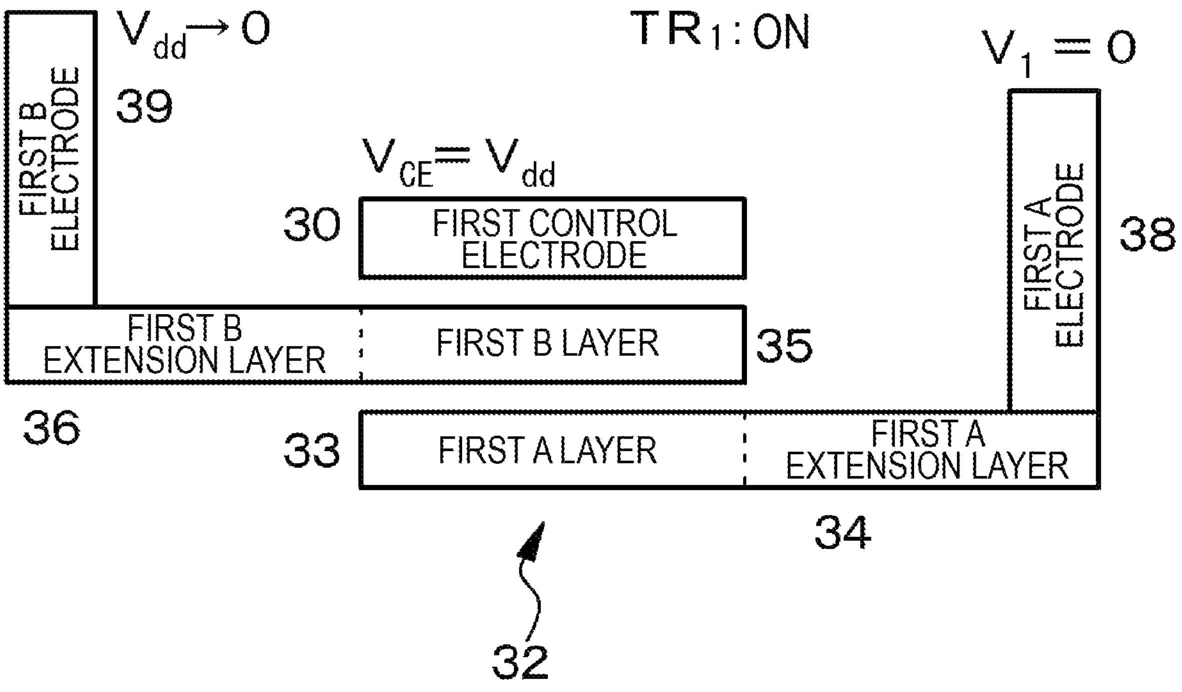
FIGS. 4A and 4B are diagrams schematically illustrating operation states of the complementary transistor of Example 1, subsequent to FIGS. 3A and 3B.
Figure 4B:
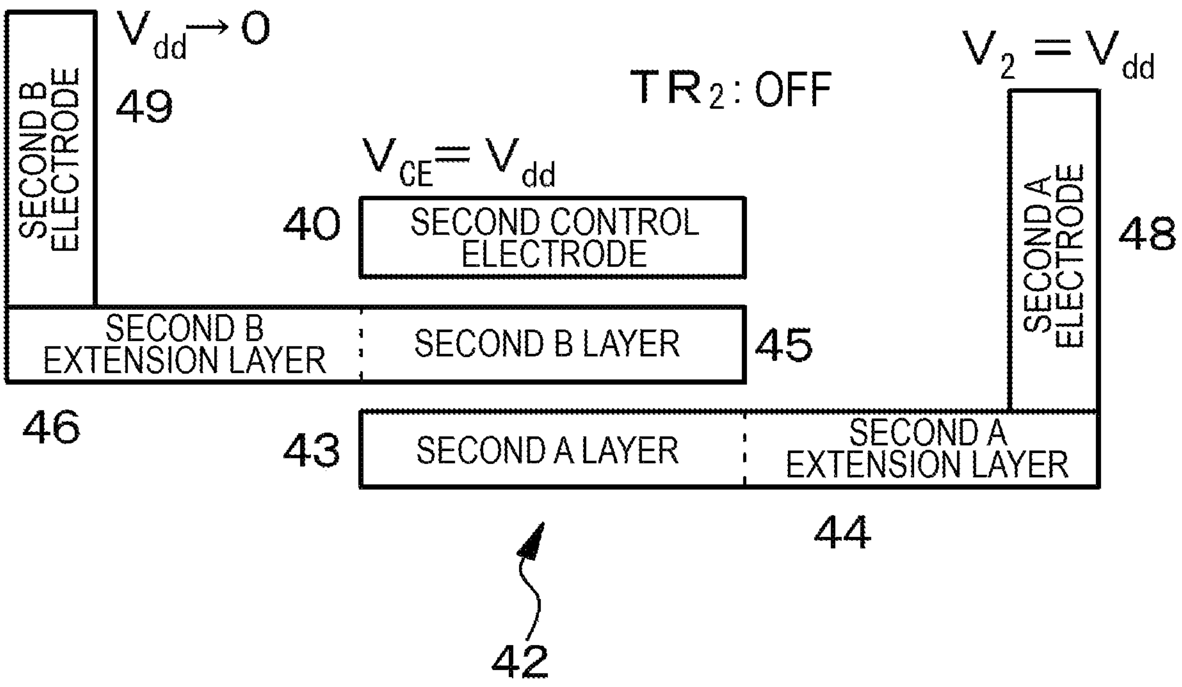
Figure 5:
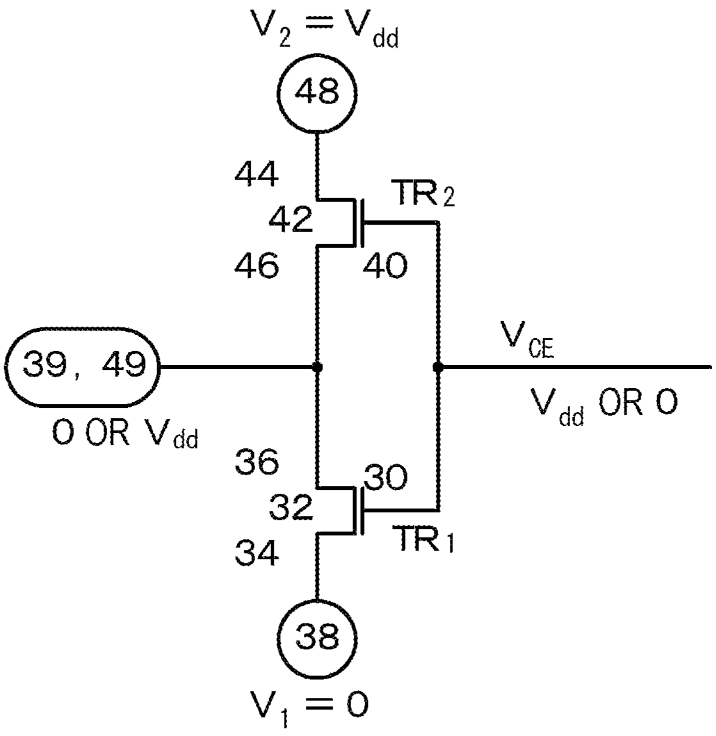
FIG. 5 is an equivalent circuit diagram of an inverter circuit constituted of the complementary transistor of Example 1.
Figure 6A:
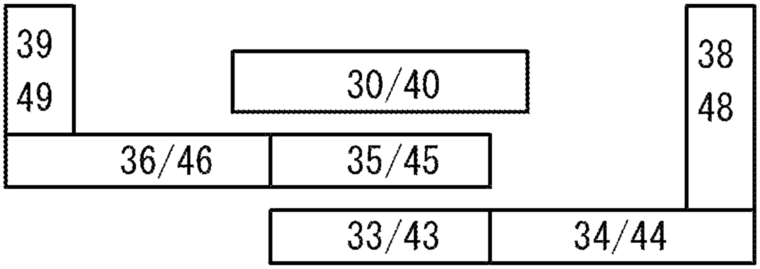
FIGS. 6A, 6B, and 6C are conceptual diagrams each illustrating a positional relation between active regions and a control electrode in the complementary transistor of Example 1.
Figure 6B:
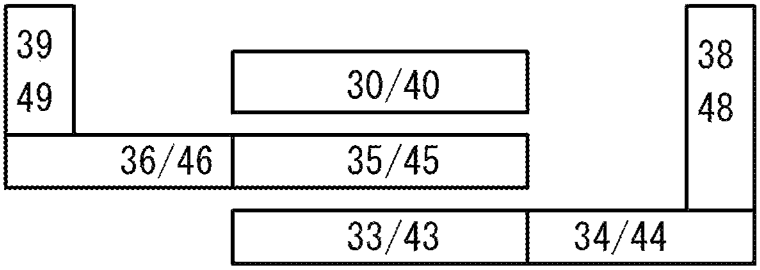
Figure 6C:
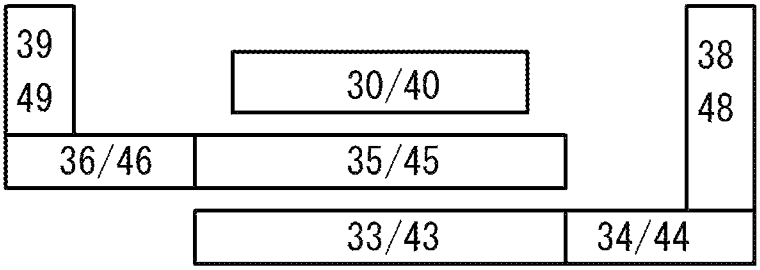

Example 1 relates to a complementary transistor according to the first aspect of the present disclosure and the semiconductor device according to the first aspect of the present disclosure. An inverter circuit is constituted of the complementary transistor of Example 1. FIG. 1 illustrates a schematic partial cross-sectional view of the complementary transistor of Example 1, FIGS. 2A, 2B, 3A, 3B, 4A, and 4B schematically illustrate operation states of the complementary transistor of Example 1, FIG. 5 illustrates an equivalent circuit diagram of the inverter circuit constituted of the complementary transistor of Example 1, and FIGS. 6A, 6B, and 6C are conceptual diagrams illustrating positional relations between active regions and a control electrode in the complementary transistor of Example 1. Note that FIG. 2A illustrates a state in which a first transistor is in a non-conductive state (OFF state), FIG. 2B illustrates a state in which a second transistor is in a conductive state (ON state), FIG. 3A illustrates a state in which the second transistor becomes a conductive state (ON state) from the non-conductive state (OFF state), FIG. 3B illustrates a state in which the second transistor becomes the non-conductive state (OFF state) from the conductive state (ON state), FIG. 4A illustrates a state in which the first transistor is in the conductive state (ON state), and FIG. 4B illustrates a state in which the second transistor is in the non-conductive state (OFF state). Additionally, FIG. 5 illustrates the equivalent circuit diagram of the inverter circuit by using reference signs of field effect transistors for the sake of convenience.

A complementary transistor 10 of Example 1 includes:

a first transistor $TR_1$ including:

a first control electrode 30;

a first active region 32 located below a first control electrode 30 and formed by layering a first A layer 33 and a first B layer 35;

a first insulation layer 31 provided between the first control electrode 30 and the first active region 32, and constituted of a hafnium oxide ($HfO_2$) with a thickness of 1 nm;

a first A extension layer 34 extending from one end of the first active region 32 and constituted of the first A layer 33; and a first B extension layer 36 extending from the other end of the first active region 32 and constituted of the first B layer 35; and further includes:

a second control electrode 40 a second active region 42 located below the second control electrode 40 and formed by layering a second A layer 43 and a second B layer 45;

a second insulation layer 41 provided between the second control electrode 40 and the second active region 42 and constituted of a hafnium oxide ($HfO_2$) having a thickness of 1 nm;

a second A extension layer 44 extending from one end of the second active region 42 and constituted of the second A layer 43; and a second B extension layer 46 extending from the other end of the second active region 42 and constituted of the second B layer 45. However, the film thickness is an example and not limited to these values.

Additionally, a first surface region $\mathbf{20}_1$ provided in a base and having a first conductivity type (specifically, n type in Example 1) corresponds to the first A layer 33 and the first A extension layer 34, the first B layer 35 has a property as a second conductivity type different from the first conductivity type (in other words, exhibits behavior of a second conductivity type, specifically, p type or has an electron accepting property), the first B extension layer 36 is provided on a first insulation region $\mathbf{21}_1$ provided in the base, a second surface region $\mathbf{20}_2$ provided in the base and having the second conductivity type (specifically, p type in Example 1) corresponds to the second A layer 43 and the second A extension layer 44, the second B layer 45 has a property as the first conductivity type (in other words, exhibits behavior of first conductivity type, specifically, n type or has an electron donating property), and the second B extension layer 46 is provided on a second insulation region $\mathbf{21}_2$ provided in the base.

Additionally, the semiconductor device of Example 1 (semiconductor device or semiconductor element) includes: a complementary transistor of Example 1 in which the base is constituted of a silicon semiconductor substrate; and a field effect transistor formed in the silicon semiconductor substrate. The field effect transistor includes a known formation and structure. For example, a field effect transistor group including a plurality of field effect transistors surrounds a complementary transistor group including a plurality of complementary transistors, and the field effect transistor group constitutes a peripheral circuit. Alternatively, it is possible to adopt a configuration in which a complementary transistor is set in the preceding stage and a field effect transistors connected to the complementary transistor is set in the subsequent stage, and for example, when a sensor that detects a desired physical quantity or chemical quantity is connected to the complementary transistor and the sensor detects the desired physical quantity or chemical quantity, the complementary transistor transmits a signal to the field effect transistor in the subsequent stage and amplifies the signal from the sensor by using the field effect transistor. Examples 2 to 6 described later are similar.

Here, each of the first B layer 35 and the first B extension layer 36 is constituted of a two-dimensional material or graphene, and each of the second B layer 45 and the second B extension layer 46 is also constituted of a two-dimensional material or graphene. Specifically, the two-dimensional material includes one kind of two-dimensional material selected from a group consisting of $MoS_2$, $MoSe_2$, $MoTe_2$, $WS_2$, $WSe_2$, $WTe_2$, $ZrS_2$, $ZrSe_2$, $ZrTe_2$, $HfS_2$, $HfSe_2$, and $HfTe_2$. The base is constituted of a semiconductor substrate or silicon (Si), specifically, the silicon semiconductor substrate 20, and the first B layer 35 and the first B extension layer 36 are each constituted of $WTe_2$ (with a thickness equivalent to, for example, a thickness of one atomic layer of $WTe_2$), and the second B layer 45 and the second B extension layer 46 are each constituted of $HfTe_2$ (with a thickness equivalent to, for example, a thickness of one atomic layer of $HfTe_2$). Additionally, each of the first insulation region $\mathbf{21}_1$ and the second insulation region $\mathbf{21}_2$ is constituted of an element isolation region 21 provided on the silicon semiconductor substrate 20 and constituted of $SiO_2$. Note that each of the first insulation region $\mathbf{21}_1$ and the second insulation region $\mathbf{21}_2$ may be formed by performing, for example, ion implantation at a portion where each of the first insulation region $\mathbf{21}_1$ and the second insulation region $\mathbf{21}_2$ is to be formed.

The first transistor $TR_1$ further includes: a first A electrode 38 connected to the first A extension layer 34; and a first B electrode 39 connected to the first B extension layer 36, and the second transistor $TR_2$ further includes: a second A electrode 48 connected to the second A extension layer 44; and a second B electrode 49 connected to the second B extension layer 46. The first control electrode 30 and the second control electrode 40 are each constituted of TiN, for example.

Furthermore, in Example 1 or Examples 2 to 6 described later, an absolute value of a difference between an energy value EC-sub at a lower end of a conduction band of the base (silicon semiconductor substrate 20) and an energy value $E_{C-1B}$ at a lower end of a conduction band of the first B layer 35 (or first B extension region 135) is equal to or less than an energy difference (specifically, 1 eV or less in a case of 1.0 V, for example) at which driving can be performed at drive voltage of a first transistor $TR_1$, an absolute value of a difference between an energy value $E_{V-sub}$ at an upper end of a valence band of the base 20 and an energy value $E_{V-1B}$ at an upper end of a valence band of the first B layer 35 (or first B extension region 135) is equal to or less than the energy difference at which driving can be performed at the drive voltage of the first transistor $TR_1$, an absolute value of a difference between an energy value $E_{C-sub}$ at a lower end of a conduction band of the base 20 and an energy value $E_{C-2B}$ at a lower end of the conduction band of the second B layer 45 (or second B extension region 145) is equal to or less than an energy difference (specifically, 1 eV or less in a case of 1.0 V, for example) at which driving can be performed at drive voltage of the second transistor $TR_2$, and an absolute value of a difference between an energy value $E_{V-sub}$ at an upper end of a valence band of the base 20 and an energy value $E_{V-2B}$ at an upper end of the valence band of the second B layer 45 (or second B extension region 145) is equal to or less than the energy difference at which driving can be performed at the drive voltage of the second transistor $TR_2$.

Additionally, a first interlayer insulation film (first boundary region) 37 is formed between the first A layer 33 and the first B layer 35, and a second interlayer insulation film (second boundary region) 47 is formed between the second A layer 43 and the second B layer 45. The first interlayer insulation film (first boundary region) 37 and the second interlayer insulation film (second boundary region) 47 are constituted of $HfO_2$ with a thickness of 1 nm.

Here, in the complementary transistors of Example 1 or Examples 2 to 6 described later, the second A electrode 48 or 148 is applied voltage higher than that applied to the first A electrode 38 or 138, when second voltage $V_2$(=$V_{dd}$ volts) is applied to the first control electrode 30 or 130 and the second control electrode 40 or 140, the first transistor $TR_1$ becomes the conductive state and the second transistor $TR_2$ becomes the non-conductive state, and when first voltage $V_1$(=0 volts<$V_{dd}$) lower than the second voltage $V_2$(=$V_{dd}$ volts) is applied to the first control electrode 30 or 130 and the second control electrode 40 or 140, the first transistor $TR_1$ becomes the non-conductive state and the second transistor $TR_2$ becomes the conductive state. In FIGS. 2A, 2B, 3A, 3B, 4A, 4B, 17A, 17B, 18A, 18B, 19A and 19B, voltage applied to the first control electrode 30 or 130 and the second control electrodes 40 or 140 is indicated by $V_{CE}$.

In other words, in the complementary transistors of Example 1 or Examples 2 to 6 described later, when the first voltage $V_1$(=0 volts) lower than the second voltage $V_2$ is applied to the first control electrode 30 or 130, for example, the first voltage $V_1$ is applied to the first A layer 33 (or first A extension region 133) constituting the first transistor and there is no change in each of the energy value at the upper end of the valence band and the energy value at the lower end of the conduction band in the first boundary regions 37 or 137 located between the first A layer 33 (or first A extension region 133) and the first B layer 35 (or first B extension region 135) in the first transistor $TR_1$ (refer to FIG. 35A). As a result, there is no electron moved from the first A layer 33 (or first A extension region 133) to the first B layer 35 (or first B extension region 135), and the first transistor $TR_1$ becomes the non-conductive state. On the other hand, the energy value at the upper end of the valence band and the energy value at the lower end of the conduction band in the second boundary region 47 or 147 located between the second A layer 43 (or second A extension region 143) and the second B layer 45 (or second B extension region 145) in the second transistor $TR_2$ become close to the energy value EV-2B at the upper end of the valence band and the energy value $E_{C-2B}$ at the lower end of the conduction band of the second B layer 45 (or second B extension region 145), respectively (refer to FIG. 35D). As a result, since electrons are moved from the second B layer 45 (or second B extension region 145) to the second A layer 43 (or second A extension region 143) by a tunnel effect, the second transistor $TR_2$ becomes the conductive state, potentials of the second A layer 43 and second B layer 45 ideally become equal to each other, and a potential of the second B electrode 49 or 149 becomes a second potential $V_2$.

On the other hand, when the second voltage $V_2$ higher than the first voltage $V_1$ is applied to the first electrode 30 or 130, for example, the first voltage $V_1$ is applied to the first A layer 33 (or first A extension region 133) constituting the first transistor $TR_1$, the energy value at the upper end of the valence band and the energy value at the lower end of the conduction band of the first boundary regions 37 or 137 located between the first A layer 33 (or first A extension region 133) and the first B layer 35 (or first B extension region 135) in the first transistor $TR_1$ become close to the energy value $E_{V-1B}$ at the upper end of the valence band and the energy value $E_{C-1B}$ at the lower end of the conduction band of the first B layer 35 (or first B extension region 135), respectively (refer to FIG. 35B). As a result, since electrons are moved from the first A layer 33 (or first A extension region 133) to the first B layer 35 (or first B extension region 135) by the tunnel effect, the first transistor $TR_1$ becomes the conductive state, potentials of the first A layer 33 (or first A extension region 133) and first B layer 35 (or first B extension region 135) ideally become equal to each other, and a potential of the first B electrode 39 or 139 becomes a first potential $V_1$. On the other hand, in the second transistor $TR_2$, since the second voltage $V_2$ is applied to the second A layer 43 (or second A extension region 143) and the second voltage $V_2$ is applied to the second control electrode 40, for example, there are no changes in the energy value at the upper end of the valence band and the energy value at the lower end of the conduction band of the second boundary regions 47 or 147 located between the second A layer 43 (or second A extension region 133) and the second B layer 45 (or second B extension region 145) in the second transistor $TR_2$ (refer to FIG. 35C). As a result, there is no electron moved from the second B layer 45 (or second B extension region 145) to the second A layer 43 (or second A extension region 143), and the second transistor $TR_2$ becomes the non-conducting state.

The first active region 32 and the first control electrode 30 overlap with each other in an overlap region, but an orthogonal projection image of the first active region 32 may be included in an orthogonal projection image of the first control electrode 30 (refer to FIG. 6A), may coincide with the orthogonal projection image of the first control electrode 30 (refer to FIG. 6B), or may protrude from the orthogonal projection image of the first control electrode 30 (refer to FIG. 6C). Similarly, the second active region 42 and the second control electrode 40 overlap with each other in an overlap region, but an orthogonal projection image of the second active region 42 may be included in an orthogonal projection image of the second control electrode 40 (refer to FIG. 6A), may coincide with the orthogonal projection image of the second control electrode 40 (refer to FIG. 6B), or may protrude from the orthogonal projection image of the second control electrode 40 (refer to FIG. 6C). Note that it is desirable that the orthogonal projection images of the first active region 32 and second active region 42 be respectively included in the orthogonal projection images of the first control electrode 30 and the second control electrode 40 from the viewpoint that an electric field generated by each of the first control electrode 30 and the second control electrode 40 is more uniformly applied.

Figure 7A:
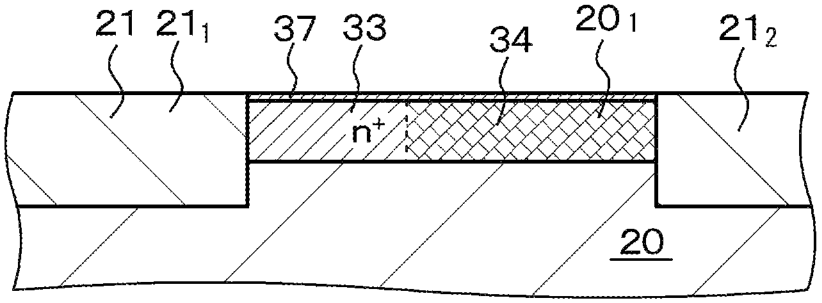
FIGS. 7A, 7B, and 7C are schematic partial cross-sectional views of a silicon semiconductor substrate and the like to describe an outline of a manufacturing method for a first transistor in the complementary transistor of Example 1.
Figure 7B:
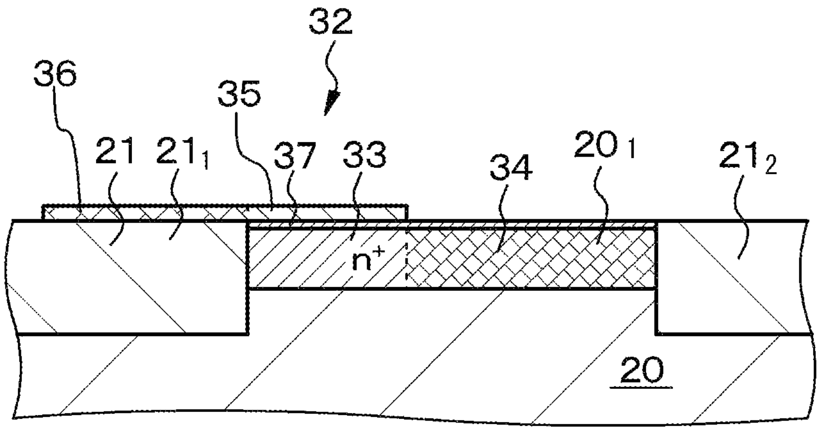
Figure 7C:
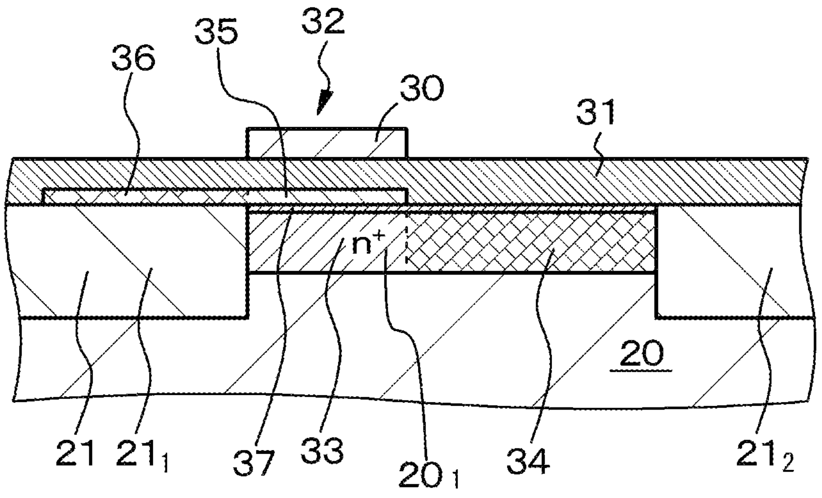

Hereinafter, for example, an outline of a manufacturing method for the first transistor in the complementary transistor of Example 1 will be described with reference to FIGS. 7A, 7B and 7C.

[Step-100]

In other words, the element isolation regions 21 are formed in the silicon semiconductor substrate 20 on the basis of a known method. Then, the first surface region $\mathbf{20}_1$ (first A layer 33 and first A extension layer 34) having the first conductivity type (specifically, n type) is formed on a surface in a region of the silicon semiconductor substrate 20 surrounded by the element isolation regions 21 on the basis of the ion implantation method (refer to FIG. 7A).

[Step-110]

Next, a first interlayer insulation film 37 is formed on the surface of the silicon semiconductor substrate 20 (or on surface of the silicon semiconductor substrate 20 and the element isolation region 21). Then, $WTe_2$ is formed on the first interlayer insulation film 37 and the first insulation region (element isolation region) $\mathbf{21}_1$ by the CVD method, and then each of the first B layer 35 and the first B extension layer 36 can be obtained by performing patterning into a desired shape (refer to FIG. 7B).

[Step-120]

Next, the first insulation layer 31 is formed on the entire surface. Then, the first control electrode 30 is formed on the first insulation layer 31 (refer to FIG. 7C). After that, the interlayer insulation layer 22 constituted of $SiO_2$ is formed on the entire surface, an opened portion is formed in the interlayer insulation layer 22 located above the first A extension layer 34, and the first A electrode 38 can be formed over a top surface of the interlayer insulation layer 22 by filling the opened portion with a conductive material. On the other hand, an opened portion is formed in the interlayer insulation layer 22 located above the first B extension layer 36, and the first B electrode 39 can be formed over the top surface of the interlayer insulation layer 22 by filling the opened portion with a conductive material.

The second transistor $TR_2$ can also be formed by a substantially similar method. Then, the complementary transistor illustrated in FIG. 1 can be thus obtained.

In the complementary transistor of Example 1, since the first A layer 33, first A extension layer 34, second A layer 43, and second A extension layer 44 are formed in the surface region of the base 20, the number of kinds of materials constituting the active regions and the like of the complementary transistor may be three (specifically, silicon, $WTe_2$, and $HfTe_2$, for example) at maximum, and the number of kinds of two-dimensional materials (2D materials) may be two, and the number of kinds of the constituent materials for the active regions and the like of the complementary transistor can be reduced, and the manufacturing process can be simplified.

Example 2

Figure 10:
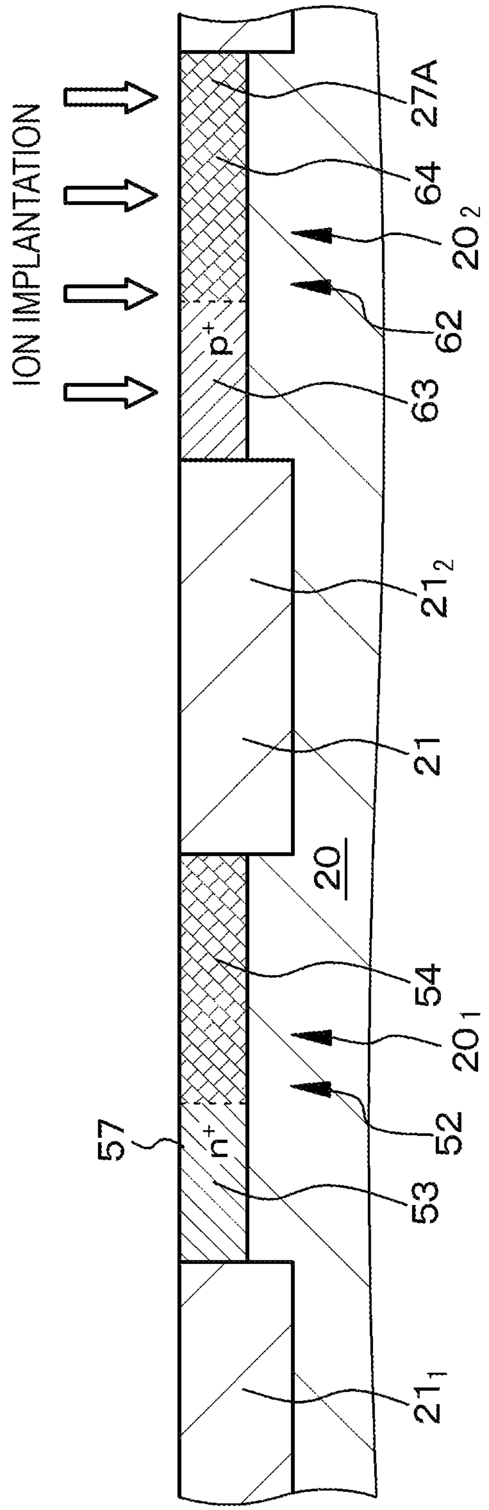
FIG. 10 is a schematic partial cross-sectional view of the silicon semiconductor substrate and the like to describe the outline of the manufacturing method for the complementary transistor of Example 2, subsequent to FIG. 9B.

Example 2 is a modification of Example 1. In a complementary transistor of Example 2, as illustrated in a schematic partial end view of the complementary transistor of Example 2 in course of manufacture in FIG. 10,

- portions (specifically, first A layer 53 and first A extension layer 54) of the base constituting the first surface region $\mathbf{20}_1$ and portions (specifically, second A layer 63 and second A extension layer 64) of the base constituting the second surface region $\mathbf{20}_2$ are constituted of different materials, and
- the first B layer 35 and first B extension layer 36, and the second B layer 45 and second B extension layer 46 are constituted of the same material (also refer to FIG. 1). In other words, the complementary transistor of Example 2 is constituted of only one kind of two-dimensional material (2D material), one kind of semiconductor layer, and one kind of semiconductor substrate, and the number of kinds of constituent materials (particularly, two-dimensional material) for the active regions and the like of the complementary transistor can be further reduced and the manufacturing process can be further simplified.

Then, a difference between a value $[E_C(N)]$ of a valence band of the portions 53 and 54 included in the base and constituting the first surface region $\mathbf{20}_1$ and a value $[E_V(2D)]$ of a conduction band of a material constituting the first B layer 35 and first B extension layer 36 is 1 eV or less, and

- a difference between a value $[E_V(P)]$ of a conduction band of the portions 63 and 64 included in the base and constituting the second surface region $\mathbf{20}_2$ and a value $[E_C(2D)]$ of the valence band of a material constituting the second B layer 45 and second B extension layer 46 is 1 eV or less In other words, $$Ev(P) - Ec(2D) \leq 1(\text{eV}); \text{ and}$$

$$Ev(2D) - Ec(N) \leq 1(\text{eV}),$$

are satisfied.

Specifically, in the complementary transistor of Example 2,

- the portions 53 and 54 included in the base and constituting the first surface region $\mathbf{20}_1$ are constituted of the silicon semiconductor substrate 20,
- the portions 63 and 64 included in the base and constituting the second surface region $\mathbf{20}_2$ are constituted of a semiconductor layer (specifically, germanium layer) 27A formed in the silicon semiconductor substrate 20, and
- the first B layer 35 and first B extension layer 36, and the second B layer 45 and second B extension layer 46 are constituted of the same two-dimensional material (specifically, $MoTe_2$).

Hereinafter, an outline of a manufacturing method for the complementary transistor of the Example 2 will be described with reference to FIGS. 8A, 8B, 9A, 9B, and 10.

[Step-200A]

Figure 8A:
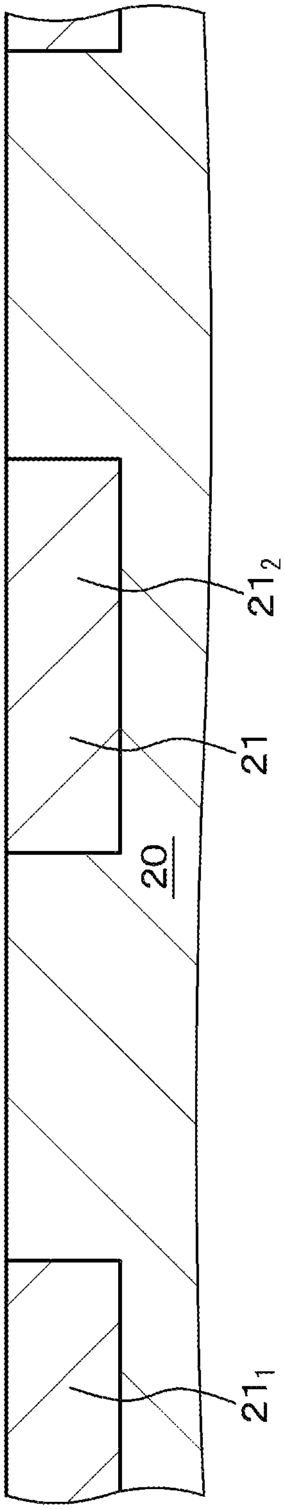
FIGS. 8A and 8B are schematic partial cross-sectional views of a silicon semiconductor substrate and the like to describe an outline of a manufacturing method for a complementary transistor of Example 2.
Figure 8B:
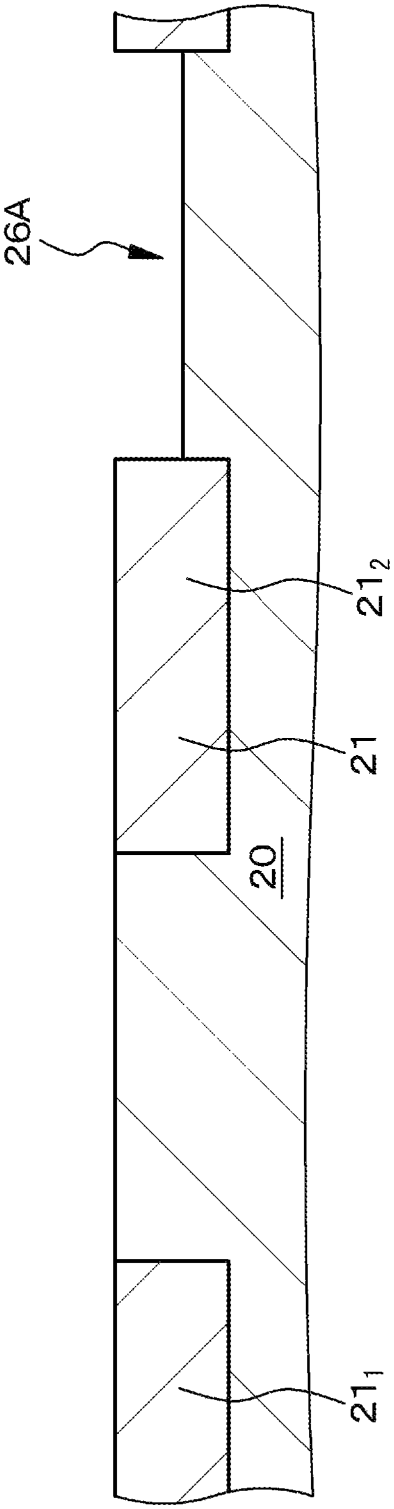

In other words, element isolation regions 21 ($\mathbf{21}_1$ and $\mathbf{21}_2$) are formed in the silicon semiconductor substrate 20 on the basis of a known method (refer to FIG. 8A). Then, a recessed portion 26A is formed by etching a region of the silicon semiconductor substrate 20 surrounded by the element isolation regions 21, namely, a region of the silicon semiconductor substrate 20 where the second transistor $TR_2$ is to be formed (refer to FIG. 8B).

[Step-210A]

Figure 9A:
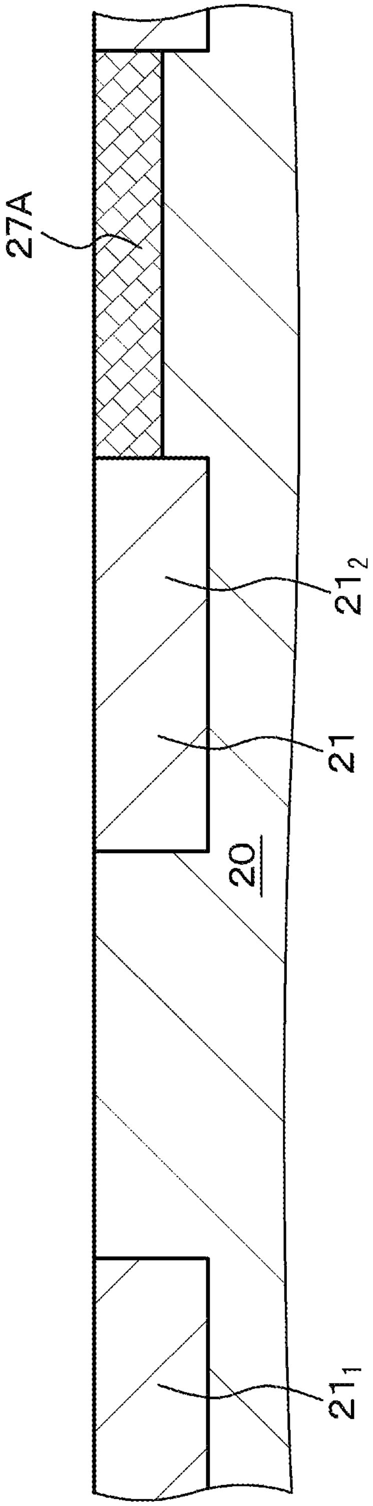
FIGS. 9A and 9B are schematic partial cross-sectional views of the silicon semiconductor substrate and the like to describe the outline of the manufacturing method for the complementary transistor of Example 2, subsequent to FIG. 8B.
Figure 9B:
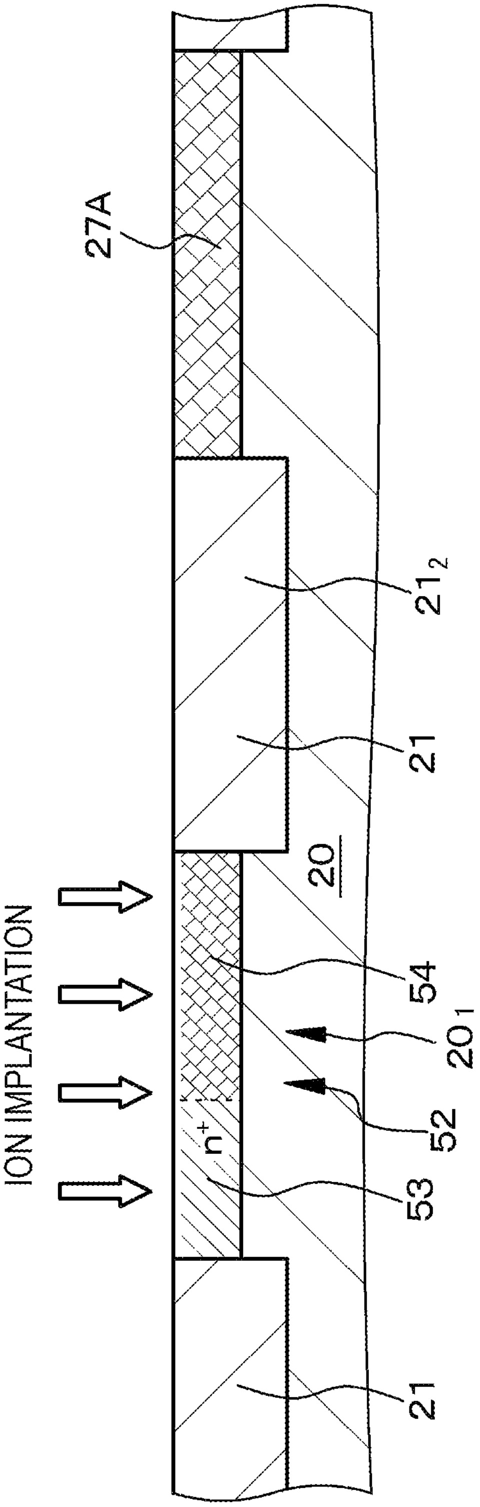

Next, a desired region is covered with a mask layer (not illustrated), and the recessed portion 26A is filled with a germanium (Ge) layer 27A that is a semiconductor layer on the basis of an epitaxial growth method (refer to FIG. 9A). Note that formation of the recessed portion 26A is not necessary in a case of forming the germanium (Ge) layer 27A on the basis of a concentration method. The similar is applied to the following description.

[Step-220A]

Then, ion implantation is applied to the region of the silicon semiconductor substrate 20 where the first transistor $TR_1$ is to be formed. Consequently, the first surface region $\mathbf{20}_1$ (first A layer 53 and first A extension layer 54) having the first conductivity type (specifically, n type) is formed on the surface in the region of the silicon semiconductor substrate 20 surrounded by the element isolation regions 21 (refer to FIG. 9B).

Furthermore, ion implantation is applied to the region of the germanium layer 27A where the second transistor $TR_2$ is to be formed. Consequently, the second surface region $\mathbf{20}_2$ (second A layer 63 and second A extension layer 64) having the second conductivity type (specifically, p type) is formed in the germanium layer 27A surrounded by the element isolation regions 21 (refer to FIG. 10).

[Step-230A]

After that, the first transistor $TR_1$ and the second transistor $TR_2$ can be obtained by constituting the first B layer 35 and first B extension layer 36, and the second B layer 45 and second B extension layer 46 of $MoTe_2$ in a manner similar to the method described in Example 1. Thus, the complementary transistor similar to that illustrated in FIG. 1 can be obtained.

Figure 13:
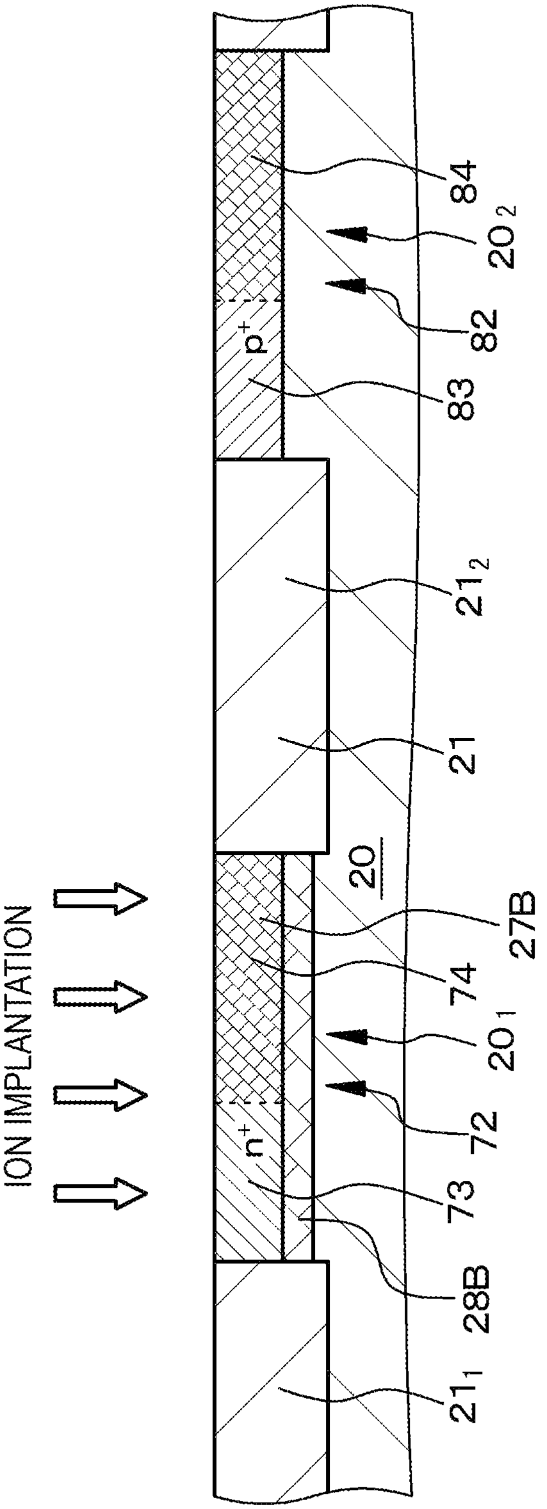
FIG. 13 is a schematic partial cross-sectional view of the silicon semiconductor substrate and the like to describe the outline of the manufacturing method for the complementary transistor of the first modified example of Example 2, subsequent to FIG. 12B.

Alternatively, in a first modified example of Example 2, as illustrated in a partial end view of the complementary transistor of the first modified example of Example 2 in course of manufacture in FIG. 13,

- portions 73 and 74 of the base constituting the first surface region $\mathbf{20}_1$ are constituted of a semiconductor layer (specifically, indium arsenide (InAs) layer) 27B formed in a silicon semiconductor substrate,
- portions 83 and 84 of the base constituting the second surface region $\mathbf{20}_2$ are constituted of the silicon semiconductor substrate 20, and
- the first B layer 35 and first B extension layer 36, and the second B layer 45 and second B extension layer 46 are constituted of the same two-dimensional material (specifically, $MoS_2$) (also refer to FIG. 1).

Hereinafter, an outline of a manufacturing method for the complementary transistor of the first modified example of Example 2 will be described with reference to FIGS. 11A, 11B, 12A, 12B, and 13.

[Step-200B]

Figure 11A:
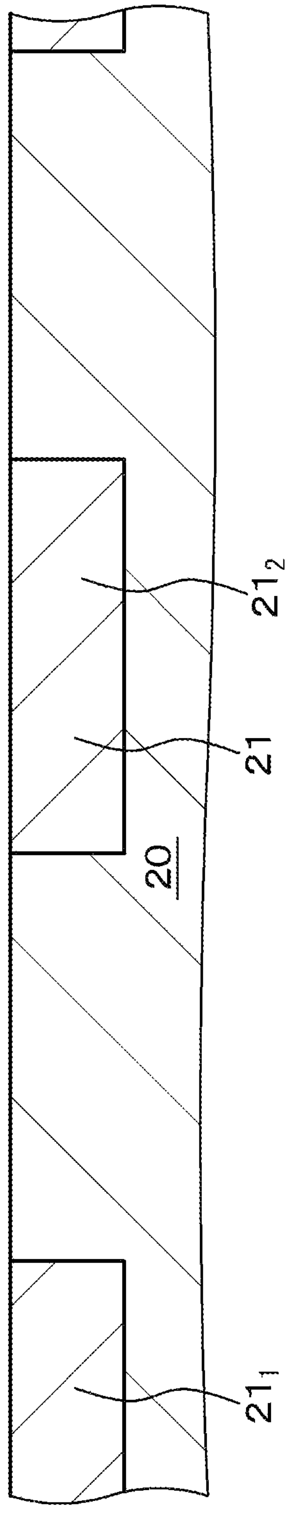
FIGS. 11A and 11B are schematic partial cross-sectional views of a silicon semiconductor substrate and the like to describe an outline of a manufacturing method for a complementary transistor of a first modified example of the Example 2.
Figure 11B:
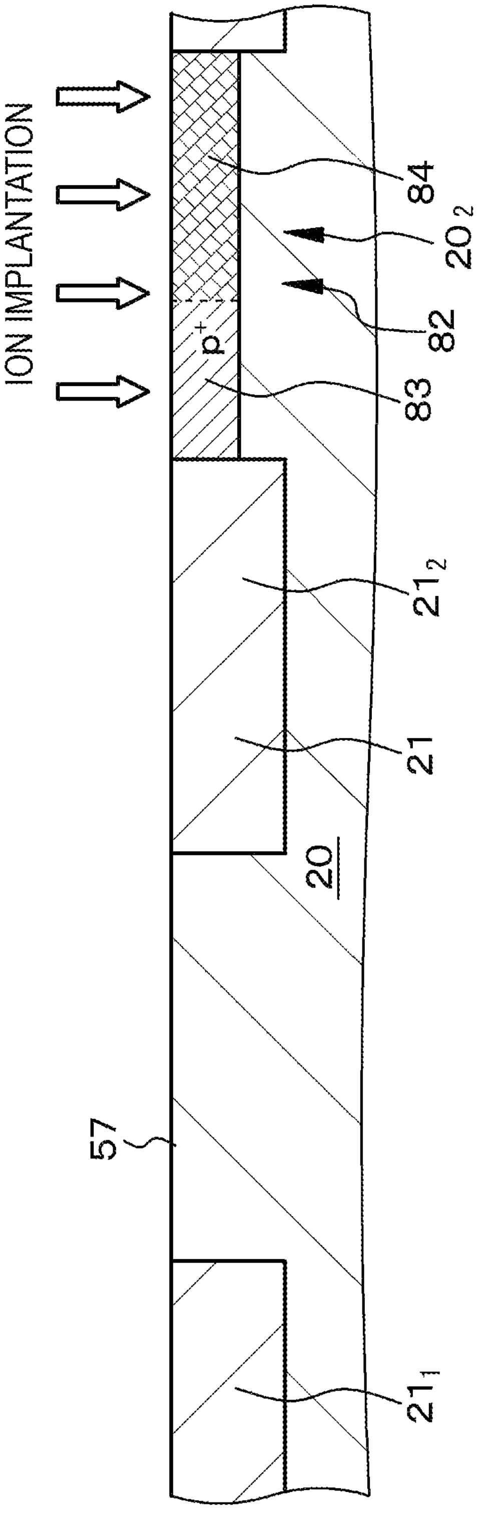

In other words, the element isolation regions 21 ($\mathbf{21}_1$ and $\mathbf{21}_2$) are formed in the silicon semiconductor substrate 20 on the basis of a known method (refer to FIG. 11A). Then, ion implantation is applied to a region of the silicon semiconductor substrate 20 surrounded by the element isolation regions 21, namely, a region of the silicon semiconductor substrate 20 where the second transistor $TR_2$ is to be formed. Consequently, the second surface region $\mathbf{20}_2$ (second A layer 83 and second A extension layer 84) having the second conductivity type (specifically, p type) can be formed on a surface region surrounded by the element isolation regions 21 and included in the silicon semiconductor substrate 20 (refer to FIG. 11B).

[Step-210B]

Figure 12A:
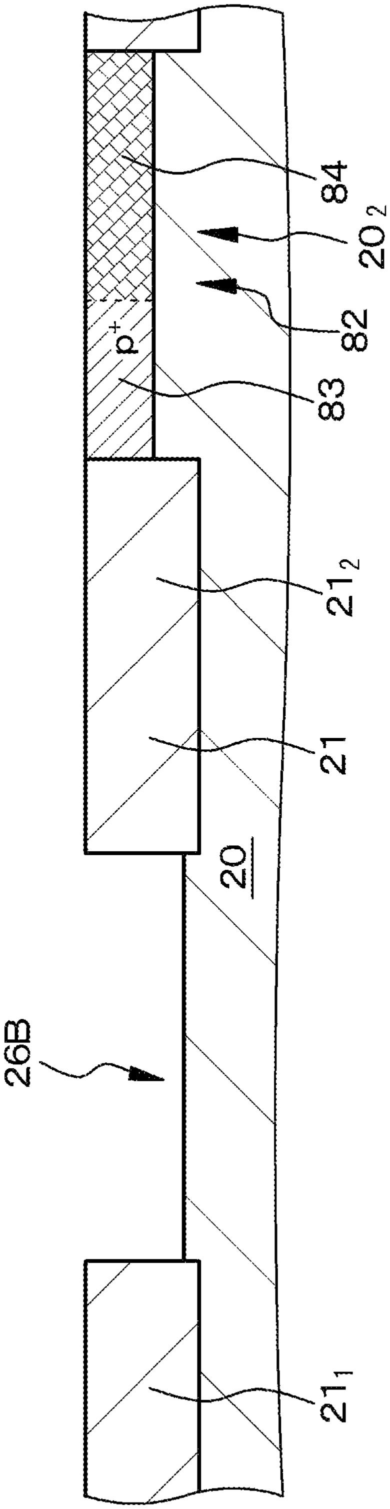
FIGS. 12A and 12B are schematic partial cross-sectional views of the silicon semiconductor substrate and the like to describe the outline of the manufacturing method for the complementary transistor of the first modified example of Example 2, subsequent to FIG. 11B.

Next, a recessed portion 26B is formed by etching a region of the silicon semiconductor substrate 20 surrounded by the element isolation regions 21, namely, a region of the silicon semiconductor substrate 20 where the first transistor $TR_1$ is to be formed (refer to FIG. 12A).

[Step-220B]

Figure 12B:
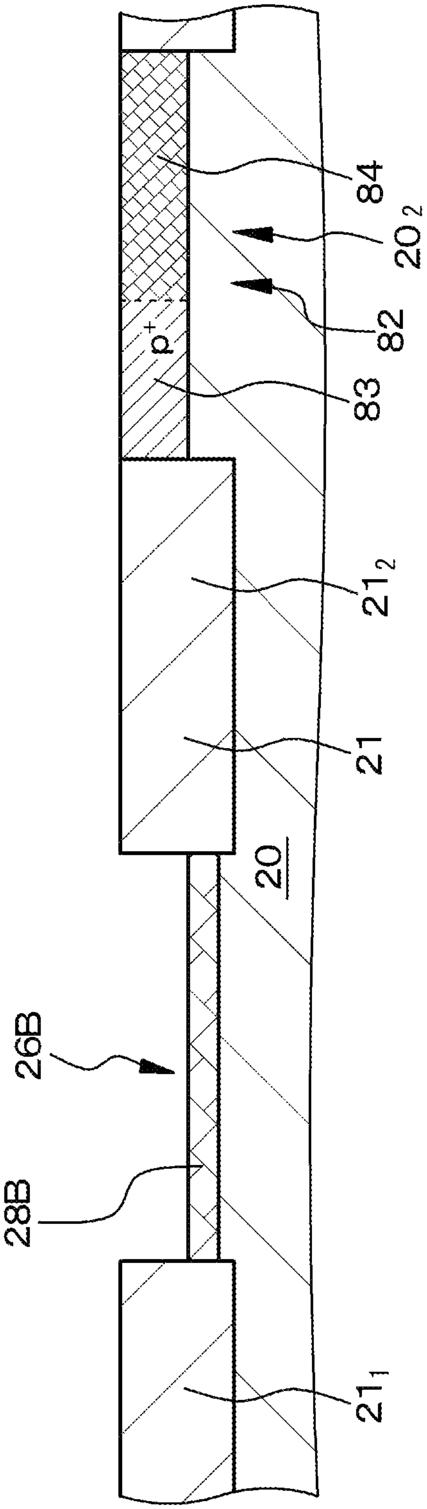

After that, a desired region is covered with a mask layer (not illustrated), and a buffer layer 28B constituted of InP is formed on a bottom portion of the recessed portion 26B on the basis of the epitaxial growth method (refer to FIG. 12B). Subsequently, the InAs layer 27B as the semiconductor layer is further formed by the epitaxial growth method, and then ion implantation is applied to a region of the silicon semiconductor substrate 20 where the first transistor $TR_1$ is to be formed. Consequently, the first surface region $\mathbf{20}_1$ (first A layer 73 and first A extension layer 74) having the first conductivity type (specifically, n type) is formed on the surface in the region of the silicon semiconductor substrate 20 surrounded by the element isolation regions 21 (refer to FIG. 13).

[Step-230B]

Next, the first transistor $TR_1$ and the second transistor $TR_2$ can be obtained by constituting the first B layer 35 and first B extension layer 36, and the second B layer 45 and second B extension layer 46 of $MoS_2$ in a manner similar to the method described in Example 1. Thus, the complementary transistor similar to that illustrated in FIG. 1 can be obtained.

Figure 15:
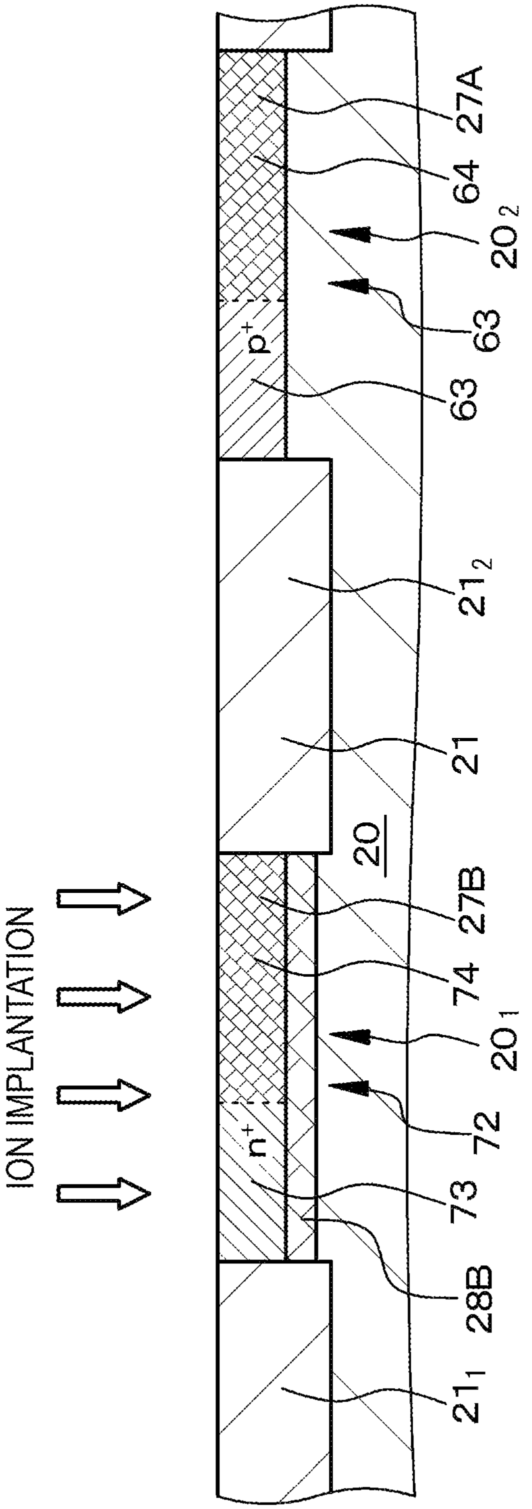
FIG. 15 is a schematic partial cross-sectional view of the silicon semiconductor substrate and the like to describe an outline of the manufacturing method for the complementary transistor of the second modified example of Example 2, subsequent to FIG. 14B.

Alternatively, in a second modified example of Example 2, as illustrated in a partial end view of the complementary transistor of the second modified example of Example 2 in course of manufacture in FIG. 15,

- portions 73 and 74 of the base constituting the first surface region $\mathbf{20}_1$ are constituted of a first semiconductor layer (specifically, indium arsenide (InAs) layer) 27B formed in a semiconductor substrate 20,
- portions 63 and 64 of the base constituting the second surface region $\mathbf{20}_2$ are constituted of a second semiconductor layer (specifically, germanium layer) 27A formed in the semiconductor substrate 20, and
- the first B layer 35 and first B extension layer 36, and the second B layer 45 and second B extension layer 46 are constituted of the same two-dimensional material (specifically, $MoS_2$) (also refer to Example 1).

Figure 14A:
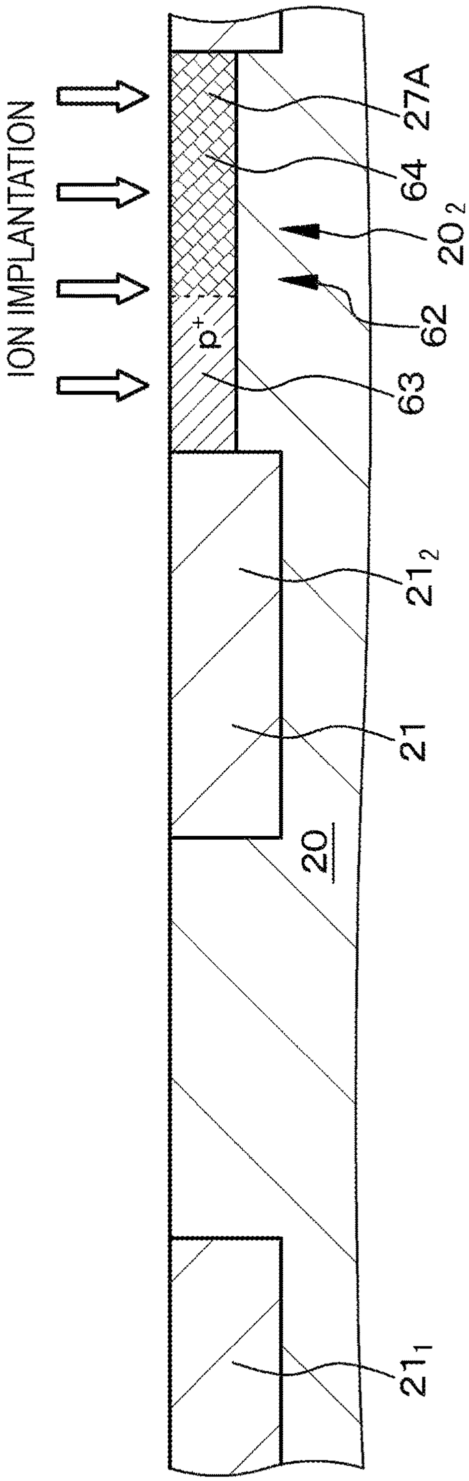
FIGS. 14A and 14B are schematic partial cross-sectional views of a silicon semiconductor substrate and the like to describe an outline of a manufacturing method for a complementary transistor of a second modified example of the Example 2.

Hereinafter, an outline of a manufacturing method for the complementary transistor of the second modified example of Example 2 will be described with reference to FIGS. 14A, 14B, and 15.

[Step-200C]

In other words, similar to Example 2, the element isolation regions 21 ($\mathbf{21}_1$ and $\mathbf{21}_2$) are formed in the silicon semiconductor substrate 20 on the basis of the known method. Then, a recessed portion 26A is formed by etching a region of the silicon semiconductor substrate 20 surrounded by the element isolation regions 21, namely, a region of the silicon semiconductor substrate 20 where the second transistor $TR_2$ is to be formed (refer to FIGS. 8A and 8B). Next, a desired region is covered with a mask layer (not illustrated), and the recessed portion 26A is filled with the germanium (Ge) layer 27A that is a semiconductor layer on the basis of an epitaxial growth method (refer to FIG. 9A), and ion implantation is applied to the germanium layer 27A. Consequently, the second surface region $\mathbf{20}_2$ (second A layer 63 and second A extension layer 64) having the second conductivity type (specifically, p type) is formed in the germanium layer 27A surrounded by the element isolation regions 21 (refer to FIG. 14A).

[Step-210C]

Next, a recessed portion 26B is formed by etching a region of the silicon semiconductor substrate 20 surrounded by the element isolation regions 21, namely, a region of the silicon semiconductor substrate 20 where the first transistor $TR_1$ is to be formed.

[Step-220C]

Figure 14B:
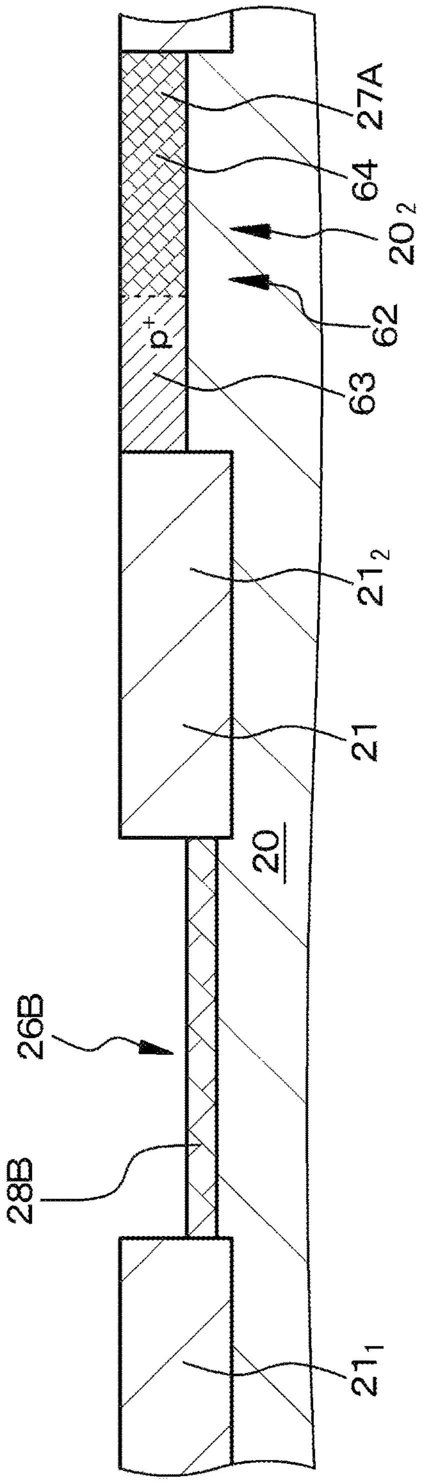

After that, a desired region is covered with a mask layer (not illustrated), and a buffer layer 28B constituted of InP is formed on a bottom portion of the recessed portion 26B on the basis of the epitaxial growth method (refer to FIG. 14B). Subsequently, the InAs layer 27B as the semiconductor layer is further formed by the epitaxial growth method, and then ion implantation is applied to a region of the silicon semiconductor substrate 20 where the first transistor $TR_1$ is to be formed. Consequently, the first surface region $\mathbf{20}_1$ (first A layer 73 and first A extension layer 74) having the first conductivity type (specifically, n type) is formed on the surface in the region of the silicon semiconductor substrate 20 surrounded by the element isolation regions 21 (refer to FIG. 15).

[Step-230C]

Next, the first transistor $TR_1$ and the second transistor $TR_2$ can be obtained by constituting the first B layer 35 and first B extension layer 36, and the second B layer 45 and second B extension layer 46 of $MoS_2$ in a manner similar to the method described in Example 1. Thus, the complementary transistor similar to that illustrated in FIG. 1 can be obtained.

Example 3

Example 3 is also a modification of Example 1. In a complementary transistor of Example 3,

- the portions 53 and 54 of the base constituting the first surface region $\mathbf{20}_1$ and the portions 63 and 64 of the base constituting the second surface region $\mathbf{20}_2$ are constituted of different materials, and
- the first B layer 35 and first B extension layer 36, and the second B layer 45 and second B extension layer 46 are constituted of different materials.

Specifically, the portions 53 and 54 of the base constituting the first surface region $\mathbf{20}_1$ are constituted of the silicon semiconductor substrate 20,

- the portions 63 and 64 of the base constituting the second surface region $\mathbf{20}_2$ are constituted of a germanium layer 27A formed in the silicon semiconductor substrate 20,
- the first B layer 35 and the first B extension layer 36 are constituted of $MoTe_2$, and
- the second B layer 45 and the second B extension layer 46 are constituted of $MoS_2$.

Alternatively, specifically, the portions 53 and 54 of the base constituting the first surface region $\mathbf{20}_1$ are constituted of an indium arsenide layer 27B formed in the silicon semiconductor substrate 20,

- the portions 63 and 64 of the base constituting the second surface region $\mathbf{20}_2$ are constituted of the silicon semiconductor substrate 20,
- the first B layer and first B extension layer (or first B extension region) are constituted of $MoTe_2$, and
- the second B layer and second B extension layer (or second B extension region) are constituted of $MoS_2$.

Alternatively, specifically, the portions 53 and 54 of the base constituting the first surface region $\mathbf{20}_1$ are constituted of an indium arsenide layer 27B formed in the silicon semiconductor substrate 20,

- the portions 63 and 64 of the base constituting the second surface region $\mathbf{20}_2$ are constituted of a germanium layer 27A formed in the silicon semiconductor substrate 20,
- the first B layer and first B extension layer (or first B extension region) are constituted of $MoTe_2$, and
- the second B layer and second B extension layer (or second B extension region) are constituted of $MoS_2$.

A forming method for the portions 53 and 54 of the base constituting the first surface region $\mathbf{20}_1$ and the portions 63 and 64 of the base constituting the second surface region $\mathbf{20}_2$ in Example 3 can be a method similar to the method described in Example 2, and furthermore, the first transistor $TR_1$ and the second transistor $TR_2$ can be obtained by a method similar to the method described in Example 1. Thus, the complementary transistor similar to that illustrated in FIG. 1 can be obtained.

Example 4

Figure 16:
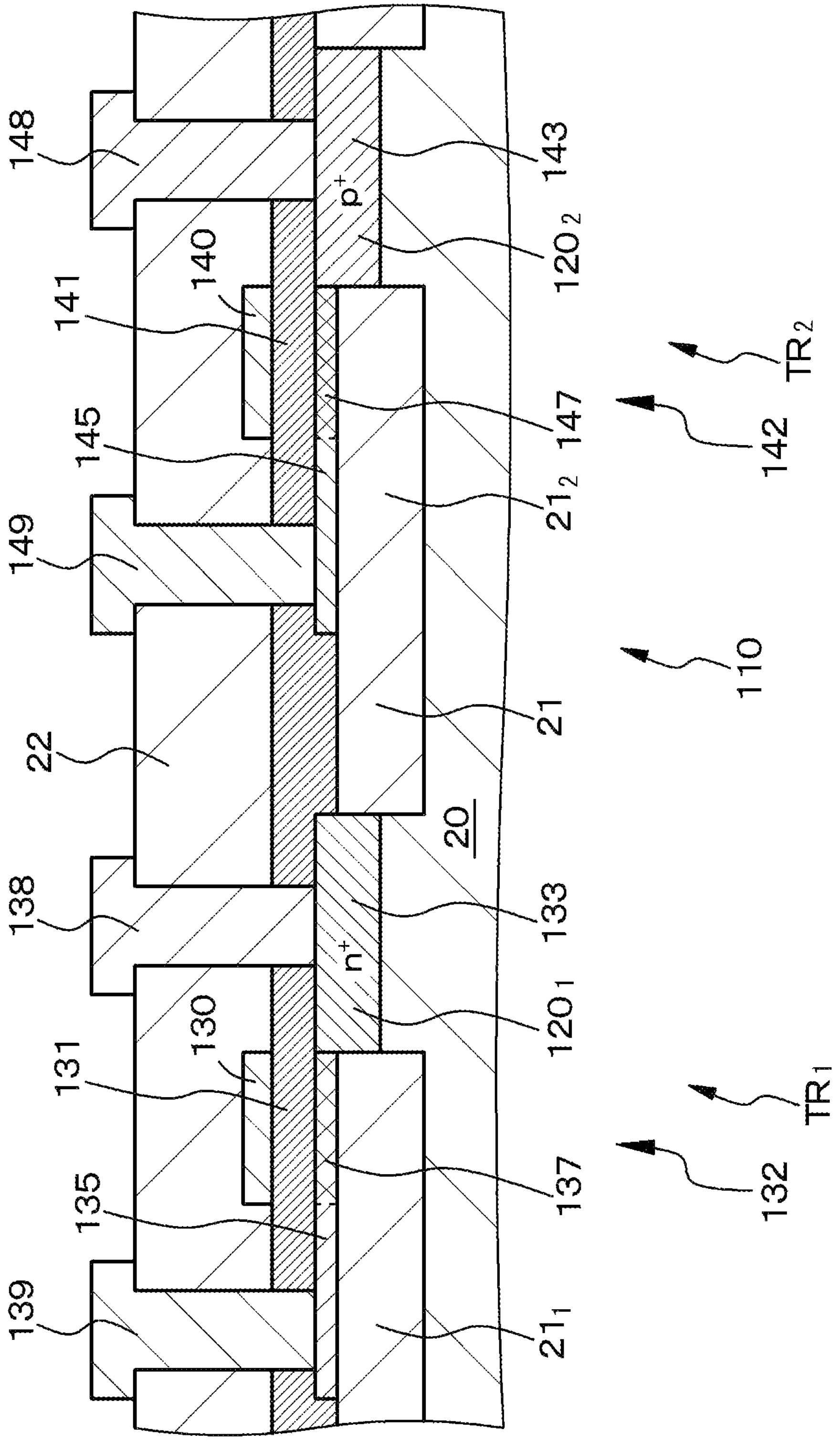
FIG. 16 is a schematic partial cross-sectional view of a complementary transistor according to Example 4.
Figure 17A:
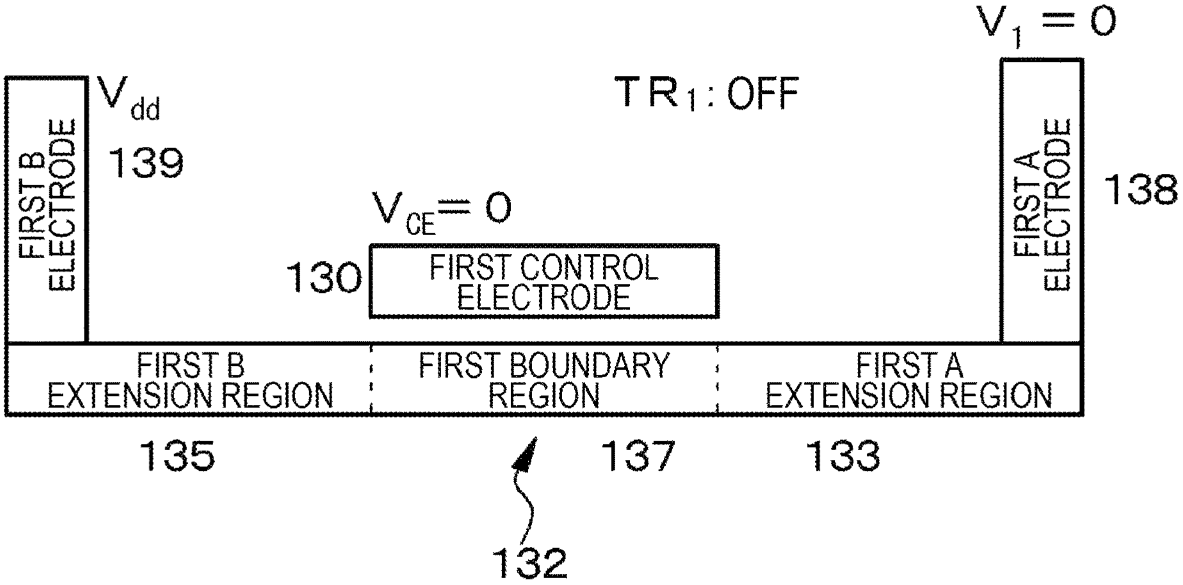
FIGS. 17A and 17B are diagrams schematically illustrating operation states of the complementary transistor of Example 4.
Figure 17B:
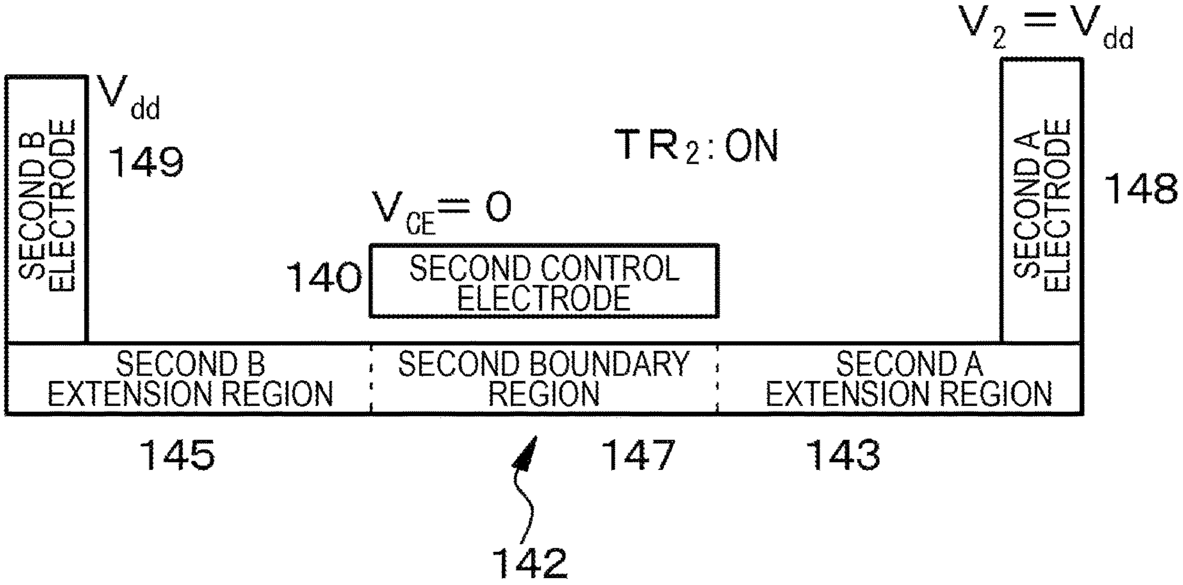
Figure 18A:
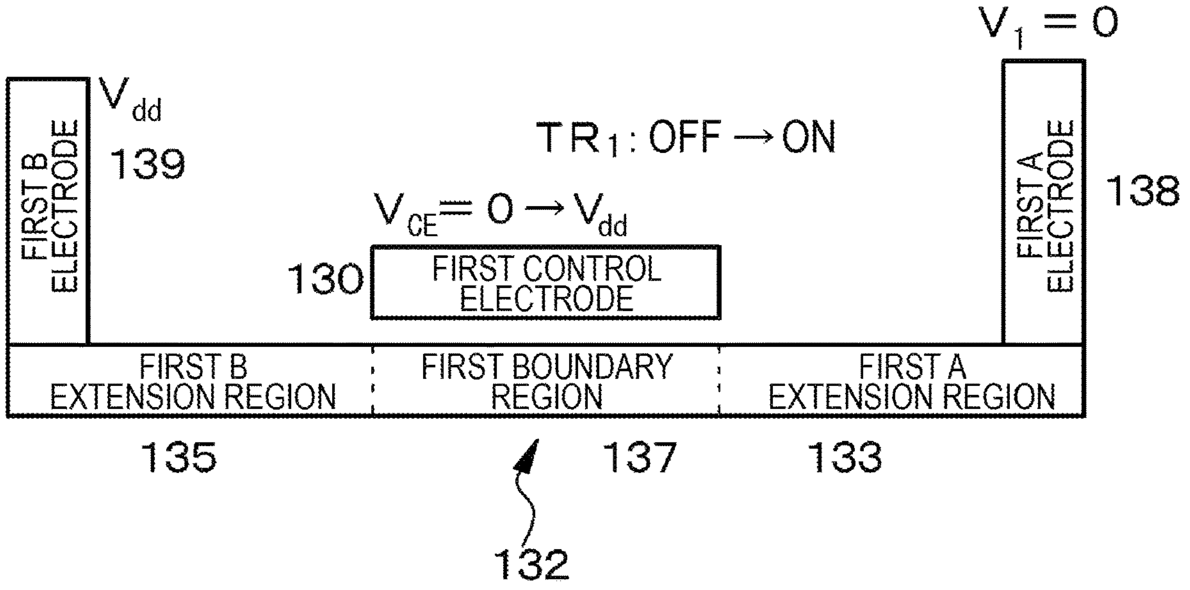
FIGS. 18A and 18B are diagrams schematically illustrating the operation states of the complementary transistor of Example 4, subsequent to FIGS. 17A and 17B.
Figure 18B:
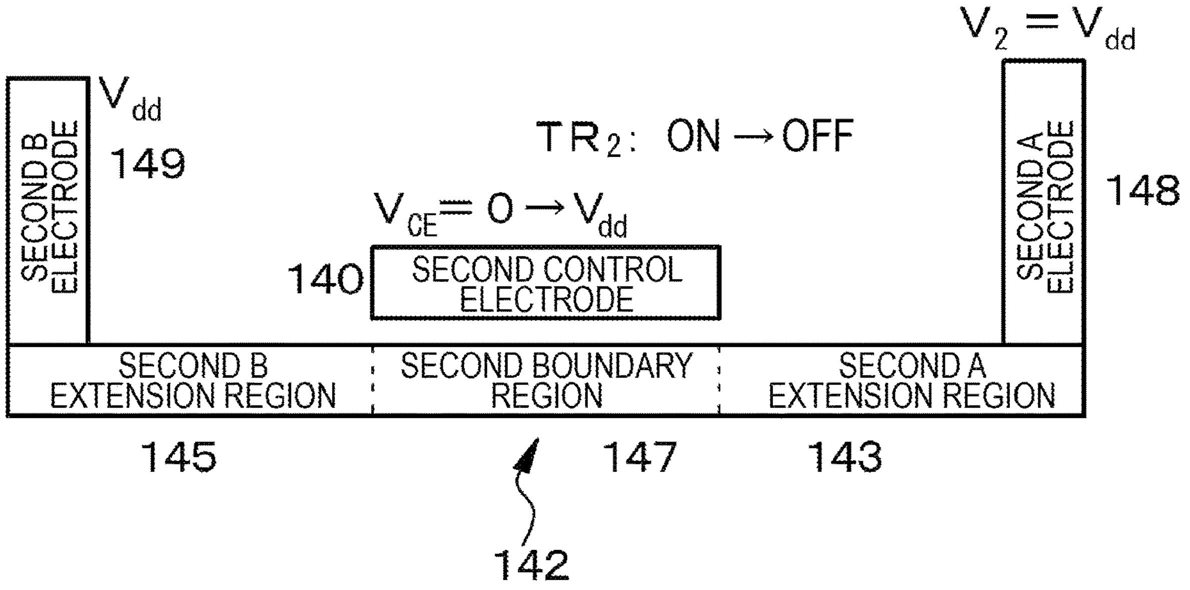
Figure 19A:
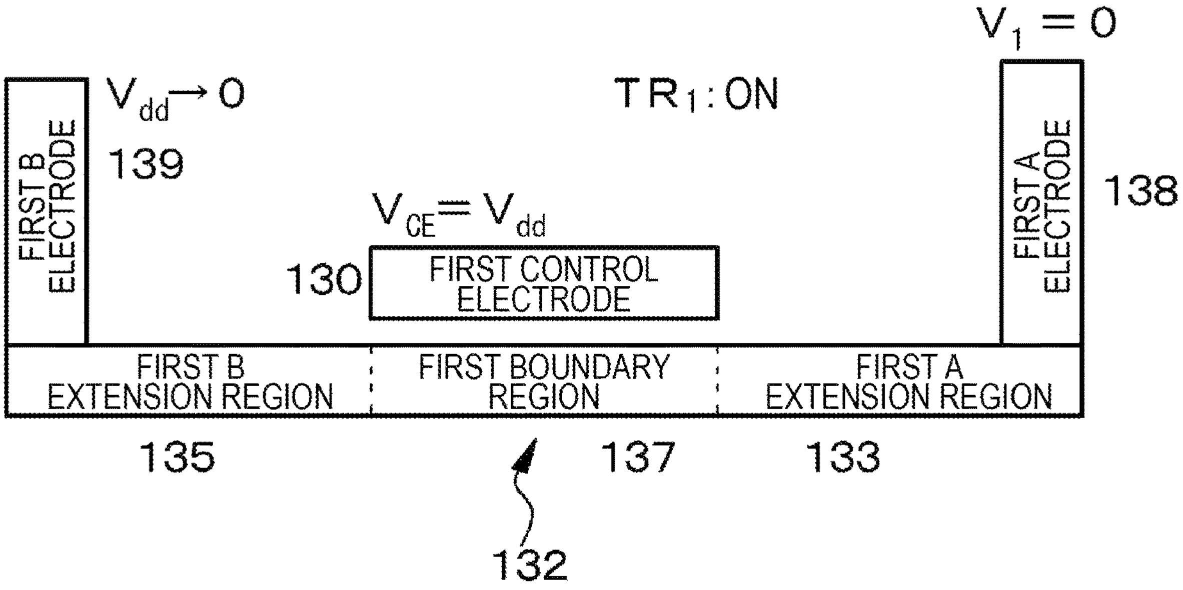
FIG. 19A and FIG. 19B are diagrams schematically illustrating the operation states of the complementary transistor of Example 4, subsequent to FIGS. 18A and 18B.
Figure 19B:
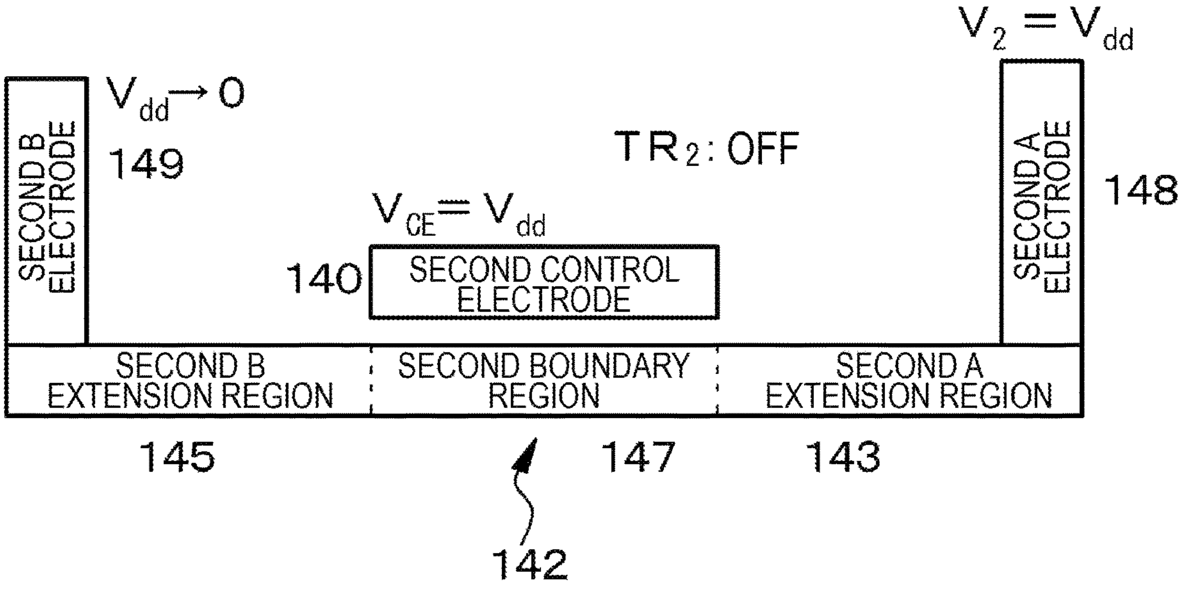
Figure 20A:
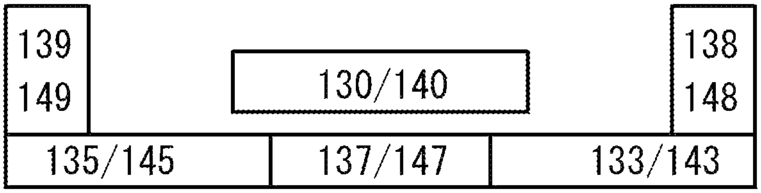
FIGS. 20A, 20B, and 20C are conceptual diagrams illustrating a positional relation between active regions and a control electrode in the complementary transistor of Example 4.
Figure 20B:
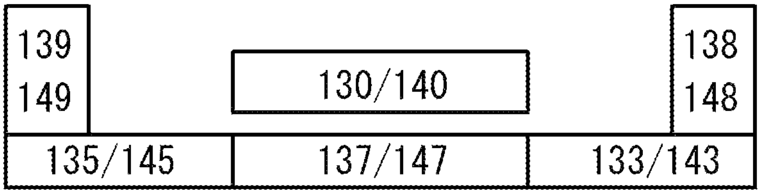
Figure 20C:
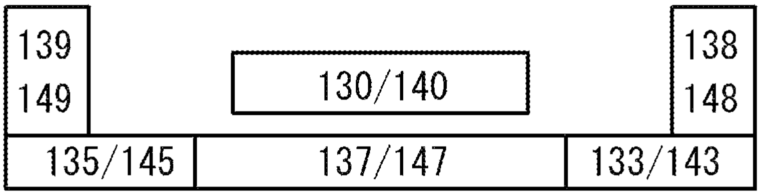

Example 4 relates to a complementary transistor according the second aspect of the present disclosure. The complementary transistor of the Example 4 also constitutes an inverter circuit. FIG. 16 illustrates a schematic partial cross-sectional view of a complementary transistor of Example 4, FIGS. 17A, 17B, 18A, 18B, 19A, and 19B schematically illustrate operation states of the complementary transistor of Example 4, and FIGS. 20A, 20B, and 20C are conceptual diagrams illustrating a positional relation between active regions and a control electrode in the complementary transistor of Example 4. Note that FIG. 17A illustrates a state in which a first transistor is in a non-conductive state (OFF state), FIG. 17B illustrates a state in which a second transistor is in a conductive state (ON state), FIG. 18A illustrates a state in which the second transistor becomes the conductive state (ON state) from the non-conductive state (OFF state), FIG. 18B illustrates a state in which the second transistor becomes the non-conductive state (OFF state) from the conductive state (ON state), FIG. 19A illustrates a state in which the first transistor is in the conductive state (ON state), and FIG. 19B illustrates a state in which the second transistor is in the non-conductive state (OFF state).

A complementary transistor 110 of Example 4 includes:

- a first transistor $TR_1$ including:
- a first control electrode 130;
- a first active region 132 located below the first control electrode 130;
- a first insulation layer 131 provided between the first control electrode 130 and the first active region 132;
- a first A extension region 133 extending from one end of the first active region 132; and
- a first B extension region 135 extending from the other end of the first active region 132; and
- a second transistor $TR_2$ including:
- a second control electrode 140
- a second active region 142 located below the second control electrode 140;
- a second insulation layer 141 provided between the second control electrode 140 and the second active region 142;
- a second A extension region 143 extending from one end of the second active region 142; and
- a second B extension region 145 extending from the other end of the second active region 142.

Additionally, a first surface region 1201 provided in a base and having a first conductivity type (specifically, n type in Example 4) corresponds to the first A extension region 133,

- the first B extension region 135 has a property as the second conductivity type different from the first conductivity type (in other words, exhibits behavior of the second conductivity type, specifically, p type or has an electron accepting property) and is provided on the first insulation region $21_1$ provided in the base,
- the first active region 132 is provided on the first insulation region $21_1$,
- a second surface region 1202 provided in the base and having the second conductivity type (specifically p type in Example 4) corresponds to the second A extension region 143,
- the second B extension region 145 has a property as the first conductivity type (in other words, exhibits behavior of the first conductivity type, specifically, n type or has an electron donating property) and is provided on the second insulation region $21_2$ provided on the base, and
- the second active region 142 is provided on the second insulation region $21_2$.

Additionally, the semiconductor device of Example 4 (semiconductor device or semiconductor element) includes: the complementary transistor of Example 4 in which the base is constituted of a silicon semiconductor substrate; and a field effect transistor formed in the silicon semiconductor substrate.

The first transistor $TR_1$ further includes: a first A electrode 138 connected to the first A extension region 133; and a first B electrode 139 connected to the first B extension region 135, and the second transistor $TR_2$ further includes: a second A electrode 148 connected to the second A extension region 143; and a second B electrode 149 connected to the second B extension region 145. Here, the first B extension region 135 is constituted of a two-dimensional material or graphene, and the second B extension region 145 is also constituted of a two-dimensional material or graphene. Specifically, the two-dimensional material includes one kind of two-dimensional material selected from a group consisting of $MoS_2$, $MoSe_2$, $MoTe_2$, $WS_2$, $WSe_2$, $WTe_2$, $ZrS_2$, $ZrSe_2$, $ZrTe_2$, $HfS_2$, $HfSe_2$, and $HfTe_2$. The base is constituted of a semiconductor substrate or silicon (Si), specifically, the silicon semiconductor substrate 20, and the first B extension region 135 is constituted of $WTe_2$ (with a thickness equivalent to, for example, a thickness of five atomic layers of $WTe_2$), and the second B extension region 145 is constituted of $HfTe_2$ (with a thickness equivalent to, for example, a thickness of five atomic layers of $HfTe_2$). Additionally, each of the first insulation region $21_1$ and the second insulation region $21_2$ is constituted of an element isolation region 21 provided on the silicon semiconductor substrate 20 and constituted of $SiO_2$. The first control electrode 130, second control electrode 140, first insulation layer 131, second insulation layer 141, first A electrode 138, second A electrode 148, first B electrode 139, second B electrode 149, and interlayer insulation layer 22 are constituted of materials similar to those described in Example 1.

In the complementary transistor of the Example 4, a first boundary region 137 (corresponding to first active region 132) is formed between the first A extension region 133 and the first B extension region 135, and a second A boundary region 147 (corresponding to second active region 142) is formed between the extension region 143 and the second B extension region 145. The first boundary region 137 (first active region 132) is an intrinsic active region, specifically, constituted of $WTe_2$ with a thickness of 3 nm. Additionally, the second boundary region 147 (second active region 142) is also an intrinsic active region, specifically, constituted of $HfTe_2$ with a thickness of 3 nm. Note that an end surface of the first A extension region 133 may contact an end surface of the first B extension region 135, or an end surface of the second A extension region 143 may contact an end surface of the second B extension region 145. In other words, a contact portion between the end surface of the first A extension region 133 and the end surface of the first B extension region 135 can constitute the first active region 132, and a contact portion between the end surface of the extension region 143 and the end surface of the second B extension region 145 can constitute the second active region 142 without providing the first boundary region 137 and the second boundary region 147.

Since operation of the complementary transistor of the Example 4 can be similar to operation of the complementary transistor of Example 1, a detailed description thereof will be omitted.

In the complementary transistor of Example 4, the first active region 132 (first boundary region 137) and the first control electrode 130 overlap each other, but an orthogonal projection image of the first active region 132 (first boundary region 137) may be included in an orthogonal projection image of the first control electrode 130 (refer to FIG. 20A), may coincide with the orthogonal projection image of the first control electrode 130 (refer to FIG. 20B), or may protrude from the orthogonal projection image of the first control electrode 130 (refer to FIG. 20C). Similarly, the second active region 142 (second boundary region 147) and the second control electrode 140 overlap with each other in an overlap region, but an orthogonal projection image of the second active region 142 (second boundary region 147) may be included in an orthogonal projection image of the second control electrode 140 (refer to FIG. 20A), may coincide with the orthogonal projection image of the second control electrode 140 (refer to FIG. 20B), or may protrude from the orthogonal projection image of the second control electrode 140 (refer to FIG. 20C). Note that it is desirable that the orthogonal projection image of the first active region 132 and that of second active region 142 be included in the orthogonal projection image of the first control electrode 130 and that of the second control electrode 140 respectively from the viewpoint that an electric field generated by each of the first control electrode 130 and the second control electrode 140 is more uniformly applied.

Figure 21A:
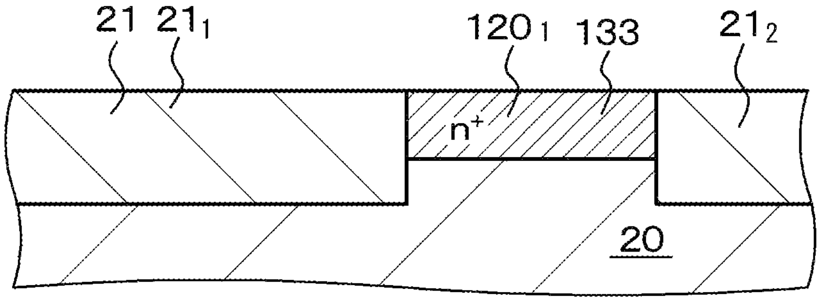
FIGS. 21A, 21B, and 21C are schematic partial cross-sectional views of a silicon semiconductor substrate and the like to describe an outline of a manufacturing method for a first transistor in the complementary transistor of Example 4.
Figure 21B:
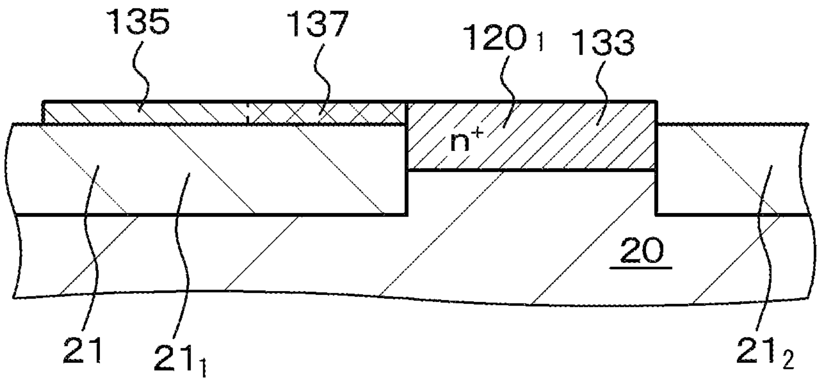
Figure 21C:
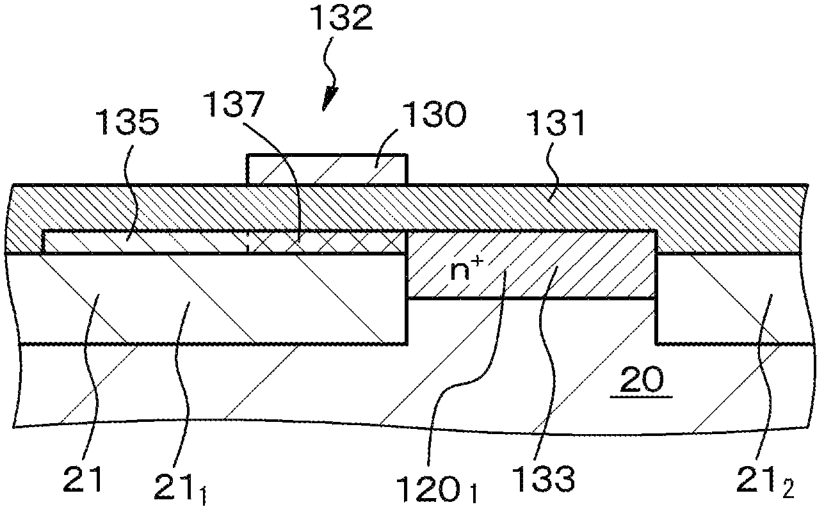

Hereinafter, for example, an outline of a manufacturing method for the first transistor in the complementary transistor of Example 4 will be described with reference to FIGS. 21A, 21B, and 21C.

[Step-400]

In other words, the element isolation regions 21 are formed in the silicon semiconductor substrate 20 on the basis of a known method. Then, the first surface region 1201 (first A extension region 133) having the first conductivity type (specifically, n type) is formed on a surface in a region of the silicon semiconductor substrate 20 surrounded by the element isolation regions 21 on the basis of ion implantation method (refer to FIG. 21A).

[Step-410]

Next, $WTe_2$ is formed on the first insulation region (element isolation region) $21_1$ by the CVD method after removing a top surface of the first insulation region (element isolation region) $21_1$ to some extent, and subsequently the first B extension region 135 and the first boundary region 137 can be obtained by performing patterning into a desired shape. After that, the first B extension region 135 is formed on the basis of the chemical doping method (refer to FIG. 21B). Note that a mask layer may be formed in order to prevent an undesired region from being doped at the time of performing the chemical doping method.

[Step-420]

Next, the first insulation layer 131 is formed on the entire surface. Then, the first control electrode 130 is formed on the first insulation layer 131 (refer to FIG. 21C). After that, the interlayer insulation layer 22 is formed on the entire surface, an opened portion is formed in the interlayer insulation layer 22 located above the first A extension region 133, and the first A electrode 138 can be formed over the top surface of the interlayer insulation layer 22 by filling the opened portion with a conductive material. On the other hand, an opened portion is formed in the interlayer insulation layer 22 located above the first B extension region 135, and the first B electrode 139 can be formed over the top surface of the interlayer insulation layer 22 by filling the opened portion with a conductive material.

The second transistor $TR_2$ can also be formed by a substantially similar method. Then, the complementary transistor illustrated in FIG. 16 can be thus obtained.

Even in the complementary transistor of the Example 4, since the first A extension region 133 and the second A extension region 143 are formed in the surface region of the base, the number of kinds of materials constituting the active regions and the like of the complementary transistor may be three at maximum, and the number of kinds of two-dimensional materials (2D materials) may be two, and therefore, the number of kinds of constituent materials such as the active regions of complementary transistors can be reduced.

Example 5

Figure 24:
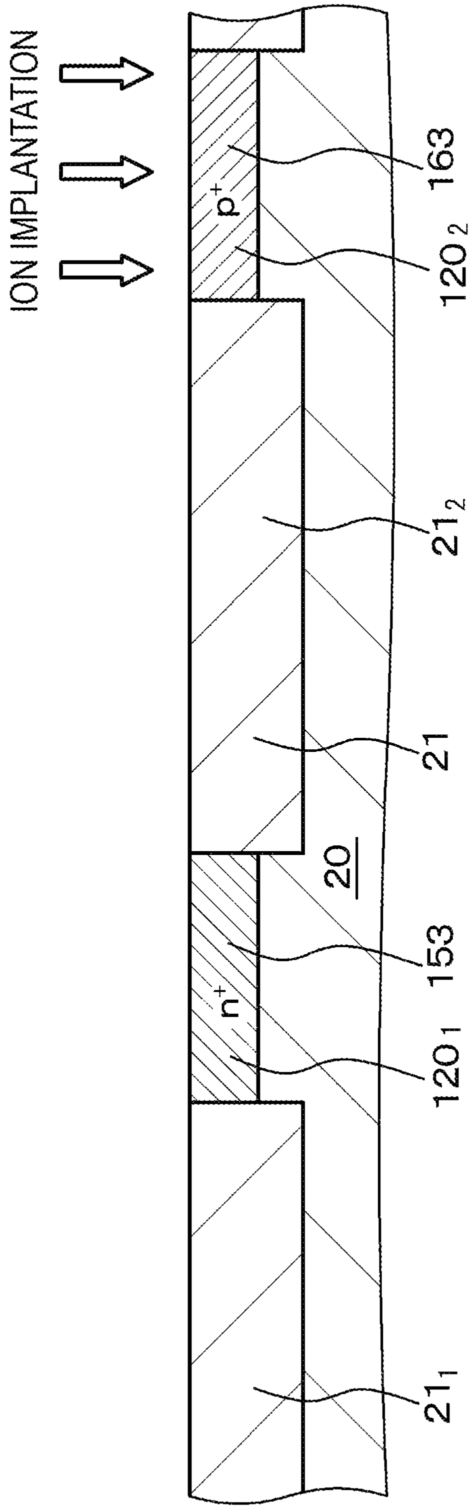
FIG. 24 is a schematic partial cross-sectional view of the silicon semiconductor substrate and the like to describe the outline of the manufacturing method for the complementary transistor of Example 5, subsequent to FIG. 23B.

Example 5 is a modification of Example 4. In a complementary transistor of Example 5, as illustrated in a schematic partial end view of the complementary transistor of Example 5 in course of manufacture in FIG. 24,

- a first A extension region 153 and a second A extension region 163 are constituted of different materials, and
- the first B extension region 135 and the second B extension region 145 are constituted of the same material. In other words, the complementary transistor of Example 5 is constituted of only one kind of two-dimensional material (2D material), one kind of semiconductor layer, and one kind of semiconductor substrate, and the number of kinds of constituent materials (particularly, two-dimensional material) for the active regions and the like of the complementary transistor can be reduced, and the manufacturing process can be simplified.

Additionally, a difference between a value [$E_C$(N)] of a valence band of the material constituting the first A extension region 153 and a value [$E_V$(2D)] of a conduction band of the material constituting the first B extension region 135 Is 1 eV or less, and

- a difference between a value [$E_V$(P)] of a conduction band of the material constituting the second A extension region 135 and a value [$E_C$(2D)] of a valence band of the material constituting the second B extension region 145 is 1 eV or less. In other words, $$Ev(P) - Ec(2D) \leq 1(\text{eV}) \text{ and}$$

-continued $$Ev(2D) - Ec(N) \leq 1(\text{eV})$$

are satisfied.

Specifically,

- the first A extension region 153 is constituted of the silicon semiconductor substrate 20,
- the second A extension region 163 is constituted of the semiconductor layer (specifically, germanium layer) 127A formed in the silicon semiconductor substrate 20, and
- the first B extension region 135 and the second B extension region 145 are constituted of the same two-dimensional material (specifically, $MoTe_2$).

Hereinafter, an outline of a manufacturing method for the complementary transistor of the Example 5 will be described with reference to FIGS. 22A, 22B, 23A, 23B, and 24.

[Step-500A]

Figure 22A:
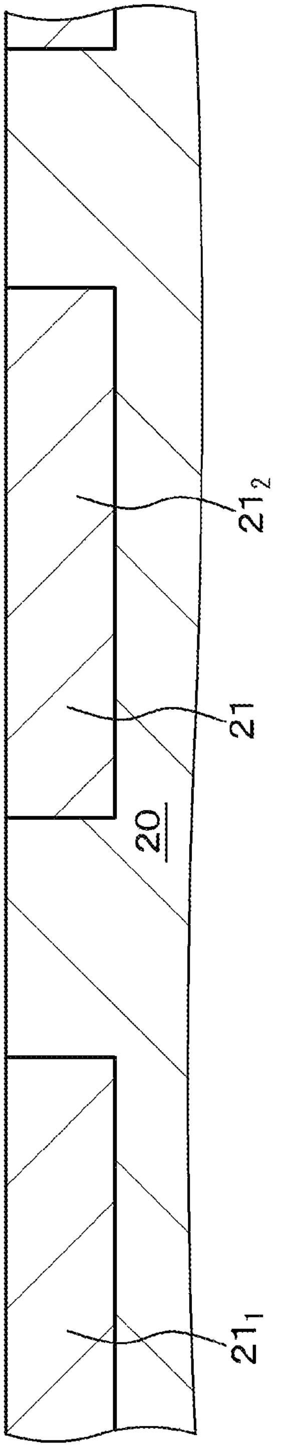
FIGS. 22A and 22B are schematic partial cross-sectional views of a silicon semiconductor substrate and the like to describe an outline of a manufacturing method for a complementary transistor of Example 5.
Figure 22B:
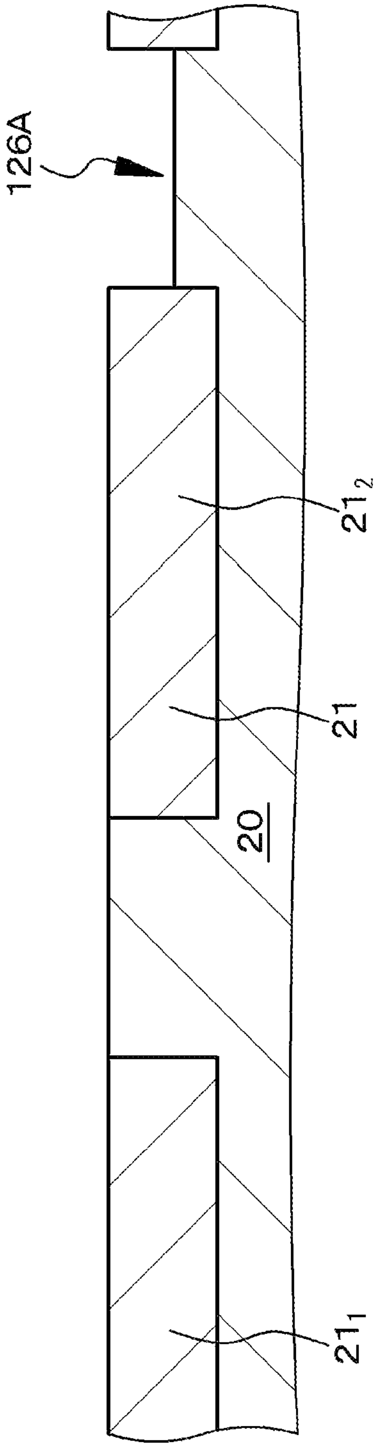

In other words, the element isolation regions 21 ($21_1$ and $21_2$) are formed in the silicon semiconductor substrate 20 on the basis of a known method (refer to FIG. 22A). Then, a recessed portion 126A is formed by etching a region of the silicon semiconductor substrate 20 surrounded by the element isolation regions 21, namely, a region of the silicon semiconductor substrate 20 where the second transistor $TR_2$ is to be formed (refer to FIG. 22B).

[Step-510A]

Figure 23A:
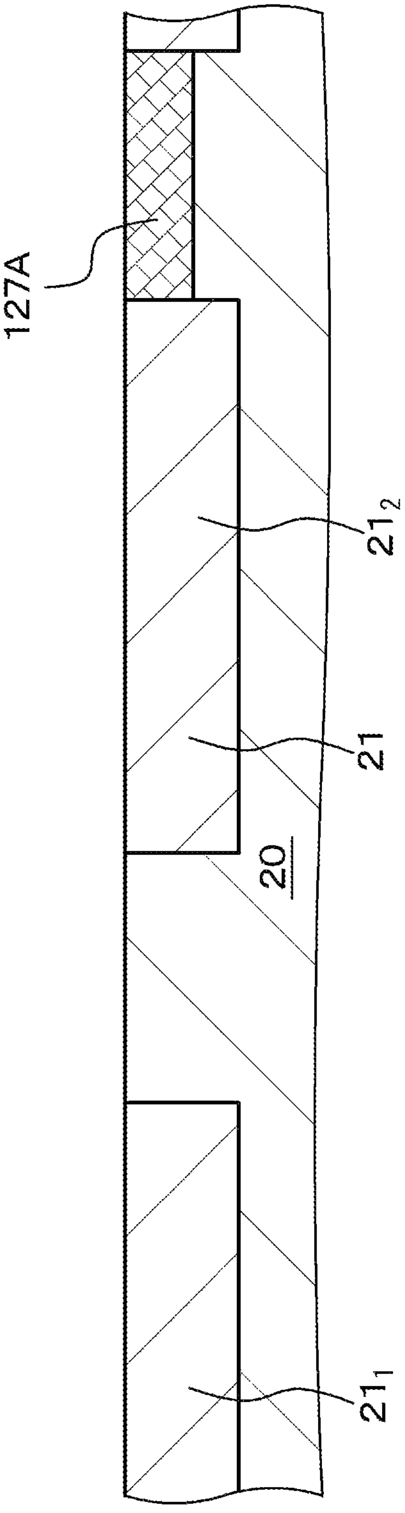
FIGS. 23A and 23B are schematic partial cross-sectional views of the silicon semiconductor substrate and the like to describe the outline of the manufacturing method for the complementary transistor of Example 5, subsequent to FIG. 22B.
Figure 23B:
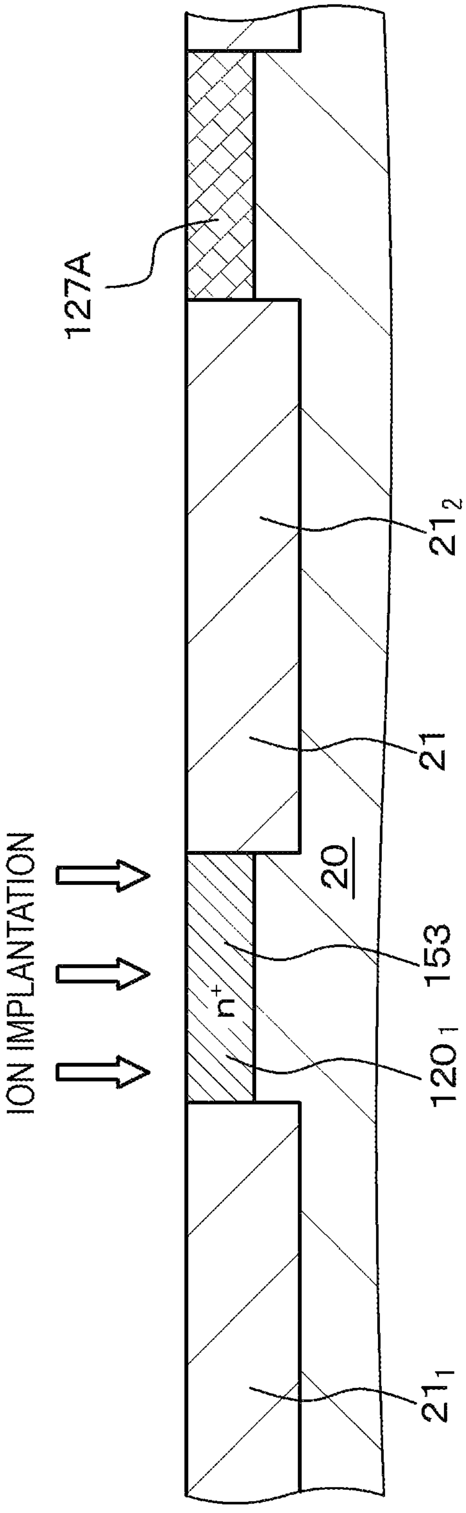

Next, a desired region is covered with a mask layer (not illustrated), and the recessed portion 126A is filled with a germanium (Ge) layer 127A that is a semiconductor layer on the basis of the epitaxial growth method (refer to FIG. 23A).

[Step-520A]

Then, ion implantation is applied to the region of the silicon semiconductor substrate 20 where the first transistor $TR_1$ is to be formed. Consequently, the first surface region 1201 (first A extension region 153) having the first conductivity type (specifically, n type) can be formed on the surface in the region of the silicon semiconductor substrate 20 surrounded by the element isolation regions 21 (refer to FIG. 23B).

Furthermore, ion implantation is applied to the region of the germanium layer 127A where the second transistor $TR_2$ is to be formed. Consequently, the second surface region 1202 (second A extension region 163) having the second conductivity type (specifically, p type) can be formed in the germanium layer 127A surrounded by the element isolation regions 21 (refer to FIG. 24).

[Step-530A]

After that, the first transistor $TR_1$ and the second transistor $TR_2$ can be obtained by constituting the first B extension region 135 and the first B extension region 145 of $MoTe_2$ also in a method similar to the method described in Example 4. Thus, the complementary transistor similar to that illustrated in FIG. 16 can be obtained.

Figure 26A:
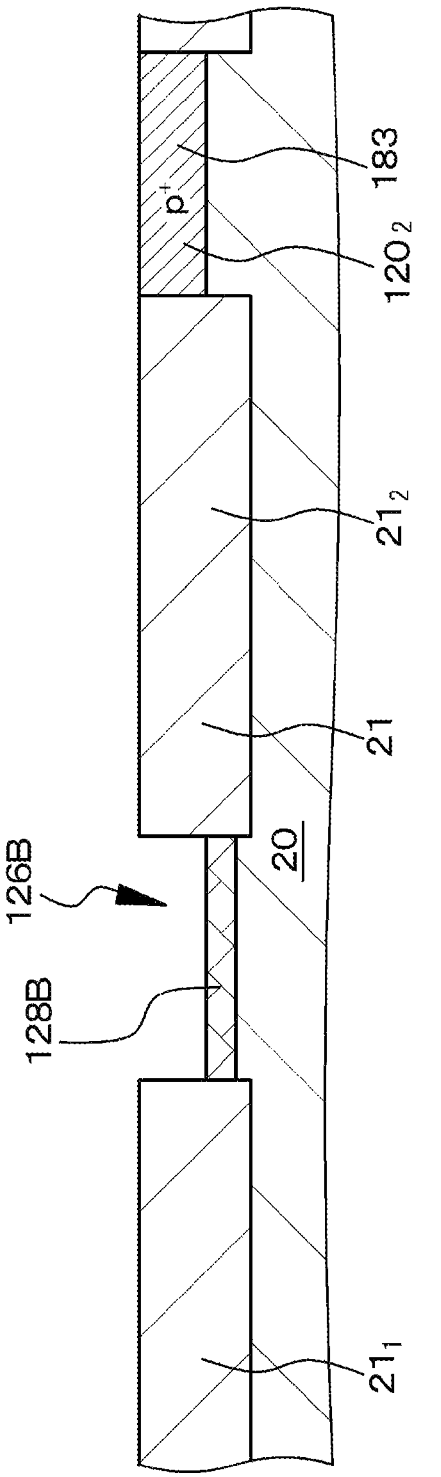
FIGS. 26A and 26B are schematic partial cross-sectional views of the silicon semiconductor substrate and the like to describe the outline of the manufacturing method for the complementary transistor of the first modified example of Example 5, subsequent to FIG. 25B.
Figure 26B:
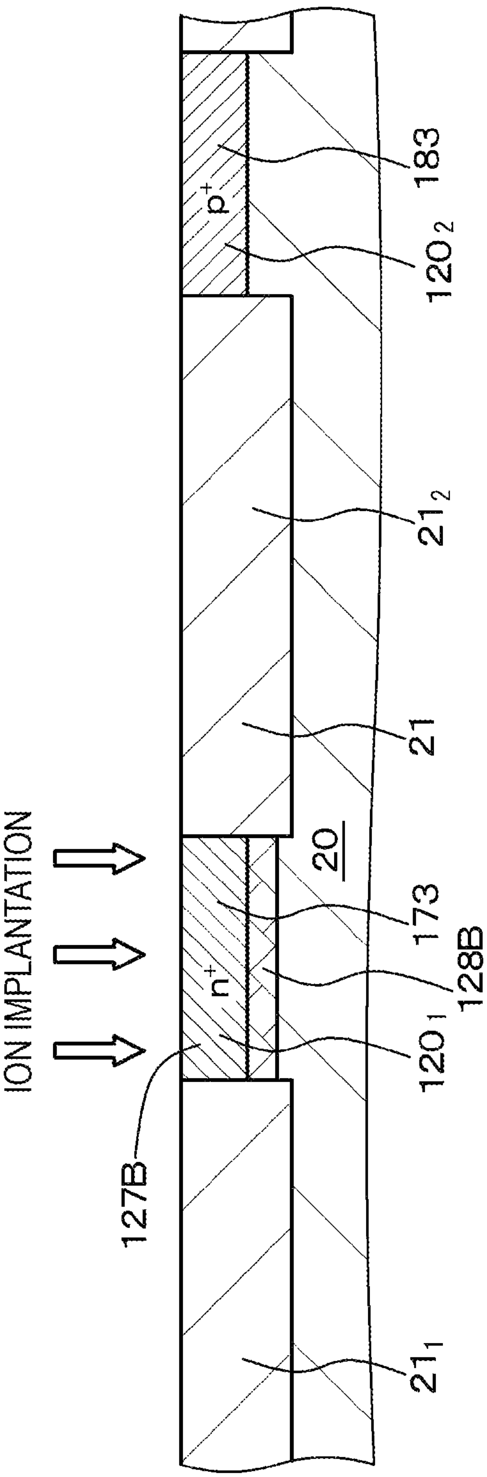

Alternatively, in a first modified example of Example 5, as illustrated in a schematic partial end view of the complementary transistor of the first modified example of Example 5 in course of manufacture in FIG. 26B,

- a first A extension region 173 is constituted of a semiconductor layer (specifically, indium arsenide layer) 127B formed in the silicon semiconductor substrate 20,
- a second A extension region 183 is constituted of the silicon semiconductor substrate 20, and
- the first B extension region 135 and the second B extension region 145 are constituted of the same two-dimensional material (specifically, $MoS_2$).

Hereinafter, an outline of a manufacturing method for the complementary transistor of the first modified example of Example 5 will be described with reference to FIGS. 25A, 25B, 26A, and 26B.

[Step-500B]

In other words, the element isolation regions 21 ($21_1$ and $21_2$) are formed in the silicon semiconductor substrate 20 on the basis of a known method. Then, ion implantation is applied to a region of the silicon semiconductor substrate 20 surrounded by the element isolation regions 21, namely, a region of the silicon semiconductor substrate 20 where the second transistor $TR_2$ is to be formed. Consequently, the second extension region 183 having the second conductivity type (specifically, p type) can be formed on the surface in the region of the silicon semiconductor substrate 20 surrounded by the element isolation regions 21 (refer to FIG. 25A).

[Step-510B]

Figure 25A:
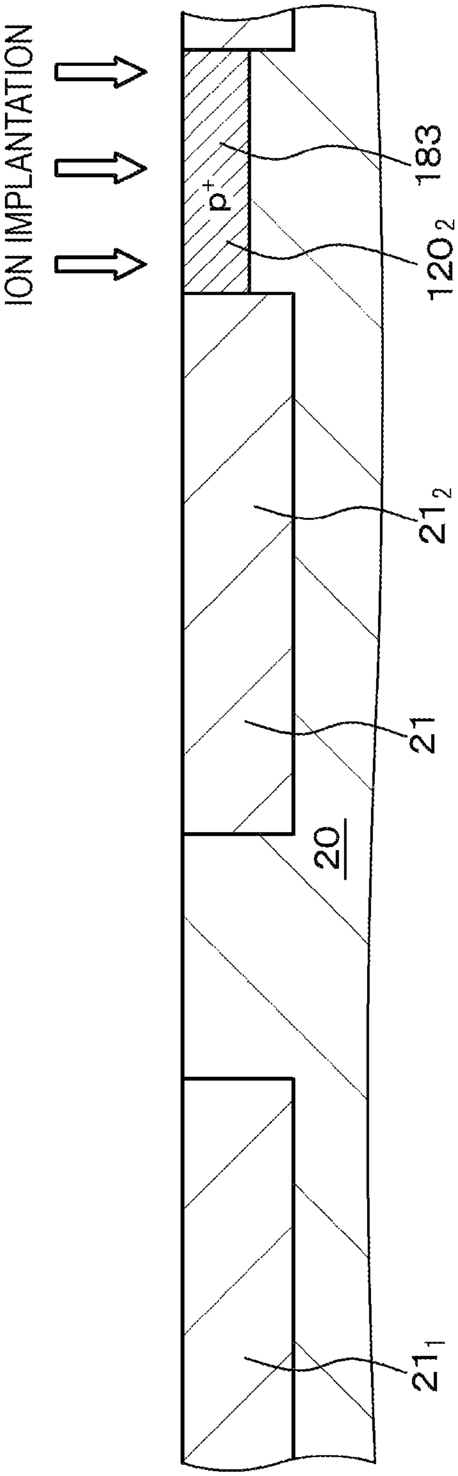
FIGS. 25A and 25B are schematic partial cross-sectional views of a silicon semiconductor substrate and the like to describe an outline of a manufacturing method for a complementary transistor of a first modified example of the Example 5.
Figure 25B:
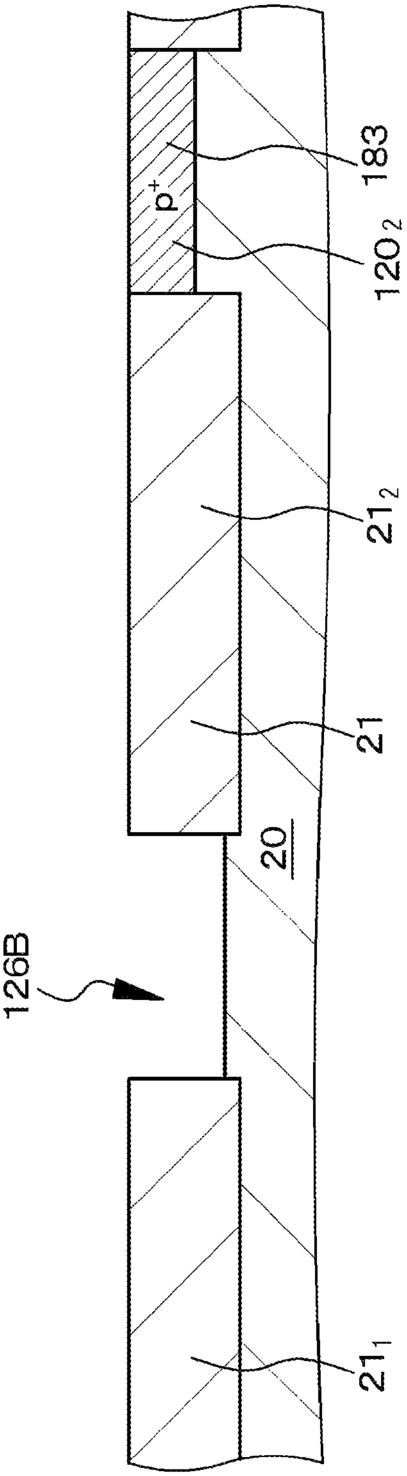

Next, a recessed portion 126B is formed by etching a region of the silicon semiconductor substrate 20 surrounded by the element isolation regions 21, namely, a region of the silicon semiconductor substrate 20 where the first transistor $TR_1$ is to be formed (refer to FIG. 25B).

[Step-520B]

After that, a desired region is covered with a mask layer (not illustrated), and a buffer layer 128B constituted of InP is formed on a bottom portion of the recessed portion 126B on the basis of the epitaxial growth method (refer to FIG. 26A). Then, an InAs layer 127B as a semiconductor layer is further formed by the epitaxial growth method. Next, ion implantation is applied to the region of the silicon semiconductor substrate 20 where the first transistor $TR_1$ is to be formed. Consequently, the second extension region 173 having the first conductivity type (specifically, n type) can be formed on the surface in the region of the silicon semiconductor substrate 20 surrounded by the element isolation regions 21 (refer to FIG. 26B).

[Step-530B]

After that, the first transistor $TR_1$ and the second transistor $TR_2$ can be obtained by constituting the first B extension region 135 and the first B extension region 145 of $MoS_2$ in a method similar to the method described in Example 4. Thus, the complementary transistor similar to that illustrated in FIG. 16 can be obtained.

Figure 28:
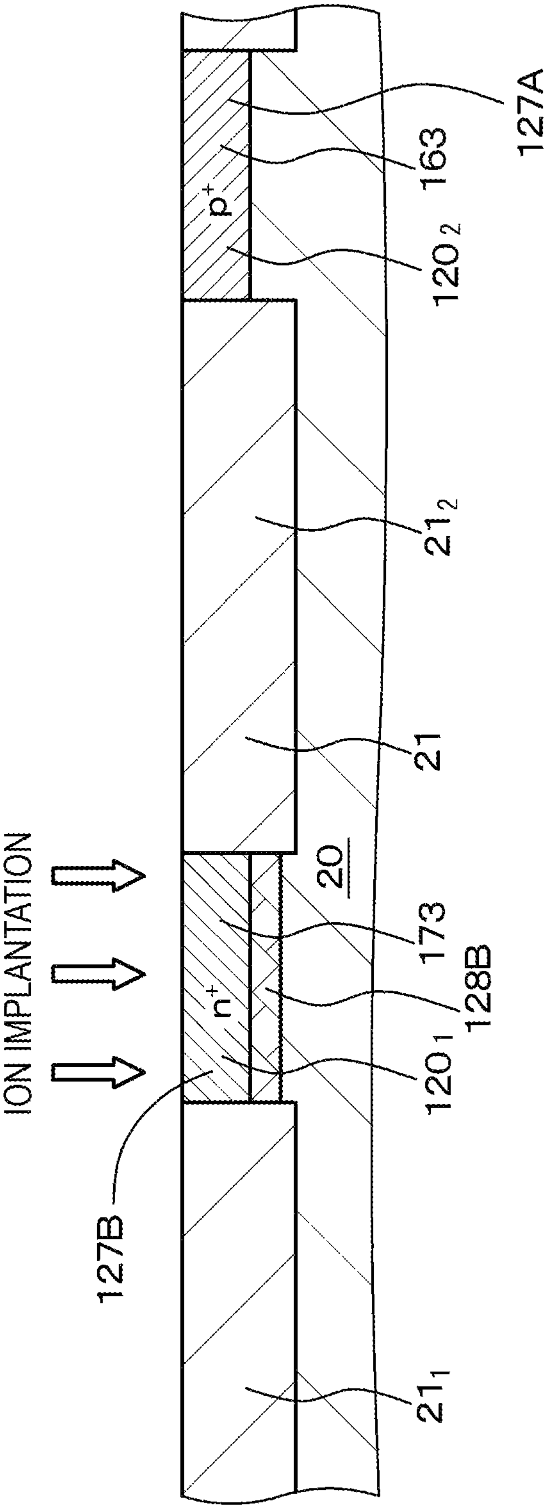
FIG. 28 is a schematic partial cross-sectional view of the silicon semiconductor substrate and the like to describe the outline of the manufacturing method for the complementary transistor of the second modified example of Example 5, subsequent to FIG. 27B.

Alternatively, in a second modified example of Example 5, as illustrated in a schematic partial end view of the complementary transistor of the second modified example of Example 5 in course of manufacture in FIG. 28,

- the first A extension region 173 is constituted of a first semiconductor layer (specifically, indium arsenide layer) 127B formed in the semiconductor substrate 20,
- the second A extension region 163 is constituted of a second semiconductor layer (specifically, germanium layer) 127A formed in the semiconductor substrate 20, and
- the first B extension region 135 and the second B extension region 145 are constituted of the same two-dimensional material (specifically, $MoS_2$).

Figure 27A:
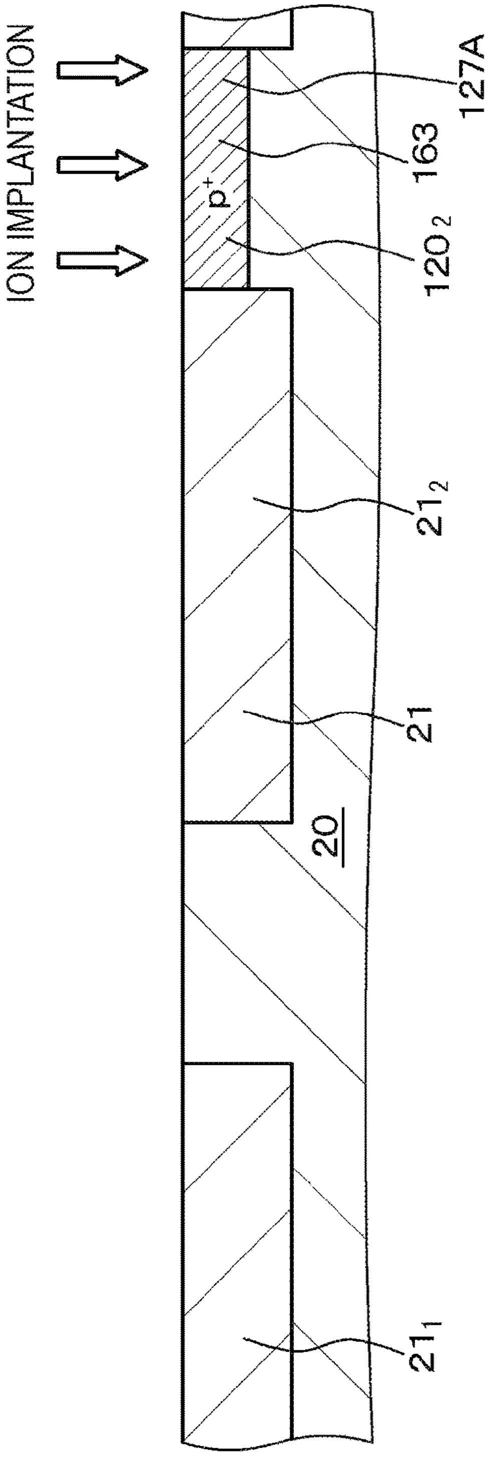
FIGS. 27A and 27B are schematic partial cross-sectional views of a silicon semiconductor substrate and the like to describe an outline of a manufacturing method for a complementary transistor of a second modified example of the Example 5.

Hereinafter, an outline of a manufacturing method for the complementary transistor of the second modified example of Example 2 will be described with reference to FIGS. 27A, 27B, and 28.

[Step-500C]

In other words, similar to Example 5, the element isolation regions 21 ($21_1$ and $21_2$) are formed in the silicon semiconductor substrate 20 on the basis of the known method. Then, the recessed portion 126A is formed by etching the region of the silicon semiconductor substrate 20 surrounded by the element isolation regions 21, namely, the region of the silicon semiconductor substrate 20 where the second transistor $TR_2$ is to be formed (refer to FIGS. 22A and 22B). Next, a desired region is covered with a mask layer (not illustrated), and the recessed portion 126A is filled with the germanium (Ge) layer 127A that is a semiconductor layer on the basis of the epitaxial growth method (refer to FIG. 23A). Then, ion implantation is applied to the region of the silicon semiconductor substrate 20 where the second transistor $TR_2$ is to be formed. Consequently, the second A extension region 163 can be formed in the germanium layer 127A surrounded by the element isolation regions 21 (refer to FIG. 27A).

[Step-510C]

Next, the recessed portion 126B is formed by etching a region of the silicon semiconductor substrate 20 surrounded by the element isolation regions 21, namely, a region of the silicon semiconductor substrate 20 where the first transistor $TR_1$ is to be formed.

[Step-520C]

Figure 27B:
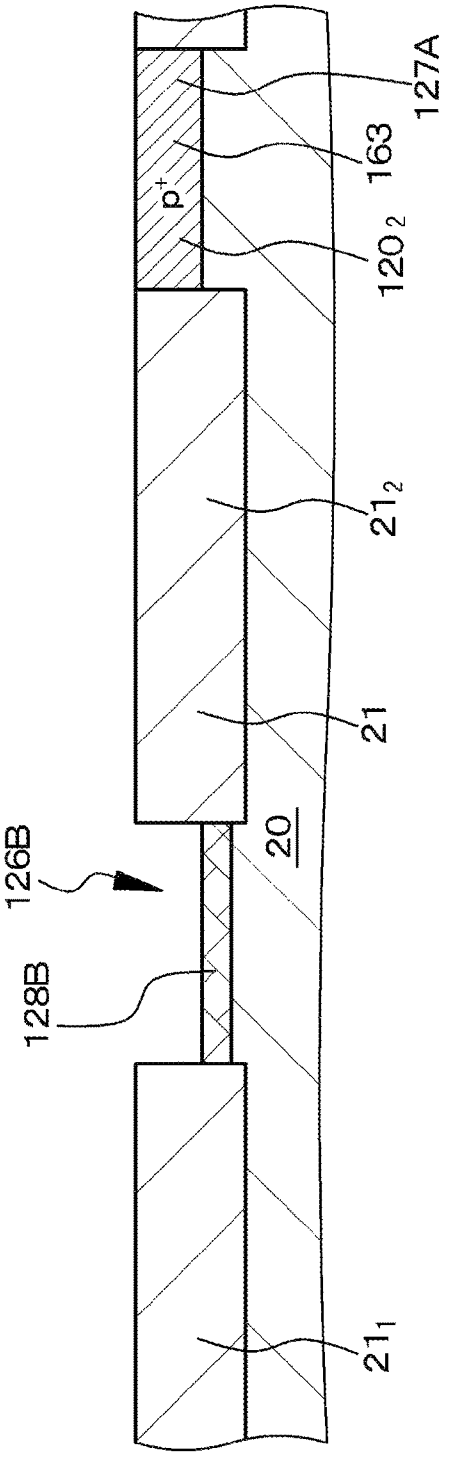

After that, a desired region is covered with a mask layer (not illustrated), and the buffer layer 128B constituted of InP is formed on a bottom portion of the recessed portion 126B on the basis of the epitaxial growth method (refer to FIG. 27B). Then, an InAs layer 127B as a semiconductor layer is further formed by the epitaxial growth method. Next, ion implantation is applied to the region of the silicon semiconductor substrate 20 where the first transistor $TR_1$ is to be formed. Consequently, the second extension region 173 having the first conductivity type (specifically, n type) can be formed on the surface in the region of the silicon semiconductor substrate 20 surrounded by the element isolation regions 21 (refer to FIG. 28).

[Step-530C]

Next, the first transistor $TR_1$ and the second transistor $TR_2$ can be obtained by constituting the first B extension region 135 and the first B extension region 145 of $MoS_2$ also in a method similar to the method described in Example 4. Thus, the complementary transistor similar to that illustrated in FIG. 16 can be obtained.

Alternatively, more specifically, the first A extension region 173 is constituted of the silicon semiconductor substrate 20,

- the second A extension region 163 is constituted of the germanium layer 127A formed in the silicon semiconductor substrate 20, and
- the first B extension region 135 and the second B extension region 145 are constituted of $MoS_2$.

Alternatively, more specifically, the first A extension region 173 is constituted of the indium arsenide layer 127B formed in the silicon semiconductor substrate 20,

- the second A extension region 163 is constituted of the silicon semiconductor substrate 20, and
- the first B extension region 135 and the second B extension region 145 are constituted of $MoS_2$.

Example 6

Example 6 is a modification of Example 4. In a complementary transistor of Example 6,

- the first A extension region and the second A extension region are constituted of different materials, and
- the first B extension region and the second B extension region are constituted of different materials.

Specifically, the first A extension region 153 is constituted of the silicon semiconductor substrate 20, the second A extension region 163 is constituted of the germanium layer 127A formed in the silicon semiconductor substrate 20, the first B extension region 135 is constituted of $MoTe_2$, and the second B extension region 145 is constituted of $MoS_2$.

Alternatively, specifically, the first A extension region 173 is constituted of the indium arsenide layer 127B formed in the silicon semiconductor substrate 20, the second A extension region 163 is constituted of the silicon semiconductor substrate 20, and the first B extension region 135 is constituted of $MoTe_2$, and the second B extension region 145 is constituted of $MoS_2$.

Alternatively, specifically, the first A extension region 173 is constituted of the indium arsenide layer 127B formed in the silicon semiconductor substrate 20, the second A extension region 163 is constituted of the germanium layer 127A formed in the silicon semiconductor substrate 20, and the first B extension region 135 is constituted of $MoTe_2$, and the second B extension region 145 is constituted of $MoS_2$.

A forming method for the first A extension regions 153 and 173 and the second A extension regions 163 and 183 in Example 6 can be a method similar to the method described in the Example 5, and furthermore, the first transistor $TR_1$ and the second transistor $TR_2$ can be obtained by a method similar to the method described in the Example 4. Thus, the complementary transistor similar to that illustrated in FIG. 16 can be obtained.

Example 7

Example 7 is a modification of Examples 1 to 6 and relates to a logic circuit constituted of the complementary transistors described in Examples 1 to 6.

Figure 29:
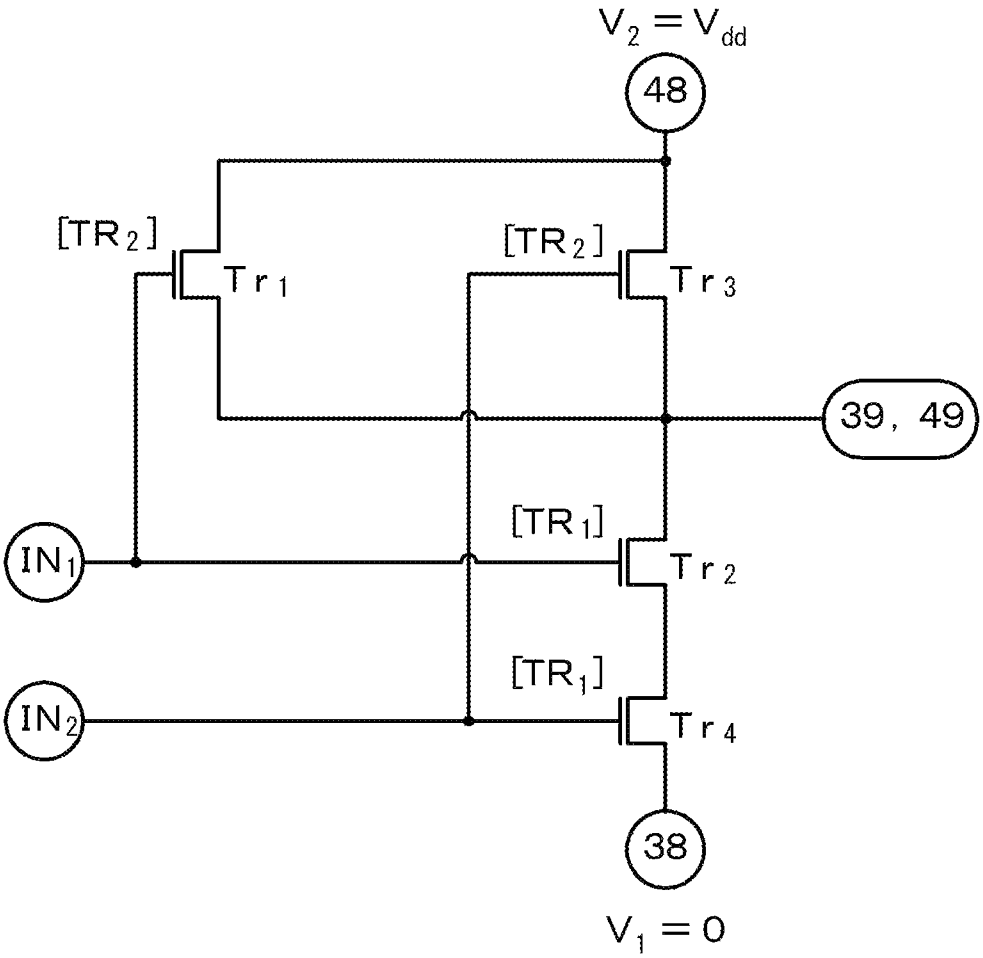
FIG. 29 is an equivalent circuit diagram of a NAND circuit formed on the basis of the complementary transistors of Examples 1 to 6.

FIG. 29 illustrates an equivalent circuit diagram of a NAND circuit formed on the basis of the complementary transistors of Examples 1 to 6. The NAND circuit is constituted of four transistors $Tr_1$, $Tr_2$, $Tr_3$, and $Tr_4$. Here, the first transistor $Tr_1$ and the third transistor $Tr_3$ are constituted of the second transistor $TR_2$ in the complementary transistors of Examples 1 to 6. Additionally, the second transistor $Tr_2$ and the fourth transistor $Tr_4$ are constituted of the first transistors $TR_1$ in the complementary transistors of Examples 1 to 6.

Figure 30:
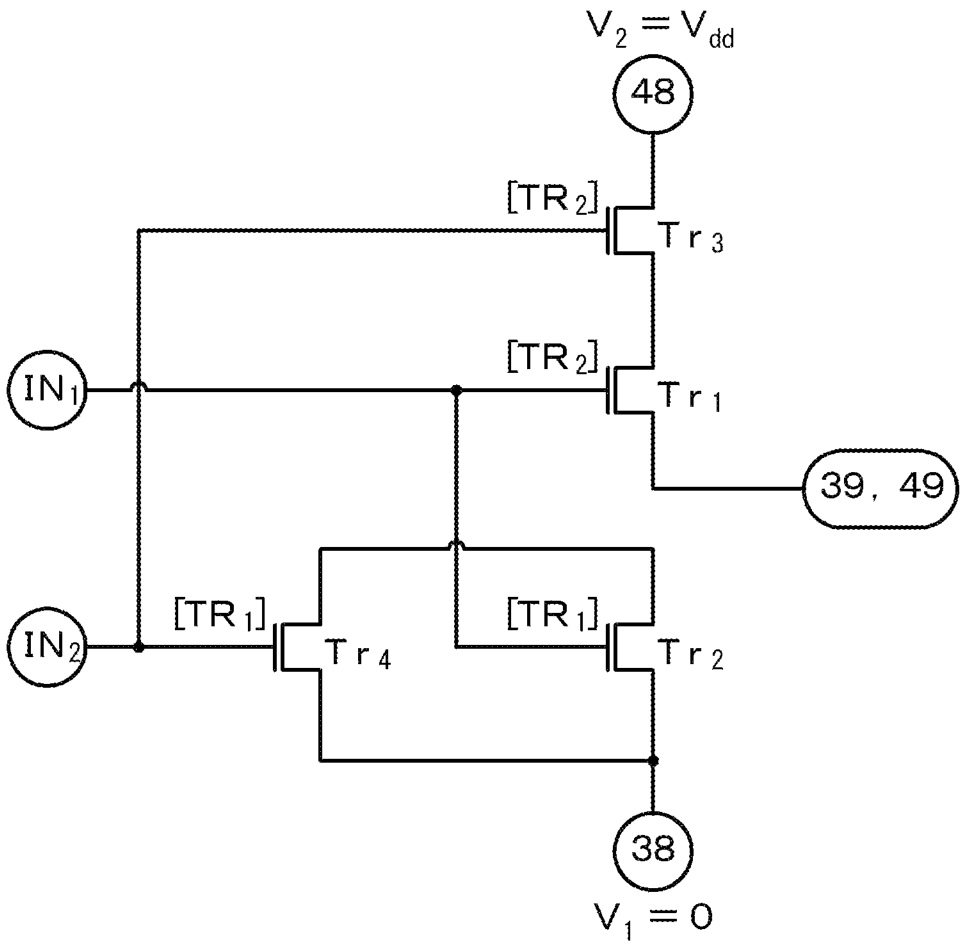
FIG. 30 is an equivalent circuit diagram of a NOR circuit formed on the basis of the complementary transistors of the Examples 1 to 6.

FIG. 30 illustrates an equivalent circuit diagram of a NOR circuit formed on the basis of the complementary transistors of Examples 1 to 6. The NOR circuit is also constituted of four transistors $Tr_1$, $Tr_2$, $Tr_3$, and $Tr_4$. Here, the first transistor $Tr_1$ and the third transistor $Tr_3$ are constituted of the second transistor $TR_2$ in the complementary transistors of Examples 1 to 6. Additionally, the second transistor $Tr_2$ and the fourth transistor $Tr_4$ are constituted of the first transistors $TR_1$ in the complementary transistors of Examples 1 to 6.

Figure 31:
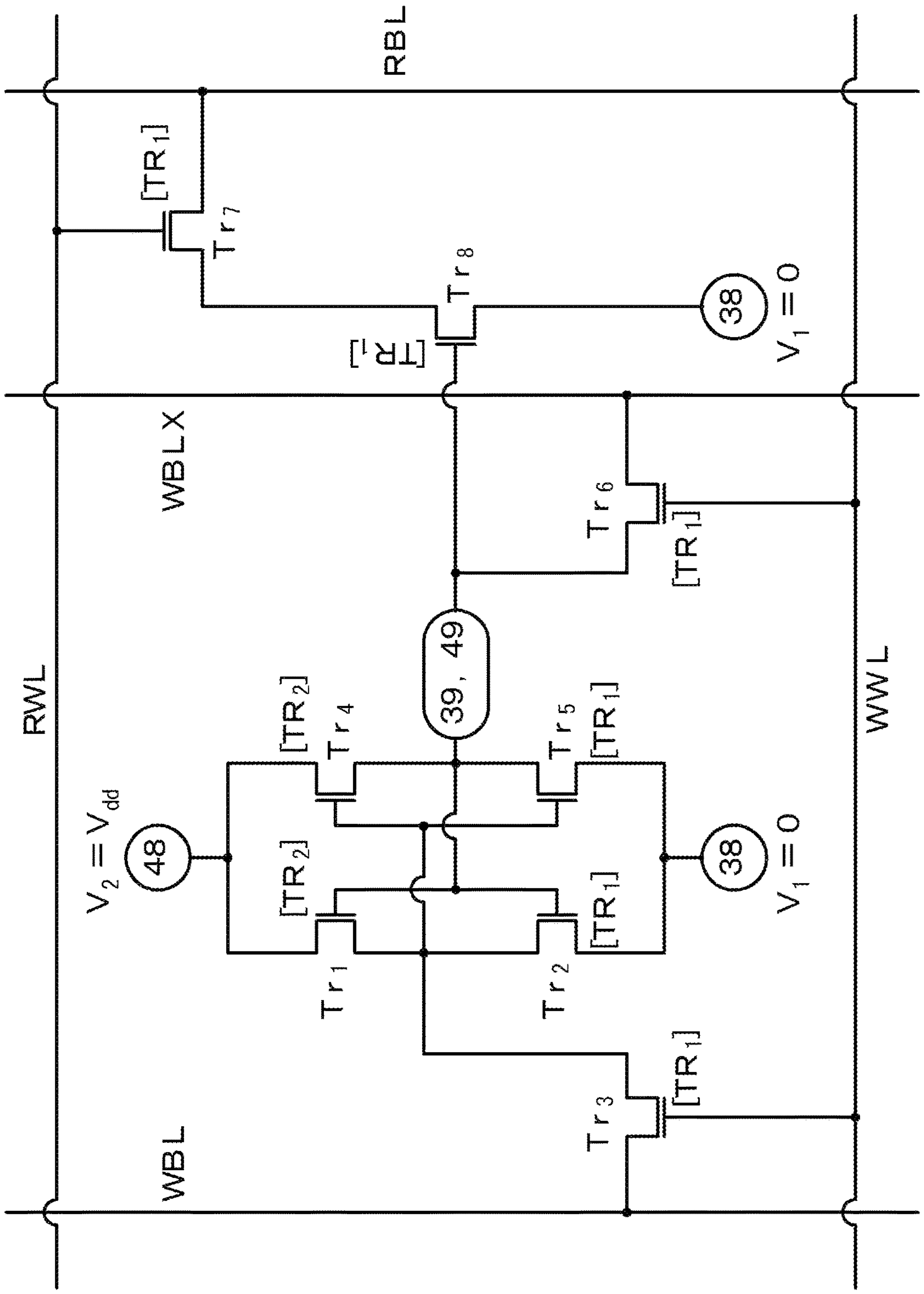
FIG. 31 is an equivalent circuit diagram of an SRAM circuit constituted of eight transistors formed on the basis of the complementary transistors of Examples 1 to 6.

FIG. 31 illustrates an equivalent circuit diagram of an SRAM circuit including eight transistors formed on the basis of the complementary transistors of Examples 1 to 6. The SRAM circuit is constituted of eight transistors $Tr_1$, $Tr_2$, $Tr_3$, $Tr_4$, $Tr_5$, $Tr_6$, $Tr_7$, and $Tr_8$. Since the circuit configuration itself of this SRAM circuit is known, a detailed description thereof will be omitted. Here, the first transistor $Tr_1$ and the fourth transistor $Tr_4$ are constituted of the second transistors $TR_2$ in the complementary transistors of Examples 1 to 6. Additionally, the remaining transistors $Tr_2$, $Tr_3$, $Tr_5$, $Tr_6$, $Tr_7$, and $Tr_8$ are constituted of the first transistor $TR_1$ in the complementary transistors of Examples 1 to 6.

While the complementary transistors and the semiconductor devices of the present disclosure have been described on the basis of preferable Examples, the formation, structures, constituent materials, manufacturing methods, and the like of the complementary transistors and semiconductor devices of the present disclosure are not limited to such Examples and can be suitably changed. Furthermore, various kinds of exemplary application of the complementary transistors of the present disclosure described in Examples are also examples, and needless to say, the complementary transistors can be applied to other exemplary circuits. In other words, in various kinds of circuits, an n-channel FET may be replaced with a first transistor in the complementary transistor of the present disclosure, and a p-channel FET may be replaced with a second transistor in the complementary transistor of the present disclosure.

Figure 32:
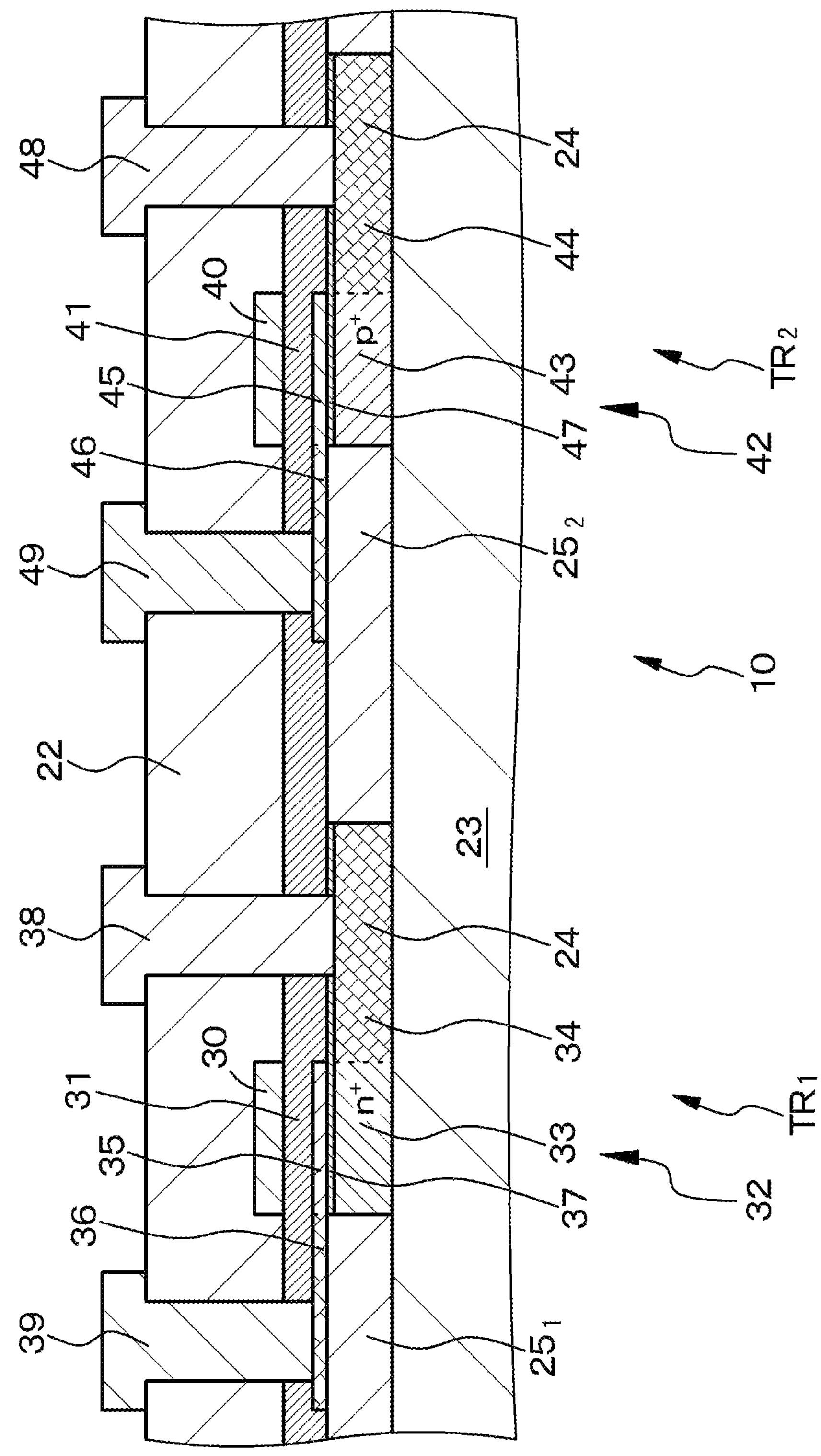
FIG. 32 is a schematic partial cross-sectional view of a modified example of the complementary transistor of Example 1.
Figure 33:
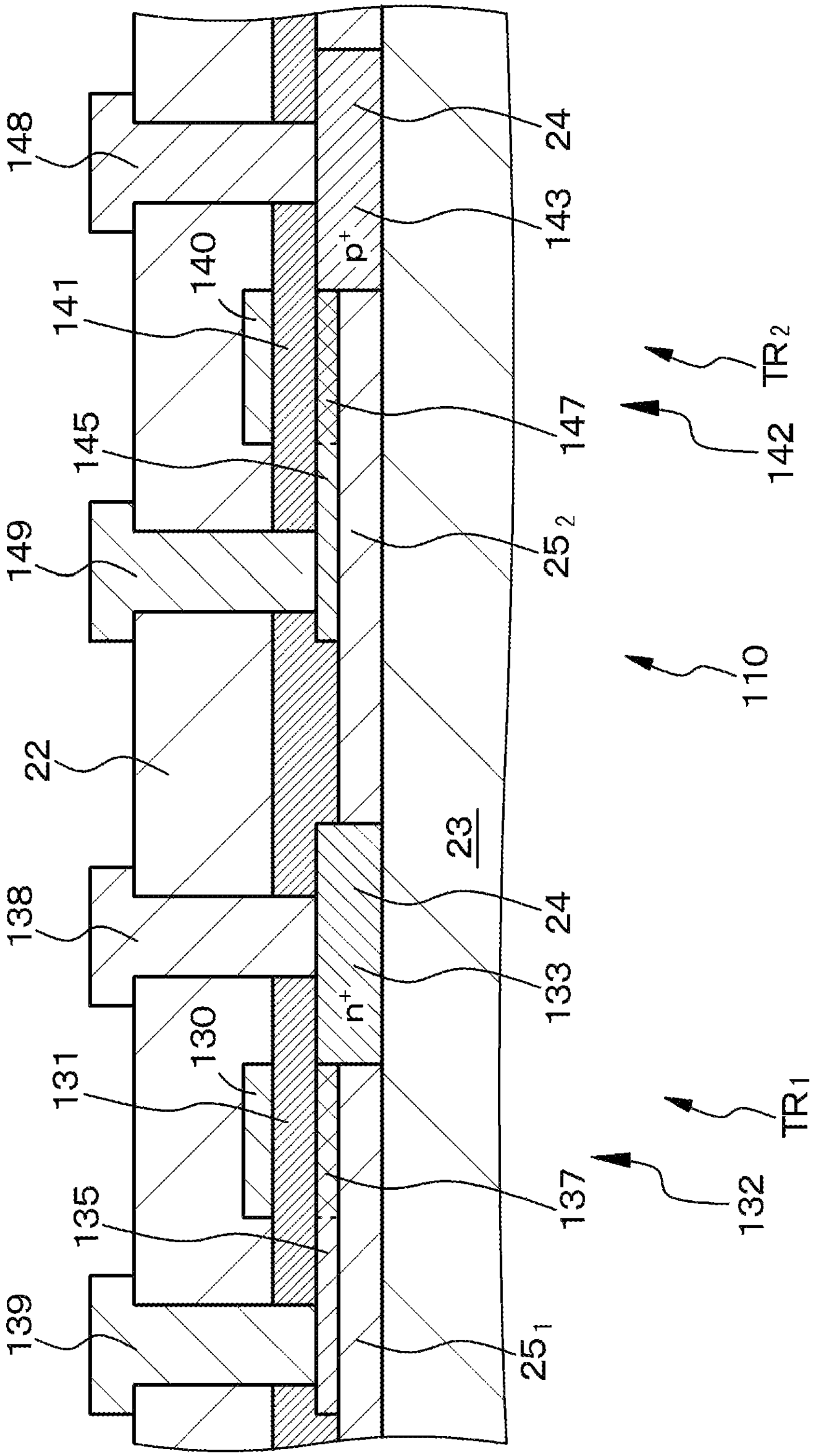
FIG. 33 is a schematic partial cross-sectional view of a modified example of the complementary transistor of Example 4.

In Examples 1 to 6, the base is constituted of the silicon semiconductor substrate, but as illustrated in schematic partial cross-sectional views of FIGS. 32 and 33, the base 24 can be constituted of a two-dimensional material layer (for example, $MoS_2$). In this case, the base 24 may be provided on a support material (e.g., substrate like a silicon semiconductor substrate having surface formed with an insulation film) 23. For example, a first insulation region 251 and a second insulation region 252 each constituted of $SiO_2$ may be formed between a base 24 and a base 24. Alternatively, in the base constituted of the two-dimensional material layer, the first insulation region 251 and the second insulation region 252 may be formed by applying ion implantation, for example, to portions where the first insulation region 251 and the second insulation region 252 are to be formed. Note that FIG. 32 illustrates a modified example of the complementary transistor of Example 1, and FIG. 33 illustrates a modified example of the complementary transistor of the Example 4.

Alternatively, one transistor can have the structure illustrated in FIG. 32 or 33, and the other transistor can have the structure of the transistor described in any one of Examples 2 to 3 and Examples 5 to 6.

Alternatively, the base may be constituted of germanium (Ge) instead of silicon (Si), the first B layer 35 (or first B extension region 135) may be constituted of $MoS_2$, $WTe_2$, or graphene, and the second B layer 45 (or second B Extension region 145) can be constituted of $HfTe_2$.

Figure 34A:
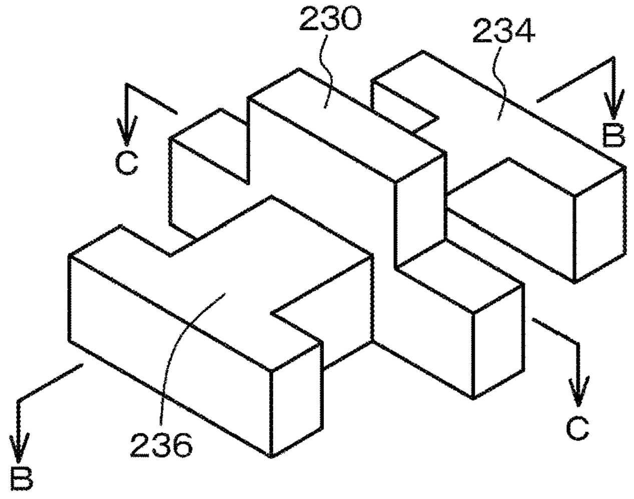
FIGS. 34A, 34B, and 34C are a schematic perspective view and schematic partial cross-sectional views of the modified example of the complementary transistor of Example 1 (structure having a so-called Fin shape)
Figure 34B:
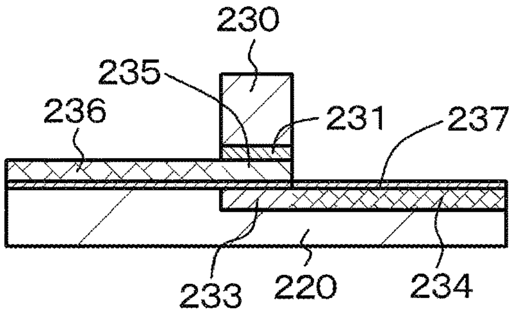
Figure 34C:
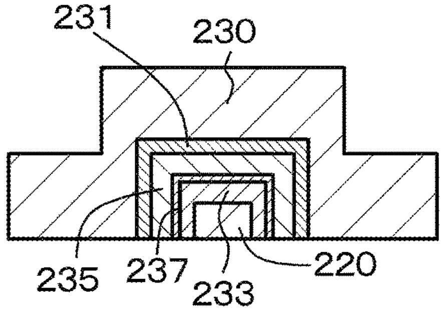
Figure 34D:
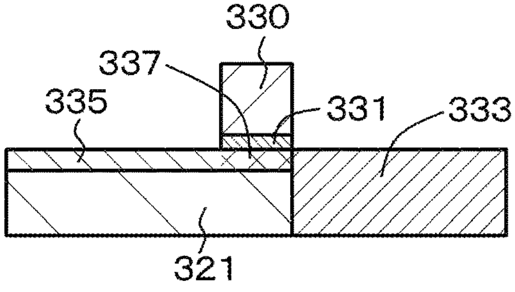
FIG. 34D is a schematic partial cross-sectional view of the modified example of the complementary transistor (structure having the so-called Fin shape) of Example 4.

Alternatively, as FIG. 34A illustrates a schematic perspective view, FIG. 34B illustrates a schematic partial cross-sectional view along an arrow B-B in FIG. 34A, and FIG. 34C illustrates a schematic partial cross-sectional view along an arrow C-C in FIG. 34A, it is possible to have a structure having a so-called Fin shape as a modified example of the complementary transistor of Example 1. Additionally, it is possible to have a structure having the so-called Fin shape as a modified example of the complementary transistor of the Example 4. FIG. 34D illustrates a schematic partial cross-sectional view of the modified example of the Example 4 taken along the arrow B-B in FIG. 34A. Note that only the first transistor constituting the complementary transistor is illustrated in these drawings. Additionally, the transistor having the Fin shape is formed on the silicon semiconductor substrate, but illustration of the silicon semiconductor substrate is omitted. Last two digits of the reference numbers of the constituent elements in FIGS. 34A, 34B, and 34C are the same as last two digits of the reference numbers of the constituent elements of the first transistor described in Example 1. Furthermore, last two digits of the reference numbers of the constituent elements in FIG. 34D are the same as last two digits of the reference numbers of the constituent elements in the first transistor described in the Example 4.

Note that the present disclosure can also adopt the following formations.

[A01]<Complementary Transistor . . . First Aspect>

A complementary transistor including:

a first transistor including:

a first control electrode;

a first active region located below the first control electrode and formed by layering a first A layer and a first B layer;

a first insulation layer provided between the first control electrode and the first active region;

a first A extension layer extending from one end of the first active region and constituted of the first A layer; and a first B extension layer extending from the other end of the first active region and constituted of the first B layer; and a second transistor including:

a second control electrode;

a second active region located below the second control electrode and formed by layering a second A layer and a second B layer;

a second insulation layer provided between the second control electrode and the second active region;

a second A extension layer extending from one end of the second active region and constituted of the second A layer; and a second B extension layer extending from the other end of the second active region and constituted of the second B layer, in which a first surface region provided in a base and having a first conductivity type corresponds to the first A layer and the first A extension layer, the first B layer has a property as a second conductivity type different from the first conductivity type, the first B extension layer is provided on a first insulation region provided in the base, a second surface region provided in the base and having the second conductivity type corresponds to the second A layer and the second A extension layer, the second B layer has a property as the first conductivity type, and the second B extension layer is provided on a second insulation region provided in the base.

[A02] The composite transistor recited in [A01], in which the first B layer is constituted of a two-dimensional material or graphene, and the second B layer is constituted of a two-dimensional material or graphene.

[A03] The complementary transistor recited in [A02], in which the two-dimensional material includes one kind of two-dimensional material selected from a group consisting of $MoS_2$, $MoSe_2$, $MoTe_2$, $WS_2$, $WSe_2$, $WTe_2$, $ZrS_2$, $ZrSe_2$, $ZrTe_2$, $HfS_2$, $HfSe_2$ and $HfTe_2$.

[A04] The complementary transistor recited in any one of [A01] to [A03], in which the base is constituted of a semiconductor substrate, and the first insulation region and the second insulation region are each constituted of an element isolation region provided in the semiconductor substrate.

[A05] The complementary transistor recited in any one of [A01] to [A03], in which the base is constituted of a two-dimensional material layer.

[A06] The complementary transistor recited in any one of [A01] to [A03], in which the base is constituted of silicon or germanium, the first B layer is constituted of $MoS_2$, $WTe_2$, or graphene, and the second B layer is constituted of $HfTe_2$.

[A07] The complementary transistor recited in any one of [A01] to [A03], in which the base is constituted of $MoS_2$, the first B layer is constituted of $WTe_2$, and the second B layer is constituted of $ZrS_2$, $HfS_2$, or $HfSe_2$.

[A08] The composite transistor recited in [A01], in which a portion of the base constituting the first surface region and a portion of the base constituting the second surface region are constituted of different materials, and the first B layer and the first B extension layer, and the second B layer and the second B extension layer are constituted of the same material.

[A09] The composite transistor recited in [A08], in which a difference between a value of a valence band of the portion of the base constituting the first surface region and a value of a conduction band of a material constituting the first B layer and the first B extension layer is 1 eV or less, and a difference between a value of a conduction band of the portion of the base constituting the second surface region and a value of a valence band of a material constituting the second B layer and the second B extension layer is 1 eV or less.

[A10] The composite transistor recited in [A08] or [A09], in which the portion of the base constituting the first surface region is constituted of a silicon semiconductor substrate, the portion of the base constituting the second surface region is constituted of a semiconductor layer formed in the silicon semiconductor substrate, and the first B layer and the first B extension layer, and the second B layer and the second B extension layer are constituted of the same two-dimensional material.

[A11] The composite transistor recited in [A10], in which the semiconductor layer is constituted of a germanium layer, and the first B layer and the first B extension layer, and the second B layer and the second B extension layer are constituted of $MoTe_2$.

[A12] The composite transistor recited in [A08] or [A09], in which the portion of the base constituting the first surface region is constituted of a semiconductor layer formed in a silicon semiconductor substrate, the portion of the base constituting the second surface region is constituted of the silicon semiconductor substrate, and the first B layer and the first B extension layer, and the second B layer and the second B extension layer are constituted of the same two-dimensional material.

[A13] The composite transistor recited in [A12], in which the semiconductor layer is constituted of an indium arsenide layer, and the first B layer and the first B extension layer, and the second B layer and the second B extension layer are constituted of $MoS_2$.

[A14] The composite transistor recited in [A08] or [A09], in which the portion of the base constituting the first surface region is constituted of a first semiconductor layer formed in the semiconductor substrate, the portion of the base constituting the second surface region is constituted of a second semiconductor layer formed in the semiconductor substrate, and the first B layer and the first B extension layer, and the second B layer and the second B extension layer are constituted of the same two-dimensional material.

[A15] The composite transistor recited in [A14], in which the first semiconductor layer is constituted of an indium arsenide layer, the second semiconductor layer is constituted of a germanium layer, the first B layer and the first B extension layer, and the second B layer and the second B extension layer are constituted of $MoS_2$.

[A16] The composite transistor recited in [A01], in which the portion of the base constituting the first surface region and the portion of the base constituting the second surface region are constituted of different materials, and the first B layer and the first B extension layer, and the second B layer and the second B extension layer are constituted of different materials.

[A17] The composite transistor recited in [A16], in which the portion of the base constituting the first surface region is constituted of a silicon semiconductor substrate, the portion of the base constituting the second surface region is constituted of a germanium layer formed in the silicon semiconductor substrate, the first B layer and the first B extension layer are constituted of $MoTe_2$, and the second B layer and the second B extension layer are constituted of $MoS_2$.

[A18] The composite transistor recited in [A16], in which the portion of the base constituting the first surface region is constituted of an indium arsenide layer formed in the silicon semiconductor substrate, the portion of the base constituting the second surface region is constituted of the silicon semiconductor substrate, the first B layer and first B extension layer are constituted of $MoTe_2$, and the second B layer and second B extension layer are constituted of $MoS_2$.

[A19] The composite transistor recited in [A16], in which the portion of the base constituting the first surface region is constituted of an indium arsenide layer formed in the silicon semiconductor substrate, the portion of the base constituting the second surface region is constituted of a germanium layer formed in the silicon semiconductor substrate, the first B layer and the first B extension layer are constituted of $MoTe_2$, and the second B layer and the second B extension layer are constituted of $MoS_2$.

[A20] The complementary transistor recited in any one of [A01] to [A19], in which an absolute value of a difference between an energy value at a lower end of the conduction band of the base and an energy value at a lower end of a conduction band of the first B layer is equal to or less than an energy difference at which driving can be performed at drive voltage of the first transistor, an absolute value of a difference between an energy value at an upper end of the valence band of the base and an energy value at an upper end of a valence band of the first B layer is equal to or less than the energy difference at which driving can be performed at the drive voltage of the first transistor, an absolute value of a difference between an energy value at the lower end of the conduction band of the base and an energy value at a lower end of a conduction band of the second B layer is equal to or less than an energy difference at which driving can be performed at drive voltage of the second transistor, and an absolute value of a difference between an energy value at the upper end of the valence band of the base and an energy value at an upper end of a valence band of the second B layer is equal to or less than the energy difference at which driving can be performed at the drive voltage of the second transistor.

[A21] The complementary transistor recited in any one of [A01] to [A20], in which a first interlayer insulation film is formed between the first A layer and the first B layer, and a second interlayer insulation film is formed between the second A layer and the second B layer.

[A22] The complementary transistor recited in any one of [A01] to [A21], in which the first transistor further includes a first A electrode connected to the first A extension layer and a first B electrode connected to the first B extension layer, and the second transistor further includes a second A electrode connected to the second A extension layer and a second B electrode connected to the second B extension layer.

[B01]

A transistor including:

a control electrode;

an active region located below the control electrode and formed by layering an $A_{th}$ layer and a $B_{th}$ layer, an insulation layer provided between the control electrode and the active region;

an $A_{th}$ extension layer extending from one end of the active region and constituted of the $A_{th}$ layer; and a $B_{th}$ extension layer extending from the other end of the active region and constituted of the $B_{th}$ layer, in which a surface region provided in a base and having a first conductivity type corresponds to the $A_{th}$ layer and the $A_{th}$ extension layer, the $B_{th}$ layer has a property as a second conductivity type different from the first conductivity type, and the $B_{th}$ extension layer is provided on an insulation region provided in the base.

[C01]<Complementary Transistor . . . Second Aspect>

A complementary transistor including:

a first transistor including:

a first control electrode;

a first active region located below the first control electrode and formed;

a first insulation layer provided between the first control electrode and the first active region;

a first A extension region extending from one end of the first active region; and a first B extension region extending from the other end of the first active region; and a second transistor including:

a second control electrode;

a second active region located below the second control electrode;

a second insulation layer provided between the second control electrode and the second active region;

a second A extension region extending from one end of the second active region; and a second B extension region extending from the other end of the second active region, in which a first surface region provided in a base and having a first conductivity type corresponds to the first A extension region, the first B extension region has a property as a second conductivity type different from the first conductivity type and is provided on a first insulation region provided in the base, the first active region is provided on the first insulation region, a second surface region provided in the base and having the second conductivity type corresponds to the second A extension region, the second B extension region has a property as the first conductivity type and is provided on a second insulation region provided in the base, and the second active region is provided on the second insulation region.

[C02] The composite transistor recited in [C01], in which the first B extension region is constituted of a two-dimensional material or graphene, and the second B extension region is constituted of a two-dimensional material or graphene.

[C03] The complementary transistor recited in [CO2], in which the two-dimensional material includes one kind of two-dimensional material selected from a group consisting of $MoS_2$, $MoSe_2$, $MoTe_2$, $WS_2$, $WSe_2$, $WTe_2$, $ZrS_2$, $ZrSe_2$, $ZrTe_2$, $HfS_2$, $HfSe_2$ and $HfTe_2$.

[C04] The complementary transistor recited in any one of [C01] to [CO3], in which the base is constituted of a semiconductor substrate, and the first insulation region and the second insulation region are each constituted of an element isolation region provided in the semiconductor substrate.

[C05] The complementary transistor recited in any one of [C01] to [C03], in which the base is constituted of a two-dimensional material layer.

[C06] The complementary transistor recited in any one of [C01] to [C03], in which the base is constituted of silicon or germanium, the first B extension region is constituted of $MoS_2$, $WTe_2$, or graphene, and the second B extension region is constituted of $HfTe_2$.

[C07] The complementary transistor recited in any one of [C01] to [CO3], in which the base is constituted of $MoS_2$, the first B extension region is constituted of $WTe_2$, and the second B extension region is constituted of $ZrS_2$, $HfS_2$, or $HfSe_2$.

[C08] The composite transistor recited in [C01], in which the first A extension region and the second A extension region are constituted of different materials, and the first B extension region and the second B extension region are constituted of the same material.

[C09] The composite transistor recited in [C08], in which a difference between a value of a valence band of a material constituting the first A extension region and a value of a conduction band of a material constituting the first B extension region is 1 eV or less, and a difference between a value of a conduction band of the portion of a material constituting the second A extension region and a value of a valence band of a material constituting the second B extension region is 1 eV or less.

[C10] The composite transistor recited in [C08] or [C09], in which the first A extension region is constituted of a silicon semiconductor substrate, the second A extension region is constituted of a semiconductor layer formed in the silicon semiconductor substrate, and the first B extension region and the second B extension region are constituted of the same two-dimensional material.

[C11] The composite transistor according to [C10], in which the semiconductor layer is constituted of a germanium layer, and the first B extension region and the second B extension region are constituted of $MoTe_2$.

[C12] The composite transistor recited in [C08] or [C09], in which the first A extension region is constituted of a semiconductor layer formed in the silicon semiconductor substrate, the second A extension region is constituted of the silicon semiconductor substrate, and the first B extension region and the second B extension region are constituted of the same two-dimensional material.

[C13] The composite transistor according to [C12], in which the semiconductor layer is constituted of an indium arsenide layer, and the first B extension region and second B extension region are constituted of $MoS_2$.

[C14] The composite transistor recited in [C08] or [C09], in which the first A extension region is constituted of a first semiconductor layer formed in the semiconductor substrate, the second A extension region is constituted of a second semiconductor layer formed in the semiconductor substrate, and the first B extension region and the second B extension region are constituted of the same two-dimensional material.

[C15] The composite transistor according to [C14], in which the first semiconductor layer is constituted of an indium arsenide layer, the second semiconductor layer is constituted of a germanium layer, and the first B extension region and second B extension region are constituted of $MoS_2$

[C16] The composite transistor recited in [C01], in which the first A extension region and the second A extension region are constituted of different materials, and the first B extension region and the second B extension region are constituted of different materials.

[C17] The composite transistor recited in [C16], in which the first A extension region is constituted of a silicon semiconductor substrate, the second A extension region is constituted of a germanium layer formed in the silicon semiconductor substrate, the first B extension region is constituted of $MoTe_2$, and the second B extension region is constituted of $MoS_2$.

[C18] The composite transistor recited in [C16], in which the first A extension region is constituted of an indium arsenide layer formed in the silicon semiconductor substrate, the second A extension region is constituted of the silicon semiconductor substrate, the first B extension region is constituted of $MoTe_2$, and the second B extension region is constituted of $MoS_2$.

[C19] The composite transistor recited in [C16], in which
the first A extension region is constituted of an indium arsenide layer formed in the silicon semiconductor substrate,
the second A extension region is constituted of a germanium layer formed in the silicon semiconductor substrate,
the first B extension region is constituted of $MoTe_2$, and the second B extension region is constituted of $MoS_2$.

[C20] The complementary transistor recited in any one of [C01] to [C19], in which
an absolute value of a difference between an energy value at a lower end of the conduction band of the base and an energy value at a lower end of the conduction band of the first B extension region is equal to or less than an energy difference at which driving can be performed at drive voltage of the first transistor,
an absolute value of a difference between an energy value at an upper end of the valence band of the base and an energy value at an upper end of the valence band of the first B extension region is equal to or less than the energy difference at which driving can be performed at the drive voltage of the first transistor,
an absolute value of a difference between an energy value at the lower end of the conduction band of the base and an energy value at a lower end of the conduction band of the second B extension region is equal to or less than an energy difference at which driving can be performed at drive voltage of the second transistor, and
an absolute value of a difference between an energy value at the upper end of the valence band of the base and an energy value at an upper end of the valence band of the second B extension region is equal to or less than the energy difference at which driving can be performed at the drive voltage of the second transistor.

[C21] The complementary transistor recited in any one of [C01] to [C20], in which
the first transistor further includes a first A electrode connected to the first A extension region and a first B electrode connected to the first B extension region, and
the second transistor further includes a second A electrode connected to the second A extension region and a second B electrode connected to the second B extension region.

[D01]
A transistor including:
a control electrode;
an active region located below the control electrode;
an insulation layer provided between the control electrode and the active region,
an $A_{th}$ extension region extending from one end of the active region; and
a $B_{th}$ extension region extending from the other end of the active region,
in which
a surface region provided in a base and having a first conductivity type corresponds to the $A_{th}$ extension region,
the $B_{th}$ extension region has a property as a second conductivity type different from the first conductivity type and is provided on an insulation region provided in the base, and
the active region is provided on the insulation region.

[E01] "Semiconductor Device . . . First Aspect"
A semiconductor device including:
the complementary transistor recited in any one of [A01] to [A22] and having a base constituted of a silicon semiconductor substrate; and
a field effect transistor formed in the silicon semiconductor substrate.

[E02] "Semiconductor Device . . . Second Aspect"
A semiconductor device including:
the complementary transistor recited in any one of [C01] to [C21] and having a base constituted of a silicon semiconductor substrate; and
a field effect transistor formed in the silicon semiconductor substrate.

REFERENCE SIGNS LIST

10, 110 Complementary transistor
20 Base (silicon semiconductor substrate)
$20_1$, $120_1$ First surface region
$20_2$, $120_2$ Second surface region
21 Element isolation region
$21_1$, $25_1$ First insulation region
$21_2$, $25_2$ Second insulation region
22 Interlayer insulation layer
23 Support material
24 Base
26A, 26B, 126A, 126B Recessed portion
27A, 127A Semiconductor layer (germanium layer)
27B, 127B Semiconductor layer (indium arsenide layer)
28B, 128B Buffer layer
30, 130 First control electrode
31, 131 First insulation layer
32, 132 First active region
33, 53, 73 First A Layer
133, 153, 173 First A extension region
34, 54, 74 First A extension layer
35 First B layer
135 First B extension region
36 First B extension layer
37 First interlayer insulation film (first boundary region)
137 First boundary region
38, 138 First A electrode
39, 139 First B electrode
40, 140 Second control electrode
41, 141 Second insulation layer
42, 142 Second active region
43, 63, 83 Second A Layer
143, 163, 183 Second A extension region
44, 64, 84 Second A extension layer
45 Second B layer
145 Second B extension region
46 Second B extension layer
47 Second interlayer insulation film (second boundary region)
147 Second boundary region
48, 148 Second A electrode
49, 149 Second B electrode
53, 54, 73, 74 Portion of base constituting first surface region
63, 64, 83, 84 Portion of base constituting second surface region
$TR_1$ First transistor
$TR_2$ Second transistor

What is claimed:

1. A complementary transistor, comprising:
a first transistor including:
a first control electrode; and
a first active region located below the first control electrode and formed by layering a first A layer and a first B layer; and
a second transistor including:
a second control electrode; and
a second active region located below the second control electrode formed by layering a second A layer and a second B layer,
wherein the first B layer is constituted of a two-dimensional material or graphene, and the second B layer is constituted of a two-dimensional material or graphene.

2. The complementary transistor according to claim 1, wherein the two-dimensional material includes one kind of two-dimensional material selected from a group consisting of MoS2, MoSe2, MoTe2, WS2, WSe2, WTe2, ZrS2, ZrSe2, ZrTe2, HfS2, HfSe2 and HfTe2.

3. The complementary transistor according to claim 1, wherein a first surface region is provided in a base and has a first conductivity type corresponding to the first A layer and the first B layer has a property as a second conductivity type different from the first conductivity type.

4. The complementary transistor according to claim 3, wherein a second surface region is provided in the base and has the second conductivity type corresponding to the second A layer and the second B layer has a property as the first conductivity type.

5. The complementary transistor according to claim 3, wherein the base is constituted of a semiconductor substrate.

6. The complementary transistor according to claim 5, wherein the base is constituted of a two-dimensional material layer.

7. The complementary transistor according to claim 3, wherein the base is constituted of silicon or germanium, the first B layer is constituted of MoS2, WTe2 or graphene and the second B layer is constituted of HfTe2.

8. The complementary transistor according to claim 3, wherein the base is constituted of MoS2, the first B layer is constituted of WTe2, and the second B layer is constituted of ZrS2, HfS2 or HfSe2.

9. The complementary transistor according to claim 4, wherein
a portion of the base constituting the first surface region and a portion of the base constituting the second surface region are constituted of different materials, and
the first B layer and the second B layer are constituted of the same material.

10. The complementary transistor according to claim 9, wherein
the portion of the base constituting the first surface region is constituted of a silicon semiconductor substrate,
the portion of the base constituting the second surface region is constituted of a semiconductor layer formed in the silicon semiconductor substrate, and
the first B layer and the second B layer are constituted of the same two-dimensional material.

11. The complementary transistor according to claim 9, wherein
the portion of the base constituting the first surface region is constituted of a semiconductor layer formed in a silicon semiconductor substrate,
the portion of the base constituting the second surface region is constituted of the silicon semiconductor substrate, and
the first B layer and the second B layer are constituted of the same two-dimensional material.

12. The complementary transistor according to claim 9, wherein
the portion of the base constituting the first surface region is constituted of a first semiconductor layer formed in a semiconductor substrate,
the portion of the base constituting the second surface region is constituted of a second semiconductor layer formed in the semiconductor substrate, and
the first B layer and the second B layer are constituted of the same two-dimensional material.

13. The complementary transistor according to claim 9, wherein
the portion of the base constituting the first surface region and the portion of the base constituting the second surface region are constituted of different materials, and
the first B layer and the second B layer are constituted of different materials.

14. The complementary transistor according to claim 1, wherein
a first interlayer insulation film is formed between the first A layer and the first B layer, and
a second interlayer insulation film is formed between the second A layer and the second B layer.

15. A complementary transistor, comprising:
a semiconductor substrate;
a first transistor including:
a first control electrode; and
a first active region located below the first control electrode and formed by layering a first A layer and a first B layer; and
a second transistor including:
a second control electrode; and
a second active region located below the second control electrode formed by layering a second A layer and a second B layer,
wherein the first B layer is constituted of a two-dimensional material or graphene, and the second B layer is constituted of a two-dimensional material or graphene.

16. The complementary transistor according to claim 15, further comprising a buffer layer provided between the first control electrode and the semiconductor substrate.

17. The complementary transistor according to claim 16, wherein the buffer layer includes a material selected from the group consisting of InP, InAlAs, InGaAs, GaAs, and GaSb.

18. The complementary transistor according to claim 15, wherein the two-dimensional material includes one kind of two-dimensional material selected from a group consisting of MoS2, MoSe2, MoTe2, WS2, WSe2, WTe2, ZrS2, ZrSe2, ZrTe2, HfS2, HfSe2 and HfTe2.

19. A complementary transistor, comprising:
a semiconductor substrate;
a first transistor including:
a first control electrode; and
a first active region located below the first control electrode and formed by layering a first A layer and a first B layer;

a second transistor including:

a second control electrode; and a second active region located below the second control electrode formed by layering a second A layer and a second B layer; and a buffer layer provided between the first control electrode and the semiconductor substrate.

20. The complementary transistor according to claim 19, wherein the buffer layer includes a material selected from the group consisting of InP, InAlAs, InGaAs, GaAs, and GaSb.

* * * * *